United States Patent
Song

(10) Patent No.: US 10,228,419 B2
(45) Date of Patent: Mar. 12, 2019

(54) APPARATUS, METHOD, AND SYSTEM FOR TESTING IC CHIP

(71) Applicant: INNOTIO INC., Seoul (KR)

(72) Inventor: Jaehoon Song, Seoul (KR)

(73) Assignee: INNOTIO INC., Seoul (KR)

(*) Notice: Subject to any disclaimer, the term of this patent is extended or adjusted under 35 U.S.C. 154(b) by 0 days.

(21) Appl. No.: 15/795,085

(22) Filed: Oct. 26, 2017

(65) Prior Publication Data

US 2018/0045781 A1 Feb. 15, 2018

Related U.S. Application Data

(63) Continuation of application No. PCT/KR2017/004486, filed on Apr. 27, 2017.

(30) Foreign Application Priority Data

Apr. 28, 2016 (KR) .................. 10-2016-0052368
Apr. 26, 2017 (KR) .................. 10-2017-0053344
(Continued)

(51) Int. Cl.
*G01R 31/28* (2006.01)
*G01R 31/3185* (2006.01)

(52) U.S. Cl.
CPC ..... *G01R 31/2891* (2013.01); *G01R 31/2815* (2013.01); *G01R 31/2889* (2013.01);
(Continued)

(58) Field of Classification Search
CPC .... G01R 31/318536; G01R 31/318525; G01R 31/318594; G01R 31/318555; G01R 31/318502; G01R 31/318544
See application file for complete search history.

(56) References Cited

U.S. PATENT DOCUMENTS

| 5,498,995 A | 3/1996 | Szepesi et al. |
| 7,805,648 B2 | 9/2010 | Ramachandran |

(Continued)

FOREIGN PATENT DOCUMENTS

| JP | 2005-140770 A | 6/2005 |
| JP | 2006-064395 A | 3/2006 |

(Continued)

OTHER PUBLICATIONS

Tafaj, et al., "Improving thermal-safe test scheduling for core-based systems-on-chip using shift frequency scaling", Defect and Fault Tolerance in VLSI Systems, 2005. DFT 2005. 20th IEEE International Symposium on.*

(Continued)

*Primary Examiner* — April Y Blair
*Assistant Examiner* — Rong Tang
(74) *Attorney, Agent, or Firm* — Rabin & Berdo, P.C.

(57) ABSTRACT

An apparatus for performing scan test of IC chip includes a shift-frequency searching unit that searches usable shift frequency for a target scan section among at least one scan section each including whole or part of at least one scan pattern inputted to a scan path. When searching usable shift frequency for the target scan section, the shift-frequency searching unit scales shift frequency of the target scan section differently from that of at least one scan section among scan sections shifted before or after the target scan section or sets shift frequency of the target scan section differently from that of the at least one scan section among the scan sections shifted before or after the target scan section, and searches shift frequency with which result of the scan test indicates pass or shift frequency with which result of the scan test indicates fail.

22 Claims, 32 Drawing Sheets

(30) Foreign Application Priority Data

Apr. 26, 2017 (KR) .................. 10-2017-0053361
Apr. 26, 2017 (KR) .................. 2017-087586

(52) U.S. Cl.
CPC .......... *G01R 31/318525* (2013.01); *G01R 31/318536* (2013.01); *G01R 31/318555* (2013.01); *G01R 31/318566* (2013.01); *G01R 31/318594* (2013.01); *G01R 31/318502* (2013.01); *G01R 31/318544* (2013.01)

(56) References Cited

U.S. PATENT DOCUMENTS

| | | | |
|---|---|---|---|
| 9,285,424 B2* | 3/2016 | Singh | G01R 31/3177 |
| 2009/0254787 A1* | 10/2009 | Ramachandran | G01R 31/318552 714/731 |
| 2010/0262879 A1* | 10/2010 | Floyd | G01R 31/31724 714/733 |

FOREIGN PATENT DOCUMENTS

| | | |
|---|---|---|
| JP | 2011-177992 | 9/2011 |
| JP | 2013-029439 A | 2/2013 |
| JP | 2013-040855 A | 2/2013 |
| JP | 2014-001937 A | 1/2014 |
| KR | 10-0220001 B1 | 9/1999 |
| KR | 10-0429633 B1 | 5/2004 |
| KR | 10-2009-0022209 A | 3/2009 |

OTHER PUBLICATIONS

Tafaj, et al., "Improving thermal-safe test scheduling for core-based systems-on-chip using shift frequency scaling", Defect and Fault Tolerance in VLSI Systems, 2005. DFT 2005. 20th IEEE International Symposium on. (Year: 2005).*

IEEE 100: The Authoritative Dictionary of IEEE Standards Terms, 7th ed., 2000. (Year: 2000).*

* cited by examiner

| Scan pattern # | Leakage Power (mW) | Power consumption for nominal shift frequency (25MHz) | | Power-limit-based method (Power limit : 285 mW) | | Shift-frequency-scaling-based method | INCREASE/ DECREASE RATIO OF (2) WITH RESPECT TO (1) |
|---|---|---|---|---|---|---|---|
| | | Dynamic Power (mW) | Total Power (mW) | (1) Max. Shift freq. (MHz) | Test pass/ fail | (2) Max. Shift freq. (MHz) | |
| 1 | 52 | 187 | 239 | 31.15 | PASS | 47.06 | 51.08 |
| 2 | 51 | 163 | 214 | 35.89 | PASS | 44.44 | 23.82 |
| 3 | 51 | 162 | 213 | 36.11 | PASS | 44.44 | 23.06 |
| 4 | 51 | 155 | 206 | 37.74 | PASS | 44.44 | 17.75 |
| 5 | 51 | 172 | 223 | 34.01 | PASS | 44.44 | 30.66 |
| 6 | 50 | 125 | 175 | 47.00 | FAIL | 36.36 | -22.64 |
| 7 | 51 | 174 | 225 | 33.62 | PASS | 44.44 | 32.18 |
| 8 | 51 | 168 | 219 | 34.82 | PASS | 44.44 | 27.62 |
| 9 | 51 | 170 | 221 | 34.41 | PASS | 44.44 | 29.14 |
| 10 | 51 | 180 | 231 | 32.50 | PASS | 44.44 | 36.74 |
| 11 | 51 | 172 | 223 | 34.01 | PASS | 44.44 | 30.66 |
| 12 | 51 | 171 | 222 | 34.21 | PASS | 44.44 | 29.90 |

FIG. 46

APPARATUS, METHOD, AND SYSTEM FOR TESTING IC CHIP

CROSS-REFERENCE TO RELATED APPLICATIONS

This application is a continuation of International Application No. PCT/KR2017/004486 filed Apr. 27, 2017, which is based upon and claims the benefit of priority from Korean Patent Application No. 10-2016-0052368 filed Apr. 28, 2016, Korean Patent Application No. 10-2017-0053344 filed Apr. 26, 2017, Korean Patent Application No. 10-2017-0053361 filed Apr. 26, 2017, and Japanese Patent Application No. 2017-087586 filed Apr. 26, 2017, which is now Japanese Patent No. 6,209,299, the contents of which are incorporated herein by reference in their entirety.

BACKGROUND

1. Field

The present invention relates to an apparatus, a method, and a system for testing an integrated-circuit (IC) chip.

2. Description of the Related Art

One of the most popular methods to test an integrated-circuit (IC) chip includes applying test data to an input of the IC chip and comparing an output of the IC chip with a predetermined expected value or expected result (see, for example, Korean Patent Laid-Open Publication No. 10-2012-0102876). However, in the case of an IC chip including a sequential logic having storage elements such as flip-flops (F/Fs), it is not easy to apply a desired value to a flip-flop in the IC chip or to detect the value of the flip-flop from the outside.

The scan design method is one of the design-for-testability (DFT) methods, which is used to increase controllability and observability of a circuit in the IC chip. The scan design method provides test data having small size and high fault coverage by using an automatic test pattern generator (ATPG) that is software for automatically generating a test pattern based on structural information of the circuit.

In other words, the scan design enables the circuit having a sequential logic in the IC chip to be easily controlled and observed from the outside by taking the sequential logic as a combinational logic while performing a scan test and the size of the test data to be minimized by using the ATPG. The test data obtained via the scan design and the ATPG software include at least one scan pattern. In the scan test, scan patterns can have a predetermined order.

A typical scan test process is described below.

Step 1: Primary input test data are applied to a primary input port of an IC chip.

Step 2: A scan enable signal is applied to a scan enable port, to set the IC chip to a scan mode.

Step 3: A scan pattern is shifted in via a scan input port, to load the scan pattern into flip-flops on a scan path. Hereinafter, a shift-in to the scan input port or a shift-out from a scan output port is simply referred to as a "shift" in some cases. A shift period for shifting the scan pattern is the reciprocal of a shift frequency of a clock applied to a clock input port. The scan pattern loaded into the scan path is applied to the combinational logic. An output result outputted from a primary output port in response to the scan pattern applied to the combinational logic is compared with an expected primary output value. When a result of the comparison indicates a mismatch, the corresponding IC chip is determined to be faulty.

Step 4: A scan disable signal is applied to the scan enable port, to switch the mode of the IC chip from the scan mode to a functional mode. In the functional mode, when a clock signal is applied to the clock input port, the flip-flop captures an output value of the combinational logic. This operation is referred to as a "scan capture", and the mode in which the scan capture is performed is referred to as a "scan capture mode".

Step 5: A scan enable signal is applied to the scan enable port, to switch the mode of the IC chip from the functional mode to the scan mode.

Step 6: The value captured in the flip-flop on the scan path is shifted-out and an output pattern is unloaded from the scan output port.

Step 7: The unloaded output pattern is compared with a predetermined expected pattern, to determine whether or not the IC chip is normal. The expected pattern is a value or an output pattern known or expected before the test, which is a scan pattern supposed to be outputted from the scan output port after applying the primary input test data and the scan pattern and performing the scan capture when the IC chip is normal. When a result of the comparison at Step 3 indicates a match and a result of the comparison at Step 7 indicates a match, the test result is a "PASS", which means that the IC chip is normal. Otherwise, the test result is a "FAIL", which means that the IC chip is faulty. The test PASS means that the IC is fault free, and the test FAIL means that the IC chip is defective.

The type of scan test is roughly divided into a stuck-at-fault test and a delay-fault test. The stuck-at-fault means a state in which a signal line on the IC is unintendedly fixed to a value of logical 0 or 1. The delay fault means a state in which the spec of the IC chip cannot be satisfied due to a delay time when transferring a signal value through a signal line or a signal path on the IC chip.

The delay-fault test includes a transition delay test and a path delay test, and is also referred to as an "at-speed test". The transition delay test is to find a delay time problem in the transition of the signal value from 0 to 1 or from 1 to 0 at a node or on a signal line on the IC chip. The path delay test is to find a delay time problem in the transition of the signal value from 0 to 1 or from 1 to 0 on a signal path on the IC chip.

A general delay-fault test method includes a launch-on-capture method and a launch-on-shift method, which also includes a loading step of shifting in a scan pattern for the delay-fault test to a scan path and an unloading step of shifting out a delay-fault test result captured in a flip-flop on the scan path.

Such a scan test necessitates as many clock pulses for the shifting operation as the number of flip-flops on the scan path. This causes a considerable time to be taken to perform the shift-in and shift-out operations. However, a frequency of the clock signal for shifting the scan pattern to the scan path, i.e., a shift frequency, cannot be simply increased to reduce the test time.

For example, a simple increase of the shift frequency may cause an over kill problem in which a normal chip is determined to be defective due to a problem of power consumption or critical path delay time.

Further, as the power consumption of the IC chip is getting lowered due to a design for low-power consumption as well as a deep sub-micron (DSM) manufacturing process or a low-power manufacturing process, an influence of a power supply noise on the operating frequency of the IC chip has increased. As the IC chip generates more switching activities in the scan mode than in the functional mode, an additional delay on a signal line caused by the power supply noise due to the switching activities may incur an over kill during a delay test (i.e., a delay test over kill). Therefore, there is a technical limit in simply increasing the shift frequency.

Moreover, the signal integrity problem related to a signal crosstalk between signal lines on the IC chip has become more critical than ever as the DSM process becomes dominant. The signal crosstalk between the signal lines may become severe due to the considerable switching activities in the scan mode. Therefore, an additional delay on the signal line caused by the signal crosstalk between the signal lines during the delay test may incur a delay test over kill.

Further, when the shift frequency is searched based on the power consumption of the scan pattern, even if the power consumption does not exceed the spec of the IC chip, a scan test error may be incurred due to an IR-drop or ground-bounce caused by excessive circuit switching activities by the scan test characteristics and process variation.

For example, when performing a delay test using a scan pattern, an IR-drop, i.e., a voltage drop, may cause an additional delay on a specific signal line, which may lead to a delay test over kill. On the contrary, even when the power consumption of the scan pattern exceeds the spec of the IC chip, the IR-drop or ground-bounce problem may not occur due to manufacturing process and design characteristic of the IC. Therefore, there is a technical limit in searching the optimum shift frequency for the IC chip simply based on the power consumption. Further, when searching the maximum shift frequency only based on the power consumption of the scan pattern, even if the power consumption does not exceed the spec of the IC, an increased shift frequency may cause a critical path timing problem on the scan path.

When the shift frequency is increased, there may be a case where a critical path timing problem occurs on the scan path but no logical problem occurs due to the scan pattern. That is, a case of a false critical path may be occurred in a specific scan shift cycle according to bit values on the critical path of the scan path.

For example, when a shift operation is performed with a high shift frequency after storing two consecutive logical-0 bits in two flip-flops constituting a critical path on the scan path, a critical path delay time problem may occur, in which a signal for the logical-0 bit stored in a flip-flop located at the beginning of the critical path may not arrive at the next flip-flop in a normal shift time. However, in this case, there occurs no logical problem in the bits stored in the two flip-flops constituting the critical path by the shift operation, which is defined as the false critical path.

In addition, in the case of a low-power IC chip employing the technique of multiple voltage islands or multiple voltage domains or regions, every voltage region has different allowable power consumptions, because a high voltage is supplied to a design region requiring high speed performance and a relatively low voltage is supplied to other design regions.

SUMMARY

According to some embodiments of the present invention, an apparatus for performing a scan test of an integrated-circuit (IC) chip including a scan input port, a scan path, and a scan output port, the apparatus being configured to input a scan pattern to the scan path via the scan input port, to compare an output pattern outputted via the scan output port with a predetermined expected pattern, and to determine whether or not the IC chip is defective based on a result of comparing the output pattern with the predetermined expected pattern, includes a processor including a shift-frequency searching unit configured to search a usable shift frequency for a target scan section from among at least one scan section each including whole or a part of at least one scan pattern inputted to the scan path. When searching the usable shift frequency for the target scan section, the shift-frequency searching unit is configured to scale a shift frequency of the target scan section differently from that of at least one scan section among scan sections shifted to the scan path before or after the target scan section or to set the shift frequency of the target scan section differently from that of the at least one scan section among the scan sections shifted to the scan path before or after the target scan section, and to search a shift frequency with which a result of the scan test indicates a pass or a shift frequency with which the result of the scan test indicates a fail.

Further, according to some embodiments of the present invention, a method of performing a scan test of an integrated-circuit (IC) chip including a scan input port, a scan path, and a scan output port, by inputting a scan pattern to the scan path via the scan input port, comparing an output pattern outputted via the scan output port with a predetermined expected pattern, and determining whether or not the IC chip is defective based on a result of comparing the output pattern with the predetermined expected pattern, includes searching a usable shift frequency for a target scan section from among at least one scan section each including whole or a part of at least one scan pattern inputted to the scan path. When searching the usable shift frequency for the target scan section, the searching includes scaling a shift frequency of the target scan section differently from that of at least one scan section among other scan sections shifted to the scan path before or after the target scan section or to set the shift frequency of the target scan section differently from that of the at least one scan section among the other scan sections, and searching a shift frequency with which a result of the scan test indicates a pass or a shift frequency with which the result of the scan test indicates a fail.

Moreover, according to some embodiments of the present invention, a nontransitory computer-readable recording medium stores therein a program including computer-executable instructions for causing, when executed by a computer, the computer to execute the method according to some embodiments of the present invention.

Further, according to some embodiments of the present invention, a system for testing an integrated-circuit (IC) chip including a scan input port, a scan path, and a scan output port, includes a computer including the apparatus according to some embodiments of the present invention, a tester main unit, and at least one of a tester head or an interface board. In a state in which the computer and the tester main unit are connected to each other via a wired or wireless communication, the computer is configured to control the scan test of the IC chip, the tester main unit is configured to generate an electrical signal for performing the scan test of the IC chip, and the at least one of a tester head or an interface board is configured to deliver the electrical signal between the tester main unit and the IC chip.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 46 is a table showing experimental results using a shift frequency determined based on a power-limit-based method and a shift frequency optimized by a shift frequency scaling (increasing/decreasing) method for each scan section.

BEST MODE(S) FOR CARRYING OUT THE INVENTION

Figure 1:
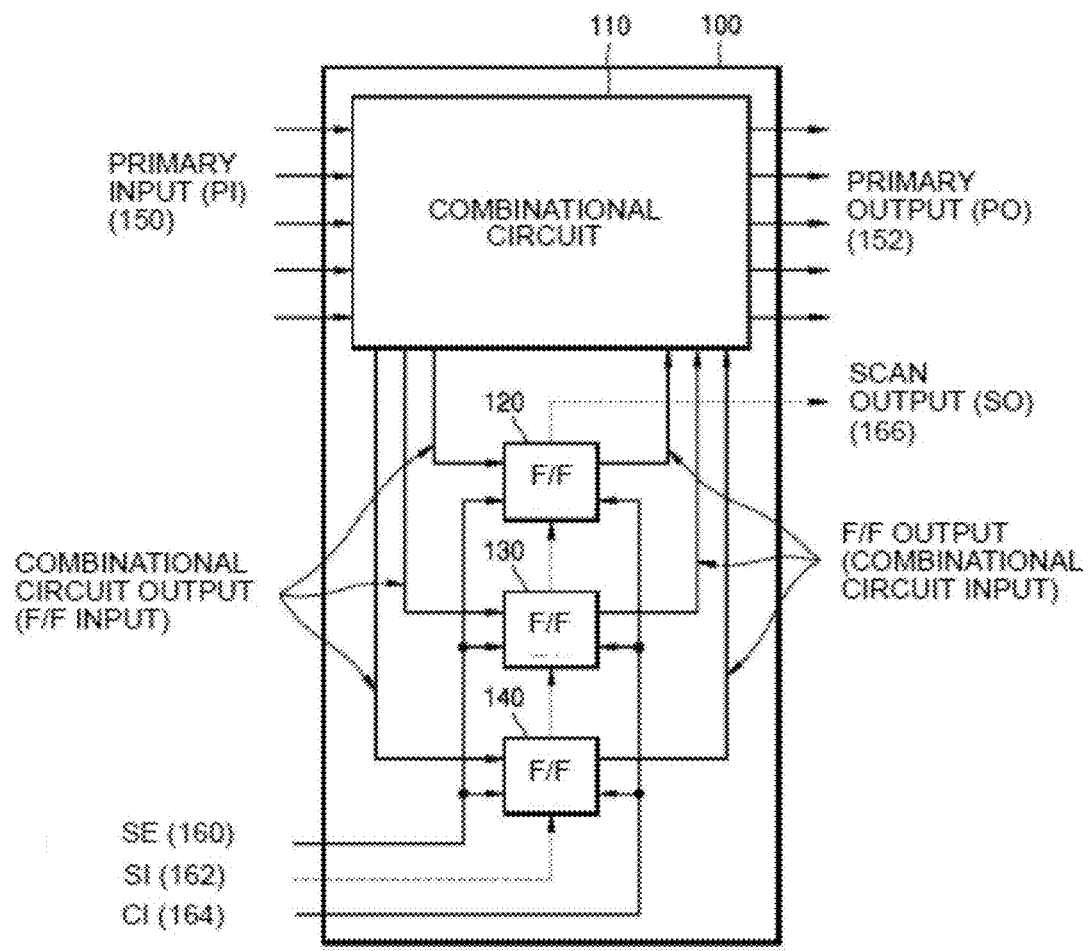
FIG. 1 is a block diagram of an IC chip with the scan design method applied.

Exemplary embodiments of the present disclosure are described in detail below with reference to the accompanying drawings. In the following descriptions, like reference numerals designate like elements although the elements are shown in different drawings. Further, detailed descriptions of known functions and configurations incorporated herein are omitted for the purpose of clarity and for brevity.

FIG. 1 is a block diagram of an IC chip to which a scan design method is applied.

As shown in FIG. 1, an IC chip 100 includes a combinational circuit 110 and a sequential logic. The sequential logic includes a plurality of flip-flops (F/Fs) 120, 130, and 140. Each of the flip-flops 120, 130, and 140 can be implemented in various schemes including a scan flip-flop of a multiplexer (MUX) type.

The IC chip 100 includes a primary input (PI) port 150, a primary output (PO) port 152, a scan enable (SE) port 160, a scan input (SI) port 162, a clock input (CI) port 164, and a scan output (SO) port 166. The scan enable port 160 and the clock input port 164 are connected to the flip-flops 120, 130, and 140. Each of the flip-flops 120, 130, and 140 is connected to the combinational circuit 110, such that a value stored in each of the flip-flops is outputted to the combinational circuit and an output value of the combinational circuit is inputted to each of the flip-flops.

The primary input port 150 and the primary output port 152 are ports for inputting and outputting data in a normal operation process of the IC chip.

The scan enable port 160 is a port for inputting a scan enable signal or a scan disable signal. The scan enable signal and the scan disable signal switch the mode of the IC chip between a normal mode (functional mode) in which the IC chip performs a normal operation and a scan mode for performing a test of the IC chip.

The scan input port 162 is a port for inputting a scan pattern to test the IC chip 100. The scan output port 166 is a port for outputting a test result obtained by performing a scan test using the scan pattern. A bit pattern outputted via the scan output port is referred to as an "output scan pattern", an "output pattern", or a "scan test result pattern".

The clock input port 164 is a port for inputting a clock signal to trigger a shift of the scan pattern inputted via the scan input port 162 to the flip-flops 120, 130, and 140 or a capture of an output of the combinational circuit 110 to store the output in the flip-flops 120, 130, and 140. For example, the flip-flops 120, 130, and 140 are triggered by a rising edge or a falling edge of the clock signal inputted via the clock input port 164.

A path (dashed line) from the scan input port 162 to the scan output port 166 via the flip-flops 120, 130, and 140 is referred to as a "scan chain" or a "scan path". Although a single scan path is shown in FIG. 1, a plurality of scan paths can be used as appropriate.

In the functional mode, the combinational circuit 110 performs an operation of receiving data via the primary input port 150 and outputting a result via the primary output port 152. In addition, in the functional mode, each of the flip-flops 120, 130, and 140 receives an output value from the combinational circuit 110 according to the clock signal, which is referred to as a "scan capture operation" in the scan test.

In the scan mode, bits of the scan pattern are sequentially shifted in to the flip-flops 120, 130, and 140 on the scan path according to the clock signal and sequentially shifted-out from the scan output port 166. An operation in which the scan pattern is shifted in to the flip-flops 120, 130, and 140 is referred to as a "load", and an operation in which values stored in the flip-flops 120, 130, and 140 are shifted out from the scan output port 166 is referred to as an "unload".

For example, when the number of flip-flops 120, 130, and 140 on the scan path in the IC chip is three, a length of each scan pattern is three bits, which is the same as the number of flip-flops on the scan path, and the three-bit scan pattern is sequentially shifted in to the flip-flops 120, 130, and 140 on the scan path according to the clock signal.

That is, when the rising edge of the clock signal is used to store a value a flip-flop, the first bit of the scan pattern is stored in the first flip-flop 140 at the rising edge of the first clock signal, an output value of the first flip-flop 140 is stored in the second flip-flop 130 and the second bit of the scan pattern is stored in the first flip-flop 140 at the rising edge of the second clock signal, and an output value of the second flip-flop 130 is stored in the third flip-flop 120, an output of the first flip-flop 140 is stored in the second flip-flop 130, and the third bit of the scan pattern is stored in the first flip-flop 140 at the rising edge of the third clock signal. Therefore, one scan pattern is loaded in the flip-flops 120, 130, and 140 on the scan path with three clock signals. In the similar manner, values of the flip-flops 120, 130, and 140 on the scan path are unloaded via the scan output port 166 with three clock signals.

Details of the scan test process according to some embodiments of the present invention are described below.

Step 1: Primary input test data are applied to the primary input port 150 of the IC chip 100.

Step 2: A scan enable signal is applied to the scan enable port 160, to set the IC chip 100 to the scan mode.

Step 3: A scan pattern is shifted in via the scan input port 162, to load the scan pattern into the flip-flops 120, 130, and 140 on the scan path. The scan pattern loaded into the scan path is applied to the combinational circuit 110. An output result outputted from the primary output port 152 in response to the scan pattern applied to the combinational circuit 110 is compared with an expected primary output value. When a result of the comparison indicates a mismatch, the IC chip is determined to be faulty.

Step 4: A scan disable signal is applied to the scan enable port 160, to switch the mode of the IC chip 100 from the scan mode to the functional mode. In the functional mode, when a clock signal is applied to the clock input port 164, each of the flip-flops 120, 130, and 140 captures an output value of the combinational circuit 110. This operation is referred to as a "scan capture", and the mode in which the scan capture is performed is referred to as a "scan capture mode".

Step 5: A scan enable signal is applied to the scan enable port 160, to switch the mode of the IC chip 100 from the functional mode to the scan mode.

Step 6: The value captured in each of the flip-flops 120, 130, and 140 on the scan path is shifted-out and accordingly an output pattern is unloaded from the scan output port 166.

Step 7: The unloaded output pattern is compared with a predetermined expected pattern, to determine whether or not the IC chip operates in a normal manner. The expected pattern is a value or an output pattern known or expected before the test, which is a scan pattern supposed to be outputted from the scan output port 166 after applying the primary input test data and the scan pattern and performing the scan capture when the IC chip is normal. When a result of the comparison at Step 3 indicates a match and a result of the comparison at Step 7 indicates a match, the test result is a "PASS", which means that the IC chip is normal. Otherwise, the test result is a "FAIL", which means that the IC chip is faulty. The test PASS means that the IC is fault free, and the test FAIL means that the IC chip is defective.

Figure 2:
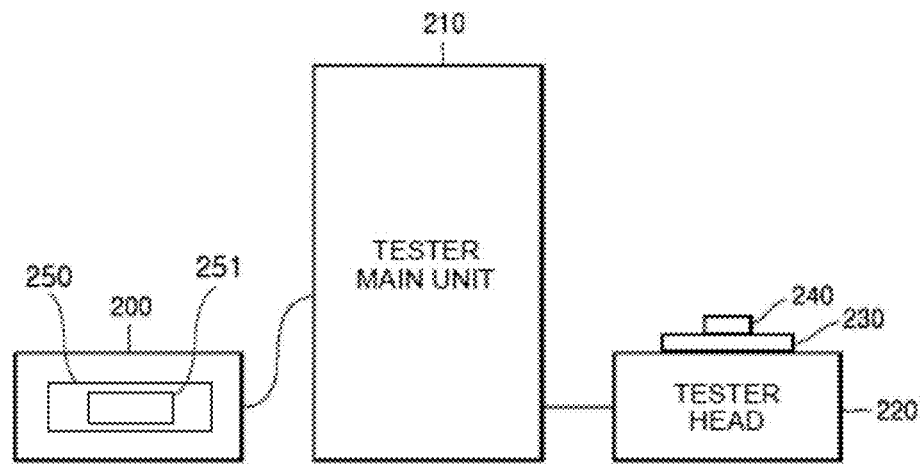
FIGS. 2 and 3 are schematic diagrams of a chip test system according to some embodiments of the present invention.
Figure 3:
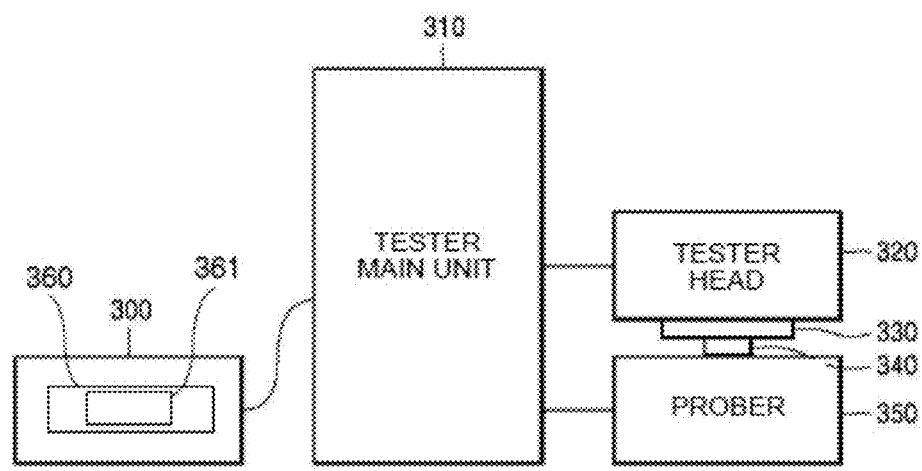

FIGS. 2 and 3 are schematic diagrams of a chip test system, which is referred to as an "automatic test equipment (ATE)" according to some embodiments of the present invention.

As shown in FIGS. 2 and 3, the chip test system includes a host computer 200/300, a tester main unit 210/310, a tester head 220/320, and an interface board 230/330. A device under test (DUT) 240/340 that is placed on the interface board 230/330 for a test is an IC on a wafer or a packaged IC. When the DUT 240/340 is an IC chip on a wafer, the chip test system further includes a prober 350. An IC chip, an IC chip on a wafer, and a packaged IC chip are collectively referred to as an "IC chip" or simply a "chip".

The tester main unit 210/310 performs overall control of the scan test. For example, the tester main unit controls overall processes of setting up for a DUT test, generating an electrical signal for the DUT test, and observing and measuring a test result signal of the DUT. The tester main unit 210/310 can be implemented as a computer including a central processing unit (CPU), a memory, a hard disk, a user interface, and the like. In some embodiments, the tester main unit 210/310 further includes a device power supply for supplying a power to the DUT 240/340.

The tester main unit 210/310 controls a digital signal processor (DSP, not shown) for processing various digital signals and the tester head 220/320). The tester main unit 210/310 includes dedicated hardware such as a controller and a signal generator for applying a signal to the DUT 240/340, software, firmware, and the like. The tester main unit 210/310 is also referred to as a "main frame" or a "server".

The host computer 200/300 is a computer such as a personal computer, a workstation, or the like, which is a device that allows a user to execute a test program, to control a test process, and to analyze a test result. In general, the host computer 200/300 includes a CPU, a storage unit such as a memory and a hard disk, a user interface, and the like. The host computer 200/300 is connected to the tester main unit 210/310 via a wired or wireless communication. The host computer 200/300 includes dedicated hardware, software, firmware, and the like for controlling the test. Although the host computer and the tester main unit are separately shown in the drawings, the host computer 200/300 and the tester main unit 210/310 can be provided in an integrated manner.

The memory of the tester main unit 210/310 or the host computer 200/300 includes a dynamic random access memory (DRAM), a static random access memory (SRAM), a flash memory, or the like. The memory stores therein programs and data for performing the DUT test.

The software or the firmware of the tester main unit 210/310 or the host computer 200/300 includes a device driver program, an operating system (OS) program, and a program for performing a DUT test, for performing a scan test. These programs are stored in a memory in the form of instruction codes for setting up for the DUT test, generating a signal for the DUT test, and observing and measuring a test result signal of the DUT and can be executed by the CPU. Therefore, the scan pattern is applied to the DUT by these programs. Further, reporting data and analysis data for the DUT test and the test result can be automatically obtained by a program. A language used in the program includes C, C++, java, or the like. The programs can be stored in a storage device such as a hard disk, a magnetic tape, a flash memory, or the like.

The CPU of the tester main unit 210/310 or the host computer 200/300 is a processor, which executes the instruction codes of the software or the program stored in the memory. For example, when a user command is inputted via a user interface such as a keyboard, a mouse, or the like, the CPU analyzes the user command, and after performing an operation corresponding to the user command by executing the software or the program, provides a result of the operation to a user via a user interface such as a speaker, a printer, a monitor, or the like.

The user interface of the tester main unit 210/310 or the host computer 200/300 allows a user and an apparatus to transmit and receive information. For example, the user interface includes an input interface unit such as a keyboard, a touch screen, a mouse, and the like and an output interface unit such as a speaker, a printer, a monitor, and the like.

The tester head 220/320 includes a channel and the like for transmitting an electrical signal between the tester main unit 210/310 and the DUT 240/340. The interface board 230/330 is provided over the tester head 220/320. In general, an interface board used to test a packaged IC chip is referred to as a "load board", and an interface board used to test an IC chip on a wafer is referred to as a "probe card".

In some embodiments of the present invention, the host computer 200/300 includes an integrated-circuit (IC) chip test apparatus (apparatus for minimizing scan test time) 250/360.

The IC chip test apparatus 250/360 includes a shift-frequency searching unit 251/361 configured to search a shift frequency with which a result of the scan test indicates a pass or a shift frequency with which the result of the scan test indicates a fail, by shifting, to a scan path, a target scan section for which a usable shift frequency is to be searched from among two or more scan sections included in a scan pattern set.

When searching a shift frequency for the target scan section, the shift-frequency searching unit 251/361 searches the shift frequency with which the result of the scan test indicates the pass or the shift frequency with which the result of the scan test indicates the fail, by scaling (increasing or decreasing) the shift frequency of the target scan section differently from that of at least one scan section among other scan sections shifted to the scan path or by setting the shift frequency of the target scan section differently from that of at least one scan section among the other scan sections shifted to the scan path.

When searching usable shift frequency for the target scan section, the shift-frequency searching unit 251/361 searches a shift frequency in a frequency range where the result of the scan test changes from the pass to the fail or a shift frequency in a frequency range where the result of the scan test changes from the fail to the pass, by scaling the shift frequency of the target scan section.

When searching the usable shift frequency for the target scan section, the shift-frequency searching unit 251/361 determines, when both a result of a first scan test obtained by using a first shift frequency for the target scan section and a result of a second scan test obtained by using a second shift frequency different from the first shift frequency for a scan section shifted to the scan path prior to the target scan section indicate the pass, the first shift frequency as the usable shift frequency for the target scan section.

In some embodiments of the present invention, the shift-frequency searching unit 251/361 performs a first scan test by shifting a first scan pattern including a first scan section to the scan path and a second scan test by shifting a second scan pattern including a second scan section shifted after the first scan section to the scan path and to search a usable shift frequency for the second scan section.

The shift-frequency searching unit 251/361 shifts the first scan section with a first shift frequency in the first scan test and shifts the second scan section with a second shift frequency different from the first shift frequency to the scan path in the second scan test, and when searching the usable shift frequency for the second scan section, determines, when both a result of the first scan test and a result of the second scan test indicate the pass, the second shift frequency as the usable shift frequency for the second scan section.

In some embodiments, the first scan section includes a whole or a part of the first scan pattern, and the second scan section includes a whole or a part of the second scan pattern.

When searching the usable shift frequency for the second scan section, the shift-frequency searching unit 251/361 scales (increases or decreases) the second shift frequency differently from a shift frequency of at least one scan section among other scan sections shifted to the scan path or sets the second shift frequency differently from a shift frequency of at least one scan section among the other scan sections.

Although the IC chip test apparatus 250/360 is included in the host computer 200/300 in FIGS. 2 and 3, this configuration is a mere example. The IC chip test apparatus 250/360 can be implemented in a separate computer including at least a processor and connected to the host computer 200/300 or the tester main unit 210/310 to perform the above-mentioned functions.

The test systems (apparatuses) shown in FIGS. 2 and 3 are mere examples to enhance understanding of the present invention. The system can be designed and modified in various forms by integrating the elements as appropriate or dividing one element into a plurality of elements depending on the embodiment.

The scan pattern is a bit pattern inputted to the scan path for performing a scan test or a bit pattern outputted from the scan path.

The bit length of the scan pattern is a length of a bit pattern required to perform a single scan test operation. For example, the bit length of the scan pattern is equal to a bit length of a bit pattern shifted to the scan path until a scan capture operation is initiated. For another example, the bit length of the scan pattern is equal to the number of storage elements such as the flip-flops on the scan path. The bit length of the scan pattern is not limited to the above-mentioned examples, but can be set in various forms depending on a scan test circuit.

The embodiments of the present invention can be applied to various types of chips that shift in a bit pattern to a scan path and shift out an output pattern from the scan path, as well as the IC chip shown in FIG. 1.

For example, the embodiments of the present invention can be applied to various types of chips that include a circuit for performing a shift-in operation of shifting in a scan pattern to a scan path, a scan capture operation, and a shift-out operation of shifting out a captured bit pattern from the scan path.

Figure 4:
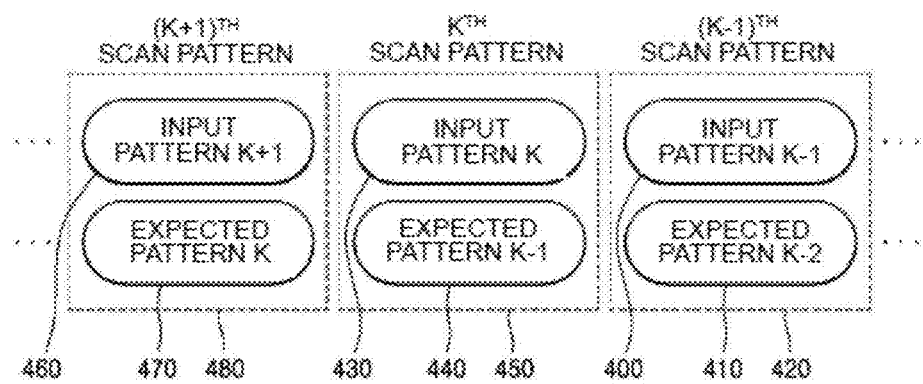
FIG. 4 is a schematic diagram of a scan pattern according to some embodiments of the present invention.

FIG. 4 is a schematic diagram of a scan pattern that can be used in a chip test according to some embodiments of the present invention.

As shown in FIG. 4, the shift-in operation and the shift-out operation are performed simultaneously to reduce time required to respectively perform the shift-in and shift-out operations in the scan mode. That is, the load operation and the unload operation are performed simultaneously.

For example, when an input pattern K 430 is shifted in via the scan input port and loaded into the scan path, a test result for an input pattern K−1 400 is shifted out and unloaded via the scan output port. The unloaded output pattern is then compared with an expected pattern K−1 440 for the input pattern K−1 400. In general, the expected pattern K−1 440 for the input pattern K−1 400 and the input pattern K 430 can be managed in pair in test data or in a file.

In some embodiments of the present invention, in order to perform a scan test by overlapping the shift-in operation and the shift-out operation, the input pattern K 430 shifted in via the scan input port and the expected pattern K−1 440 for the input pattern K−1 400 are managed in pair. In this manner, the scan patterns can have a predetermined order. In some embodiments, the scan patterns are reordered in various manner.

In some embodiments of the present invention, the output pattern shifted out when the first scan pattern is shifted in to the scan path is a don't-care pattern or a scan path state value obtained by resetting the test target chip.

As another method to minimize the scan test time, the number of total scan patterns for the scan test can be reduced or the scan shift speed can be increased.

Increasing the scan shift speed means increasing a shift frequency for shifting in or shifting out a scan pattern or decreasing a period of the shift frequency (i.e., a clock period). Decreasing the scan shift speed means decreasing the shift frequency or increasing the period of the shift frequency. Further, optimizing the scan shift speed means optimizing the shift frequency or optimizing the period of the shift frequency.

Increasing or decreasing the shift frequency is substantially same as decreasing or increasing the period of the shift frequency, and hence, hereinafter, the method of minimizing the scan test time is explained from the viewpoint of increasing or decreasing the shift frequency for the convenience of explanation. Therefore, without an explicit description, increasing or decreasing the shift frequency can be construed as decreasing or increasing the period of the shift frequency, and vice versa. The period of the shift frequency can be simply referred to as a "period" or a "clock period" of an input clock.

FIGS. 5 to 9 are schematic diagrams for illustrating methods of dividing test data into one or more scan sections to minimize the chip test time according to some embodiments of the present invention.

Figure 5:
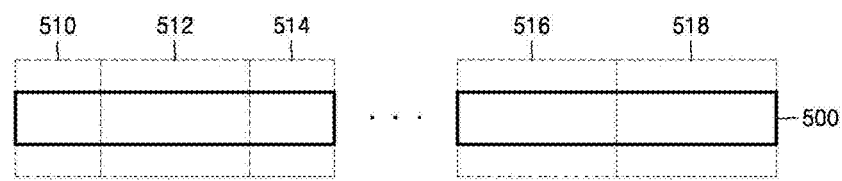
FIGS. 5 to 9 are schematic diagrams for illustrating test-data dividing methods according to some embodiments of the present invention.

As shown in FIG. 5, the scan test time can be saved by dividing a bit pattern of test data 500 shifted in to a scan path for testing an IC chip into a plurality of scan sections 510, 512, 514, 516, and 518, searching the optimum shift frequency for each of the scan sections 510, 512, 514, 516, and 518, and applying searched optimum shift frequencies to the scan test.

Figure 6:
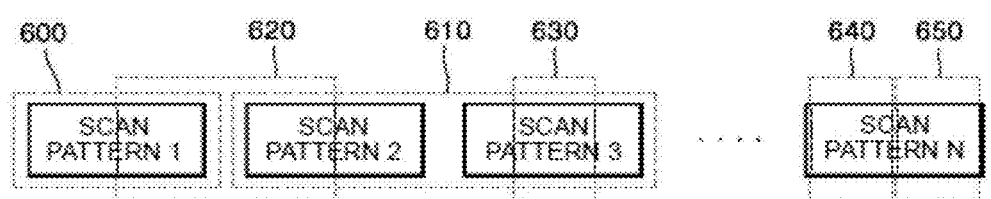

In some embodiments of the present invention, the bit pattern of the test data 500 is divided into a plurality of scan patterns as shown in FIG. 6.

As shown in FIG. 6, a plurality of scan patterns can be used to test the IC chip. A scan section may include one or more scan patterns or a part of a scan pattern. The scan test time can be further saved by searching the optimum shift frequency for each scan section and applying searched optimum shift frequencies to the scan test.

In some embodiments, a scan section 600 includes a single scan pattern, having one-to-one correspondence with the scan pattern. That is, the scan pattern is same as the scan section.

In some embodiments, a scan section 610 includes two scan patterns. The number of scan patterns included in a scan section can be changed as appropriate.

In some embodiments, a scan section 620 includes a part of a first scan pattern and a part of a second scan pattern.

In some embodiments, a scan section 630 includes a part of a scan pattern.

In some embodiments, a scan pattern is divided into two scan sections 640 and 650. The number of scan sections included in a scan pattern can be changed as appropriate.

The test data can be divided into a plurality of scan sections by applying any one among the above-mentioned schemes corresponding to the scan sections 600, 610, 620, 630, 640, and 650 or applying any combination thereof. For example, the test data including N scan patterns shown in FIG. 6 can be divided into the first scan section 600 including a scan pattern, the second scan section 610 including two scan patterns, the third and fourth scan sections 640 and 650 each including a part of a scan pattern.

Figure 7:
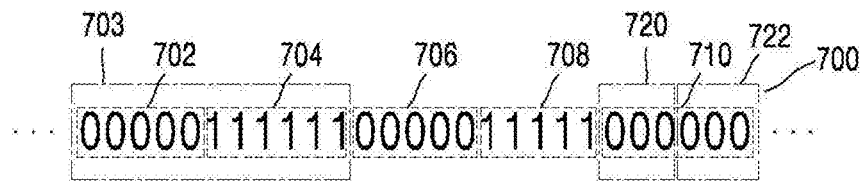

As shown in FIG. 7, a bit pattern of test data 700 can be divided into scan sections 702, 704, 706, 708, and 710 based on a section in which the same bit value is repeated in a consecutive manner. The shift-in of the same bit value to the scan path in a consecutive manner reduces switching activities of bit values on the scan path, reducing the power consumption accordingly, and hence a high shift frequency can be allocated to a scan section having continued bits of the same value.

For example, the test data 700 can be divided into the scan sections 702, 704, 706, 708, and 710 based on a boundary where the bit value changes from 0 to 1 or from 1 to 0 in the bit pattern of the test data 700. Further, in a section 710 of a bit pattern in which a bit value 0 or 1 is repeated, M (M is an integer) bits can be grouped to divide the bit pattern into scan sections 720 and 722.

For another example, when a length of a section in which the same bit value is repeated in a consecutive manner is shorter than a predetermined length, at least two scan sections 702 and 704 can be grouped to constitute a single scan section 703.

Figure 8:
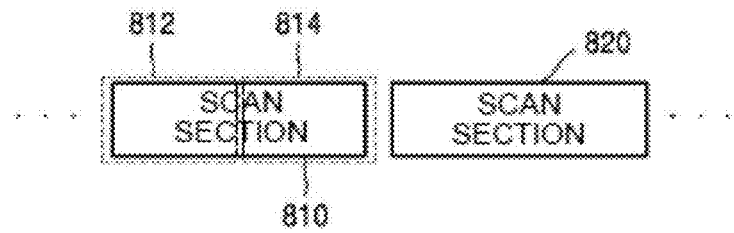

As shown in FIG. 8, a scan section 810 can be divided into a plurality of sub scan sections 812 and 814. For example, when the scan section 810 has a relatively low optimum shift frequency between the optimum shift frequencies searched for scan sections 810 and 820, the scan section 810 is divided into a plurality of sub scan sections 812 and 814, and the optimum shift frequency is searched again for each of the sub scan sections 812 and 814.

Figure 9:
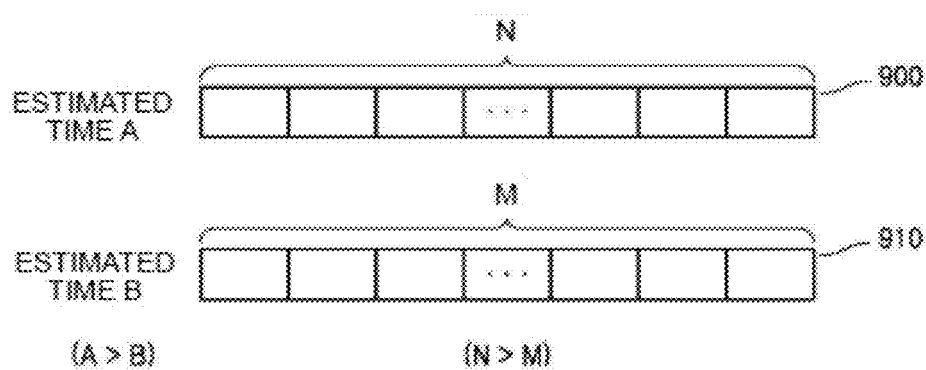

As shown in FIG. 9, the number of scan sections to divide the test data can be determined by considering an estimated time for searching the optimum shift frequency to be applied to each scan section of test data 900 and 910. As the number of scan sections increases, the estimated time for searching the optimum shift frequencies for all the scan sections increases. The estimated time can be calculated by a predetermined equation relating the number of scan sections to the estimated time.

In the example shown in FIG. 9, when there is a time restriction that up to time A can be used to search the optimum shift frequency, the number of scan sections N is determined to divide the test data 900 such that the estimated time does not exceed the time A. When there is a time restriction that up to time B (A>B) can be used to search the optimum shift frequency, the number of scan sections M (N>M) is determined to divide the test data 910 such that the estimated time does not exceed the time B.

When the number of scan sections to divide the test data 900 is determined as N, the test data 900 is divided into N scan sections. To this end, various methods can be used including a method of dividing the test data 900 into N scan sections having the same bit length, a method of dividing the test data 900 into scan sections based on a section in which the same bit value is repeated in a consecutive manner as shown in FIG. 7 until the number of sections reaches N, and the like.

Following information can be used to calculate the estimated time.

Start frequency to search optimum shift frequency
End frequency to search optimum shift frequency
Increment or decrement of frequency to search optimum shift frequency
Method of scaling frequency to search optimum shift frequency (increase or decrease frequency in a continuous manner, in a manner based on binary search, or the like)
Number of scan patterns included in test data (SPN)
Bit length of scan pattern (SBL)
Method or reference to divide test data into scan sections (units of predetermined bit length, predetermined number, boundary where bit value is changed, or the like)
Number of scan sections (SSN)
Performance of apparatus executing method of searching optimum shift frequency (e.g., performance of processor (CPU speed and the like), capacity and speed of memory or hard disk, or the like)
Time margin considering data input/output time and the like of apparatus executing method of searching optimum shift frequency In some embodiments of the present invention, when the frequency is gradually increased from the start frequency to the end frequency to search the optimum shift frequency, the estimated time can be calculated by:

$$\text{Estimated time } (T) = SSN \times SPN \times SBL \times SFP \times FN \quad \text{[Equation 1]}$$

In Equation 1, SSN is the number of scan sections, SPN is the number of scan patterns, SBL is the bit length of the scan pattern, SFP is the period of the shift frequency, FN is the number of times of increasing the shift frequency to search the optimum shift frequency for each scan section.

When the estimated time is given, the number of scan sections can be determined by using Equation 1.

Figure 10:
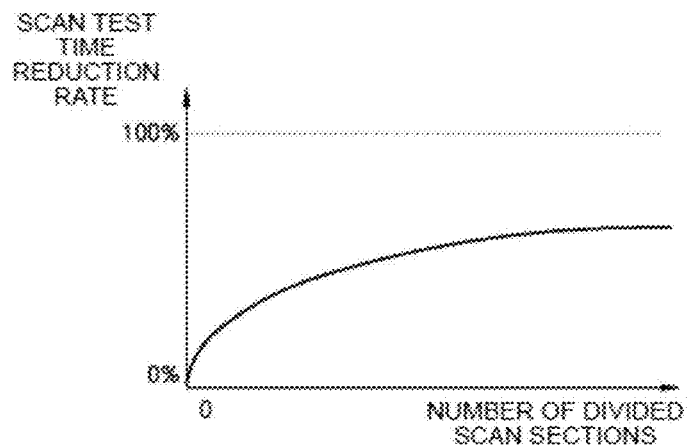
FIG. 10 is a graph showing a relation between the number of scan sections and scan test time reduction rate according to some embodiments of the present invention.

FIG. 10 is a graph showing a relation between the number of scan sections and scan test time reduction rate according to some embodiments of the present invention.

As shown in FIG. 10, the number of scan sections of the test data can be determined by using information on the relation between the number of scan sections and the scan test time reduction rate. As the number of scan sections with the shift frequency optimized increases, the scan test time reduction rate using the test data increases.

In the graph shown in FIG. 10, the vertical axis represents a reduction rate of scan test time when using the optimum shift frequency for each scan section with respect to scan test time when using a constant shift frequency for the whole test data. The horizontal axis represents the number of scan sections with the shift frequency optimized.

As the number of scan sections to divide the test data increases, the average bit length of the scan sections decreases. As the bit length of the scan section decreases, the optimum shift frequency increases, resulting in a further reduction of the scan test time.

The methods of dividing the test data into scan sections described above are mere examples to enhance understating of the present invention, and hence the present invention is not limited to the methods shown in FIGS. 5 to 10. It is a matter of course that various methods to divide the test data can be applied other than the methods shown in FIGS. 5 to 10.

Figure 11:
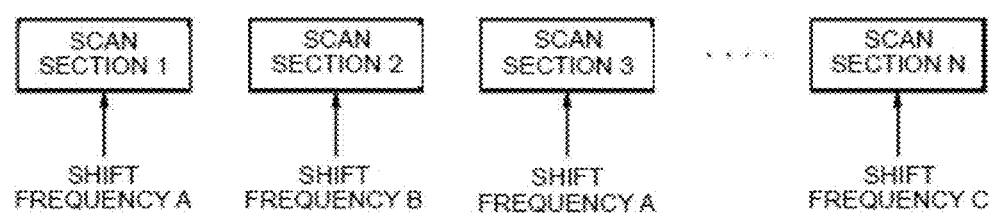
FIG. 11 is a schematic diagram for illustrating allocation of a shift frequency for each scan section to minimize chip test time according to some embodiments of the present invention.

FIG. 11 is a schematic diagram for illustrating allocation of a shift frequency for each scan section to minimize the chip test time according to some embodiments of the present invention.

As shown in FIG. 11, each of a plurality of shift frequencies is allocated to each scan section. The conventional scan test employs a constant shift frequency with which all scan patterns of test data can be normally shifted to a scan path of an IC chip, which is referred to as a "nominal shift frequency".

In general, the nominal shift frequency is a shift frequency used when the ATPG software generates a scan pattern or a shift frequency appropriately adjusted therefrom. The nominal shift frequency is a constant shift frequency that allows all the scan patterns to test the IC chip to be normally shifted to the scan path of the IC chip, which is considerably low (e.g., about 5 MHz).

Therefore, when the nominal shift frequency is used for thousands of scan patterns constituting test data, it takes a considerable time to perform the scan test, which in particular, greatly affects cost and time-to-market of the IC chip at the time of mass production test of the IC chip. For example, when it takes 2 seconds to test one IC chip, a sequential test of 10 million chips requires about 5,556 hours, i.e., about 231 days. Even when expensive equipment is used to simultaneously test a plurality of chips, a considerable test time is required. Typically, an IC chip test service company issues an invoice based on the number of test apparatuses used and the test time, and hence the chip test time may be a significant factor to decide the cost of the chip.

When the nominal shift frequency is increased to save the test time, the power consumption generated when shifting in or out the scan pattern may exceed the tolerance of the power consumption of the IC chip, which disables a normal scan test. Further, an over shift frequency may cause an over kill in which a normal chip is determined to be defective due to critical path delay time problem, aggravation of power supply noise effect, aggravation of crosstalk effect between signal lines, and the like. This may affect the yield and the cost of the IC chip in the mass production of the IC chip.

To cope with the problems, in some embodiments of the present invention, the optimum shift frequency with which a scan section can be normally shifted to a scan path is allocated to each scan section, instead of applying a constant shift frequency such as the nominal shift frequency to the whole scan pattern. The method of searching the optimum shift frequency for each scan section is explained in detail below with reference to FIG. 12 and the subsequent drawings. In some embodiments, the optimum shift frequency means the maximum shift frequency that can be used for the corresponding scan section or a shift frequency lower than the maximum shift frequency.

In the example shown in FIG. 11, a scan section 1 is allocated with a shift frequency A, a scan section 2 is allocated with a shift frequency B. Further, a scan section 3 is allocated with the shift frequency A, which is the same as that for the scan section 1. In this manner, each scan section can be allocated with a shift frequency same as that of other scan section or a shift frequency different from that of the other scan section.

For example, when a single scan pattern is divided into a plurality of scan sections, a plurality of shift frequencies can be allocated to the single scan pattern. Referring to FIG. 6, the scan sections 640 and 650 included in a single scan pattern are allocated with different shift frequencies from each other. That is, two shift frequencies are allocated to a single scan pattern in this case.

In some embodiments, some scan sections allocated with respective shift frequencies are grouped together. For example, the second scan section and the third scan sections are grouped together as one section group, and a shift frequency equal to or lower than either of the shift frequencies A and B which is lower can be allocated to the corresponding section group.

The observation of the test result at the primary output port after applying the primary input test data to the primary input port and inputting the scan pattern to the scan path in the scan test process may or may not apply to a chip test process according to the following embodiments.

Figure 12:
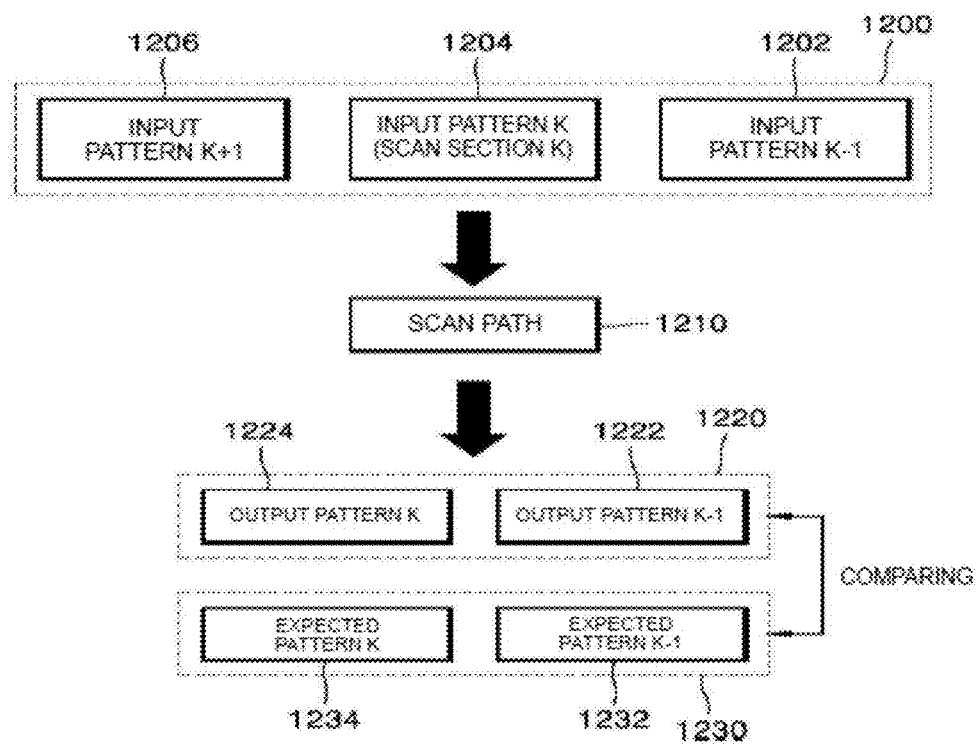
FIG. 12 is a schematic diagram for illustrating a method of searching a shift frequency to minimize the chip test time according to some embodiments of the present invention.

FIG. 12 is a schematic diagram for illustrating a method of searching a shift frequency to minimize the chip test time according to some embodiments of the present invention.

First, a relation among input pattern, scan section, scan pattern, and output pattern is explained below.

Input patterns 1202, 1204, and 1206 are bit patterns inputted to a scan path 1210. In FIG. 12, a current target scan section K to determine a shift frequency corresponds to the input pattern K 1204. A bit pattern coming before or after the input pattern K 1204 including the scan section K for which the optimum shift frequency is to be searched or determined (hereinafter, "target scan section K") can be referred to as an auxiliary scan section or auxiliary bit pattern with respect to the target scan section.

(Input Pattern when Scan Section and Scan Pattern have One-to-one Correspondence with Each other)

When the target scan section K 1204 has one-to-one correspondence with a scan pattern M, the input pattern K−1 1202, the input pattern K 1204, and the input pattern K+1 1206 can have one-to-one correspondence with a scan pattern M−1, the scan pattern M, and a scan pattern M+1, respectively.

(Output Pattern K when Scan Section and Scan Pattern have One-to-one Correspondence with Each other)

When the target scan section K 1204 has one-to-one correspondence with the scan pattern M, an output pattern of the scan path 1210 for the target scan section K 1204 corresponds to an output pattern K 1224 of the scan path 1210 for the scan pattern M. The output pattern K 1224 is a scan capture result pattern for the target scan section K 1204 or a pattern obtained by outputting the scan pattern M from the scan path.

(Output Pattern K−1 when Scan Section and Scan Pattern have One-to-one Correspondence with Each other)

When the target scan section K 1204 and the scan pattern M have one-to-one correspondence with each other, an output pattern of the scan path for the input pattern K−1 1202 corresponds to an output pattern K−1 1222 of the scan path for the scan pattern M−1. The output pattern K−1 1222 is a scan capture result pattern for the scan pattern M−1 or a pattern obtained by outputting the scan pattern M−1 from the scan path.

(Output Pattern k+1 when Scan Section and Scan Pattern have One-to-one Correspondence with Each other)

When the target scan section K 1204 and the scan pattern M have one-to-one correspondence with each other, an output pattern of the scan path for the input pattern K+1 1206 is an output pattern K+1 of the scan path for the scan pattern M+1. The output pattern K+1 is a scan capture result pattern for the scan pattern M+1 or a pattern obtained by outputting the scan pattern M+1 from the scan path.

(Input Patterns K−1 and K+1 when Scan Section is a Part of Scan Pattern)

Figure 14:
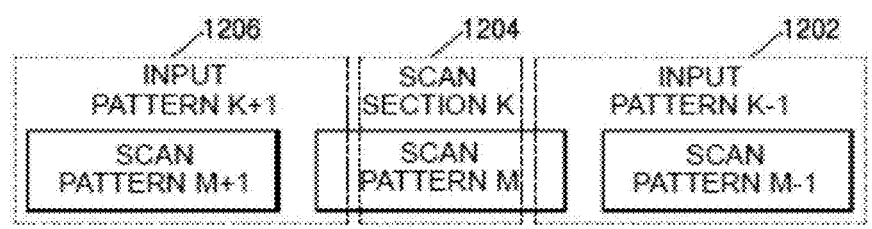

For example, as shown in FIG. 14, when the target scan section K 1204 is a part of the scan pattern M, the input pattern K−1 1202 may include the scan pattern M−1 and a part of the scan pattern M other than the scan section K 1204. Similarly, the input pattern K+1 1206 may include the scan pattern M+1 and a part of the scan pattern M other than the scan section K 1204.

(Output Pattern K when Scan Section is a Part of Scan Pattern)

When the target scan section K 1204 is a part of the scan pattern M as shown in FIG. 14, the output pattern K 1224 of the scan path for the target scan section K 1204 is a scan capture result pattern for the target scan section K 1204 or a scan capture result pattern for the scan pattern M including the scan section K. Alternatively, the output pattern K 1224 is a pattern obtained by outputting the scan section K 1204 from the scan path or a pattern obtained by outputting the scan pattern M including the scan section K 1204 from the scan path.

(Output Patterns K−1 and K+1 when Scan Section is a Part of Scan Pattern)

When the target scan section K 1204 is a part of the scan pattern M as shown in FIG. 14, the output pattern K−1 1222 of the scan path for the input pattern K−1 1202 is an output pattern for the scan pattern M−1 or an output pattern for the scan pattern M−1 and a part of the scan pattern M. The output pattern K+1 of the scan path for the input pattern K+1 1206 is an output pattern for the scan pattern M+1 or an output pattern for the scan pattern M+1 and a part of the scan pattern M. For another example, the output pattern of the scan path for the part of the scan pattern M included in the input pattern K−1 1202 or the input pattern K+1 1206 can be reflected on the output pattern of the scan path for the scan pattern M including the target scan section K 1204. For another example, the output pattern for the input pattern K−1 1202 or the input pattern K+1 1206 is a pattern obtained by outputting the input pattern K−1 1202 or the input pattern K+1 1206 from the scan path.

(When Scan Section Extends Across a Plurality of Scan Patterns)

Figure 15:
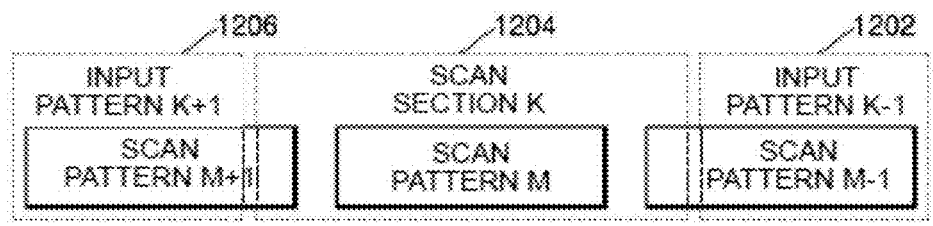

For example, as shown in FIG. 15, the target scan section K 1204 may extend across a plurality of scan patterns. In this case, the input pattern K−1 1202 may include a part of the scan pattern M−1 other than the part of the target scan section K 1204, and the input pattern K+1 1206 may include a part of the scan pattern M+1 other than the part of the target scan section K 1204. In this case, the optimum shift frequency is separately searched for each portion of the target scan section K 1204 that extends across the plurality of scan patterns to determine the optimum shift frequency that can be allocated to the target scan section K 1204.

The above descriptions are mere examples to enhance understanding of the present invention, and hence the present invention is not limited to the above-mentioned examples. Further, the scan pattern can be divided into various types of scan sections as shown in FIGS. 5 to 10, and the forms of the input pattern K and the input pattern K−1 coming before or the input pattern K+1 coming after can vary according to the forms of scan sections divided. That is, the input pattern K−1 1202 or the input pattern K+1 1206 can include one or more scan sections.

FIG. 12 shows an example of the method of minimizing the scan test time when the shift-in operation and the shift-out operation are performed in an overlapped manner as shown in FIG. 4. The example shown in FIG. 12 is to instantiate an example according to the present invention, and hence the present invention is not limited to the case where the shift-in operation and the shift-out operation are performed simultaneously as shown in FIG. 4.

In the scan test of an IC chip, it is determined whether or not the test is normal by comparing a test result pattern 1220 for an input pattern 1200 with an expected pattern 1230. That is, it is determined whether or not the test is normal by loading the input pattern 1200 into the scan path 1210, unloading the result pattern 1220 obtained by performing a capture operation or unloading the input pattern without the capture operation, and comparing the expected pattern 1230 with the unloaded result pattern 1220.

In some embodiments of the present invention, in order to optimize the shift frequency for a scan pattern or a scan section, it is also confirmed whether or not an output pattern simultaneously (or sequentially) shifted out from the scan path when a target scan pattern or a target scan section is shifted in to the scan path is normal. For example, even when the target scan pattern or the target scan section is normally shifted in to the scan path with an increased shift frequency, the increased shift frequency may cause an error in a test result pattern shifted out for the previous input pattern.

In the example shown in FIG. 12, the input pattern K−1 1202 and the input pattern K+1 1206 can be used to confirm whether or not the target scan section K 1204 is normally shifted in to the scan path with a specific shift frequency. That is, before each input of the target scan section K 1204 to the scan path 1210, the input pattern K−1 1202 can be used, which initializes the scan path to a predetermined bit pattern. Further, the input pattern K+1 1206 can be used, which is shifted in to the scan path with a predetermined bit pattern each time when the output pattern of the scan path for the Kth scan section 1204 is shifted out from the scan path.

When the target scan section K 1204 has one-to-one correspondence with the scan pattern M, the input pattern K−1 1202 is the scan pattern M−1 used in the actual scan test, which comes before the target scan section K 1204, or an expected pattern for the result pattern obtained by performing a scan capture after loading the scan pattern M−1 into the scan path.

For another example, when the target scan section K 1204 is a part of the scan pattern M as shown in FIG. 14, the input pattern K−1 1202 includes the scan pattern M−1 used in the actual scan test, which comes before the target scan section K 1204 or an expected pattern for the result pattern obtained by performing a scan capture after loading the scan pattern M−1 into the scan path. Further, the input pattern K−1 1202 includes a part of the scan pattern M other than the target scan section K 1204. For example, the part of the scan pattern M other than the target scan section K is a part of a bit pattern used in the actual scan test.

For another example, the input pattern K−1 1202 is a predetermined pattern mainly including bit "0" or "1" or a predetermined pattern mainly including consecutive bits of "0" or "1", to reduce the switching activities of the scan path, or the like.

Figure 13:
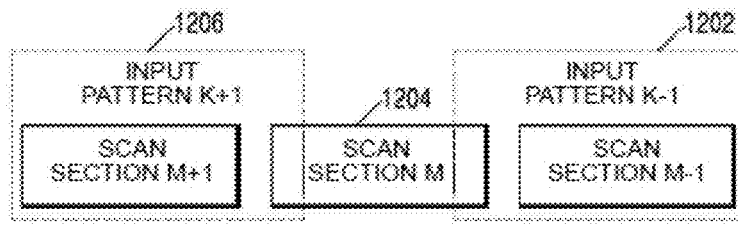
FIGS. 13 to 15 are schematic diagrams of input patterns inputted to a scan path to determine a shift frequency according to some embodiments of the present invention.

For another example, the input pattern K−1 1202 may include one or more scan sections as shown in FIG. 13.

When the target scan section K 1204 has one-to-one correspondence with the scan pattern M, the (K+1)th input pattern 1206 is the scan pattern M+1 used in the actual scan test, which comes after the scan section K 1204 or an expected pattern for the result pattern obtained by performing a scan capture after loading the scan pattern M+1 into the scan path.

For another example, when the target scan section K 1204 is a part of the scan pattern M as shown in FIG. 14, the input pattern K+1 1206 may include the scan pattern M+1 used in the scan test, which comes after the target scan section K 1204, and the like. Further, the input pattern K+1 1206 may include a part of the scan pattern M other than the target scan section K 1204. For example, the part of the scan pattern M other than the target scan section K 1204 is a part of a bit pattern used in the actual scan test.

For another example, the input pattern K+1 1206 is a predetermined pattern mainly including bit "0" or "1" or a predetermined pattern mainly including consecutive bits of "0" or "1", to reduce the switching activities of the scan path, or the like.

For another example, the input pattern K+1 1206 may include one or more scan sections as shown in FIG. 13.

Input patterns coming before the first scan section and after the last scan section in the scan test may include a predetermined pattern mainly including bit "0" or "1" or a predetermined pattern mainly including consecutive bits of "0" or "1", to reduce the switching activities of the scan path, or the like. Further, the input pattern coming before the first scan section may include a value on the scan path when the test target chip is in a reset state.

In some embodiments of the present invention, the input pattern K−1 1202 or the input pattern K+1 1206 may include one or more scan sections, and the shift frequencies for these sections are set not to restrict the search of the maximum shift frequency for the target scan section K 1204.

For example, let us assume that the input pattern K−1 1202 can be normally shifted in to the scan path with a shift frequency up to 30 MHz, and the target scan section K 1204 can be normally shifted in to the scan path with a shift frequency up to 50 MHz. When the input pattern K−1 1202 and the target scan section K 1204 are sequentially shifted in to the scan path with the same shift frequency while increasing the shift frequency, the maximum shift frequency that can be searched for the target scan section K 1204 is restricted to 30 MHz. That is, when the shift frequency exceeds 30 MHz, the output pattern and the expected pattern for the input pattern K−1 1202 may not match each other. Further, when the input pattern K+1 1206 can be normally shifted in to the scan path with a frequency up to 30 MHz, the maximum shift frequency that can be searched for the target scan section K 1204 is also restricted to 30 MHz.

Therefore, in order to avoid such restriction, in some embodiments of the present invention, the shift frequency for the input pattern K−1 1202 or the input pattern K+1 1206 can be set not to exceed a predetermined shift frequency (in the above example, 30 MHz).

For example, the maximum shift frequency that can be used for the target scan section K 1204 can be searched by increasing only the shift frequency for the target scan section K 1204 while fixing the shift frequency of the input pattern K−1 1202 or the input pattern K+1 1206 to a predetermined shift frequency, i.e., 30 MHz or lower in the above example).

For another example, shift frequencies for the input pattern K−1 1202, the target scan section K 1204, and the input pattern K+1 1206 are increased to a predetermined shift frequency (in the above example, 30 MHz), and when the shift frequencies reaches the predetermined shift frequency, only the shift frequency for the target scan section K 1204 is increased while keeping the shift frequencies for the other input patterns.

In other words, the shift frequency for the target scan section K 1204 and the shift frequencies of the other input patterns 1202 and 1206 can be controlled differently. When the maximum allowable shift frequencies for the input pattern K−1 1202 and the input pattern K+1 1206 are higher than the maximum shift frequency of the target scan section K 1204, the shift frequencies of the target scan section K 1204 and the other scan patterns 1202 and 1206 can be increased in the same manner. The predetermined shift frequency can be changed as appropriate, including the nominal shift frequency, a shift frequency obtained by adjusting the nominal shift frequency, a preset value of a test apparatus set by a program, a preset value set by a user, or the like, without limiting the present invention to the above-mentioned examples.

In some embodiments of the present invention, when the optimum shift frequency is already determined for the input pattern K−1 1202 or the input pattern K+1 1206 by using the method according to some embodiments of the present invention, the input pattern K−1 1202 or the input pattern K+1 1206 can be shifted in to the scan path with a shift frequency equal to or lower than the optimum shift frequency for the corresponding input pattern.

For example, when the method according to some embodiments of the present invention is sequentially applied to a plurality of scan patterns, the optimum shift frequency may be determined in advance for at least one scan section constituting the input pattern K−1 before determining the shift frequency for the target scan section K 1204. Therefore, the apparatus for minimizing scan test time employs the optimum shift frequency for each scan section of the input pattern K−1 1202 and applies the nominal shift frequency or a shift frequency obtained by adjusting the nominal shift frequency for the input pattern K+1 1206.

Thereafter, while increasing the shift frequency for the target scan section K 1204, the apparatus sequentially inputs the input patterns 1202, 1204, and 1206 to the scan path 1210 and determines whether the actual output pattern 1220 matches the expected pattern 1230. At this time, the apparatus may perform a scan capture operation for at least one input pattern among the input patterns 1202, 1204, and 1206 as appropriate.

For example, the apparatus employs the nominal shift frequency as the initial shift frequency and increases the shift frequency by a predetermined frequency increment value set in advance. That is, the apparatus loads the input pattern K−1 1202 into the scan path using a predetermined shift frequency such as the nominal shift frequency, and then shifts in the target scan section K 1204 to the scan path using a sum frequency of the initial shift frequency and the frequency increment, shifts out a test result by the input pattern K−1 1202 (i.e., output pattern K−1 1222), and compares the test result with a known expected pattern K−1 1232.

At this time, the predetermined shift frequency for the at least one scan section included in the input pattern K−1 1202 or the input pattern K−1 1202 may differ from the initial shift frequency for the target scan section K 1204. The apparatus shifts in the input pattern K+1 1206, shifts out a test result for the target scan section K 1204, and compares the output pattern K 1224 with a known expected pattern K 1234. When the target scan section K 1204 is a part of the scan section M as shown in FIG. 14, the input pattern K−1 1202, the target scan section K 1204, and the input pattern K+1 1206 and output patterns therefor are similar to the ones described above.

In some embodiments of the present invention, the above-mentioned predetermined shift frequency is set not to restrict the search of the optimum shift frequency for the target scan section K 1204. In some embodiments of the present invention, the shift frequency for the input pattern K−1 1202 or the input pattern K+1 1206 is not increased with the shift frequency for the target scan section K 1204 or is differently set from the shift frequency for the target scan section K 1204, for which a shift frequency with which the input pattern K−1 1202 or the input pattern K+1 1206 can be normally inputted to the scan path is used.

In some embodiments of the present invention, the predetermined shift frequency can be changed as appropriate, including the nominal shift frequency, a shift frequency obtained by adjusting the nominal shift frequency, a preset value of a test apparatus set by a program, a preset value set by a user, or the like, without limiting the present invention to a specific example.

When the output pattern K−1 1222 matches the expected pattern K−1 1232 and the output pattern K 1224 matches the expected pattern K 1234, the current shift frequency is a usable shift frequency for the target scan section K 1204. The apparatus increases the shift frequency for the target scan section K 1204 again by a predetermined amount (increment), performs the steps of inputting input patterns to the scan path from the input pattern K−1 1202, and compares the output pattern 1220 with the expected pattern 1230 again.

In this manner, the apparatus performs the above steps by increasing the shift frequency for the target scan section K 1204 in a repeated manner until the output pattern 1220 becomes different from the expected pattern 1230, and determines a shift frequency equal to or lower than a shift frequency before the output pattern 1220 and the expected pattern 1230 begin to differ from each other as the optimum shift frequency for the target scan section K 1204.

Although it is explained that the shift frequency is increased to search the optimum shift frequency for the target scan section in the above embodiments, in some embodiments, the shift frequency is decreased in a repeated manner from a high frequency with which the output pattern 1220 and the expected pattern 1230 of the target scan section K 1204 differ from each other until the output pattern 1220 becomes same as the expected pattern 1230. A shift frequency equal to or lower than a shift frequency at the time when the output pattern 1220 and the expected pattern 1230 become same as each other is then determined as the optimum shift frequency for the target scan section K 1204.

As an example of a frequency range for increasing or decreasing the shift frequency when comparing the output pattern with the expected pattern for the scan section or the scan pattern while increasing or decreasing the shift frequency in a repeated manner, the shift frequency can be increased or decreased in a range set in the apparatus or until the result of comparing the output pattern 1220 with the expected pattern 1230 changes from match to mismatch or from mismatch to match. In this case, the time required to search the maximum shift frequency usable for each scan section can be saved.

In some embodiments, the initial shift frequency for searching the optimum shift frequency for the target scan section K 1204 may take various values including the nominal shift frequency. Further, the shift frequency can be decreased starting from a high frequency with which the output pattern and the expected pattern differ from each other down to a shift frequency with which the output pattern and the expected pattern become same as each other, instead of being increased from a low shift frequency up to a shift frequency with which the output pattern and the expected pattern begin to differ from each other. In addition, the shift frequency for the target scan section K 1204 can be changed in various ways using different algorithms, instead of being increased or decreased in a sequential or gradual manner, to shorten the time to search the optimum shift frequency.

In some embodiments of the present invention, a binary search algorithm is employed. For example, when the test result is "PASS" with the shift frequency of 10 MHz and "FAIL" with the shift frequency of 20 MHz, the next shift frequency is set to 15 MHz that is a middle value between 10 MHz and 20 MHz. When the test result is "PASS" with the shift frequency of 15 MHz, the next shift frequency is set to a middle value between 15 MHz and 20 MHz, and when the test result is "FAIL", the next shift frequency is set to a middle value between 10 MHz and 15 MHz. The test result comes out as "PASS" when the test target chip is determined to be fault free, and the test result comes out as "FAIL" when the test target chip is determined to be faulty.

The binary search enables the time to search a shift frequency at the boundary between "PASS" and "FAIL" or a usable shift frequency with which the test result is "PASS" to be reduced compared to the linear search. For example, when the maximum shift frequency with which the test result is "PASS" is searched with N times of increasing or decreasing the shift frequency by using the linear search, the binary search allows the maximum shift frequency to be searched with about $\log_2(N)$ times of increasing or decreasing the shift frequency. The binary search is more effective than the linear search as the number of total scan sections increases or the increment or decrement of the shift frequency decreases.

In some embodiments, the optimum shift frequency or the optimum period can be searched by considering variation margin of a voltage supplied to the test target chip. For example, the optimum shift frequency or the optimum period can be searched in a shorter time within a voltage range supplied to the test target chip by using the following steps.

Step 1

The apparatus for minimizing scan test time searches the maximum shift frequency or a range of shift frequency with which the test result is "PASS" for each voltage while changing the voltage supplied to the test target chip by a predetermined amount within a predetermined voltage range. That is, the apparatus searches the maximum shift frequency or a range of shift frequency that can be used for the whole test data, instead of searching a shift frequency for each scan section obtained by dividing the test data.

Step 2

The apparatus selects a specific voltage to be supplied to the test target chip from the result of Step 1. The specific voltage is a voltage equal to or close to a voltage corresponding to the lowest maximum shift frequency among the maximum shift frequencies for each voltage searched at Step 1. Alternatively, the specific voltage can be selected by considering test setup, manufacturing process, test process, or the like.

Step 3

The apparatus supplies the specific voltage selected at Step 2 to the test target chip. The apparatus then, upon supplying the specific voltage to the test target chip, determines whether the test result is "PASS" or "FAIL" for each shift frequency for each scan section while increasing or decreasing the shift frequency for each scan section.

Step 4

The apparatus searches or determines the optimum shift frequency for each scan section using shift frequency information including mapping of the results of test "PASS" or "FAIL" for each scan section obtained at Step 3.

Step 5

The apparatus confirms whether the test result is "PASS" or "FAIL" using the optimum shift frequency for each scan section searched or determined at Step 4 while changing the voltage supplied to the test target chip.

In some embodiments of the present invention, a voltage range of changing the voltage at Step 5 is same as that used at Step 1. Further, the voltage range used at Step 5 can be a range obtained by adjusting the voltage range used at Step 1 by considering test setup, manufacturing process, test process, or the like. The apparatus confirms whether the scan test result is "PASS" or "FAIL" using the optimum shift frequency for each scan section searched or determined at Step 4 while changing the voltage supplied to the test target chip within the voltage range. When the test result is "PASS" for all scan sections within the voltage range, the shift frequency is then successfully optimized. Various references can be used to determine whether the shift frequency is normally optimized or not for each scan section, considering test setup, manufacturing process, test process, or the like. For example, the test result "FAIL" can be allowed at a specific voltage in some cases.

When searching the optimum shift frequency considering the variation margin of the voltage supplied to the test target chip, using the method including the above steps, instead of changing the voltage and the frequency for all scan sections, allows the optimum shift frequency or the optimum period to be searched or determined in a shorter time.

For example, let us assume that SN (number of scan sections)=1,000, VN (number of times of changing voltage)=10, FN (number of times of changing shift frequency)=10.

Case 1

The number of times of searching the shift frequency to determine whether the test result is "PASS" or "FAIL" while changing the voltage and the frequency for all the scan sections: SN×VN×FN=100,000.

Case 2

The number of times of searching the shift frequency to determine whether the test result is "PASS" or "FAIL" using Steps 1 to 5: (Step 1) VN×FN+(Step 3) SN×FN+(Step 5) VN=(VN+SN)×FN+VN=10,110.

The number of times of searching the shift frequency in Case 2 is about 10% of that in Case 1.

The scan section K 1204 for which the optimum shift frequency is to be searched can be a part of the scan pattern M as shown in FIG. 14. That is, the length of the target scan section K 1204 can be shorter than the scan path. In this case, the shift frequency for the part of the scan pattern M other than the target scan section K 1204 is set not to restrict the search of the optimum shift frequency for the target scan section K 1204.

For example, in the scan pattern M, the shift frequency for the part other than the target scan section K 1204 can be set not to increase or decrease with the shift frequency for the target scan section K 1204 or set differently from the shift frequency for the target scan section K 1204. In some embodiments of the present invention, the shift frequency for the part of the scan pattern M other than the target scan section K 1204 is set to a frequency with which the part of the scan pattern M other than the target scan section K 1204 can be normally inputted to the scan path.

In some embodiments, the shift frequency applied to the part of the scan pattern M other than the target scan section K 1204 is a frequency equal to or lower than the nominal shift frequency. When the optimum shift frequency is already determined for the part of the scan pattern M other than the target scan section K 1204 by using the method according to some embodiments of the present invention, a predetermined frequency such as a frequency equal to or lower than the optimum frequency can be used as the shift frequency for the part of the scan pattern M other than the target scan section K 1204. For the target scan section K 1204, the optimum frequency is searched by scaling the shift frequency as described above. The predetermined frequency is not limited to the above-mentioned example, but various frequencies can be used, such as a frequency obtained by adjusting the nominal shift frequency, a frequency set in the apparatus by a program, a frequency set by a user, or the like.

FIG. 12 shows a method of searching the optimum shift frequency for the target scan section K 1204 by using the input pattern K−1 1202 together; however, the present invention is not limited to this scheme. In some embodiments, the optimum shift frequency can also be searched or determined by comparing only the output pattern of the scan path for the target scan section K 1204 or a scan pattern including the target scan section K 1204 with the expected pattern.

(Comparison of Output Pattern for Previous Input Pattern with Corresponding Expected Pattern)

In some embodiments of the present invention, when searching or determining the optimum shift frequency for the target scan section K 1204, an output pattern for the input pattern K−1 1202 coming before the target scan section K 1204 or an output pattern of a scan pattern coming before the scan pattern including the target scan section K 1204 is also compared with the corresponding expected pattern.

For example, when the output pattern for the target scan section K 1204 matches the corresponding expected pattern and the output pattern for the input pattern K−1 1202 matches with the corresponding expected pattern, the shift frequency used to shift the target scan section K 1204 to the scan path can be determined to be a usable shift frequency for the target scan section K 1204.

In some embodiments, in the case where the target scan section K 1204 is a part of a scan pattern as shown in FIG. 14, when the output pattern K 1224 of the scan path for the scan pattern M including the target scan section K 1204 matches the expected pattern K 1234 and the output pattern K−1 1222 of the scan path for the scan pattern M−1 coming before the scan pattern M matches the expected pattern K−1 1232, the shift frequency used to shift the target scan section K 1204 to the scan path can be determined to be a usable shift frequency for the target scan section K 1204.

The reason why the output pattern K−1 1222 for the input pattern K−1 1202 coming before the target scan section K 1204 is compared with the expected pattern K−1 1232 as well as the comparison of the output pattern K 1224 for the target scan section K 1204 with the expected pattern K 1234 is because the output pattern of the scan path for the input pattern (or a part of the input pattern) coming before the target scan section K 1204 may be affected by the shift-in frequency for the target scan section K 1204. The output pattern shifted out for the input pattern can be a pattern obtained by performing a scan capture operation after inputting the input pattern (or a part of the input pattern) coming before the target scan section K 1204 to the scan path or a pattern outputted from the scan path without a scan capture operation.

Figure 16:
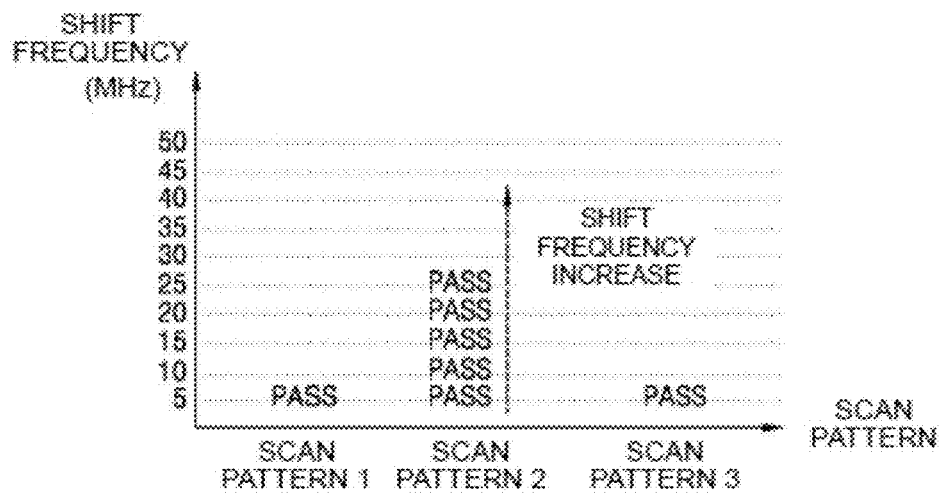
FIG. 16 is a graph showing a method of searching a usable shift frequency for a scan pattern according to some embodiments of the present invention.
Figure 17:
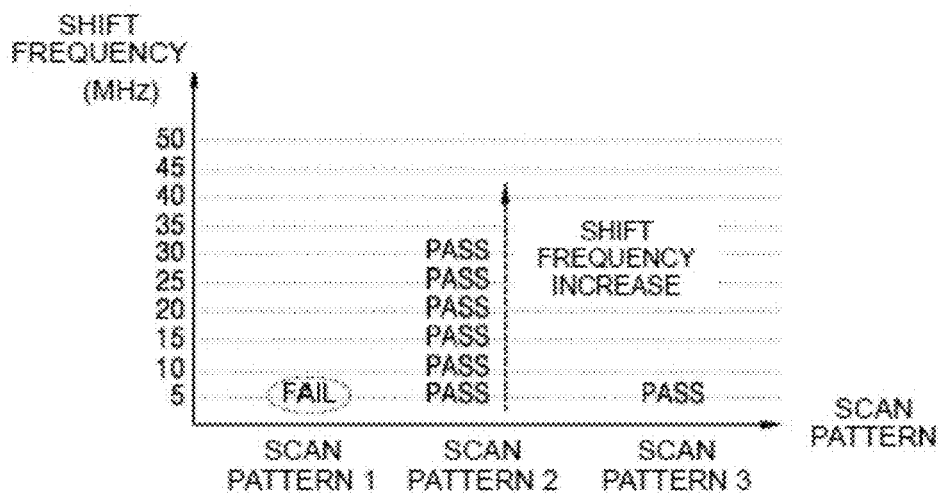
FIG. 17 is a graph showing a case where a test result of other scan pattern indicates a FAIL when scaling (increasing or decreasing) a shift frequency of a scan pattern for which an optimum shift frequency is to be searched according to some embodiments of the present invention.

FIG. 16 is a graph showing a method of searching a usable shift frequency for a scan pattern according to some embodiments of the present invention. FIG. 17 is a graph showing a case where a test result of other scan pattern indicates "FAIL" when increasing or decreasing a shift frequency of a scan pattern for which an optimum shift frequency is to be searched according to some embodiments of the present invention.

In FIG. 16, the first scan pattern, the second scan pattern, and the third scan pattern are sequentially inputted to the scan path, to search the optimum shift frequency for the second scan pattern. In some embodiments of the present invention, a shift frequency with which the first scan pattern can be normally inputted to the scan path (e.g., 5 MHz) is used for shifting the first scan pattern. In other words, a shift frequency that allows a scan test result for the first scan pattern to be "PASS" is used for shifting the first scan pattern.

When the shift frequency for the second scan pattern is sequentially increased from 5 MHz to 25 MHz with the increment of 5 MHz, the test results for the first scan pattern and the second scan pattern are all "PASS". In this case, a shift frequency equal to or lower than 25 MHz is a usable shift frequency for the second scan pattern.

As shown in FIG. 17, when the shift frequency for the second scan pattern is increased to 30 MHz, the test result for the second scan pattern is "PASS" but the test result for the first scan pattern is "FAIL". It is because the test result shifted out for the first scan pattern is affected by the shift frequency for the second scan pattern. Therefore, in some embodiments of the present invention, when both the test result for the second scan pattern for which the optimum shift frequency is to be searched and the test result for the first scan pattern coming before the second scan pattern are "PASS", the shift frequency is determined to be a usable shift frequency for the second scan pattern.

The target scan section for which the optimum shift frequency is to be searched can be a part of a scan pattern. In this case, as described above, when both the test result for the second scan pattern including the target scan section and the test result for the first scan pattern are "PASS", the shift frequency is determined to be a usable shift frequency for the target scan section. For a bit pattern other than the target scan section, a shift frequency is used, which allows the bit pattern to be normally inputted to the scan path.

For the third scan pattern, a shift frequency is used, which allows the third scan pattern to be normally shifted in to the scan path and the test result for the second scan pattern to be normally shifted out from the scan path.

When sequentially inputting the first scan section and the second scan section adjacent to each other to a scan path of a chip to search the optimum shift frequency for the scan section or to reduce the mass production test time for the chip, a scan test can be performed by setting the shift frequency for the first scan section and the shift frequency for the second scan section differently from each other. For example, the shift frequencies respectively used for the two scan sections can be shift frequencies respectively equal to or lower than shift frequencies with which the result of the scan test using the two scan sections is "PASS".

For the first scan section and the second scan section adjacent to each other, a scan test can be performed by setting the shift frequency for the second scan section higher or lower than the shift frequency for the first scan section. Shift frequencies respectively equal to or lower than shift frequencies for two adjacent scan sections with which a test result for a fault-free chip is "PASS" are used to reduce the mass production test time for the chip. That is, the influence of the adjacent scan sections on each other at the time of performing a scan test should be taken into consideration.

For example, when the first scan section and the second scan section are scan patterns adjacent to each other, the effect of the shift frequency for the second scan section consecutively inputted should be taken into consideration when the scan capture result for the first scan section is shifted out. It is because, for example, when the scan capture result pattern is shifted out, a bit value of the result pattern may be changed depending on the shift frequency.

In some embodiments, when the first scan section and the second scan section adjacent to each other are included in a single scan pattern, the effect of the shift frequency for the second scan section consecutively inputted should be taken into consideration when the first scan section is shifted in. It is because, for example, a bit value of the first scan section shifted on the scan path can be changed by the shift frequency for the second scan section.

In some embodiments, when a scan capture result of the first scan pattern shifted in before the second scan pattern including the first scan section and the second scan section is shifted out, the effect of the first scan section and the second scan section included in the second scan pattern should be considered. Without such consideration, a scan test result for a fault-free chip may become "FAIL" when performing a mass production test.

(Consideration of Output Result for Input Pattern Coming Before or after Target Scan Section for which Optimum Shift Frequency is to be Searched)

When searching or determining the optimum shift frequency for the target scan section, not only the output pattern for the target scan section but also an output pattern for an input pattern coming before or after the target scan section or an output pattern for a scan pattern coming before or after a scan pattern including the target scan section is compared with the corresponding expected pattern to determine whether a test result for a fault-free IC chip actually turns out to be normal.

In some embodiments of the present invention, the above-mentioned process is repeated while increasing or decreasing the shift frequency, to search or determine the optimum shift frequency for the target scan section. A shift frequency that allows the test result to be normal is a usable shift frequency for the target scan section. The output pattern of the scan path for the target scan section is a pattern obtained by performing a scan capture operation after loading the target scan section into the scan path or a pattern obtained by outputting the target scan section or the scan pattern including the target scan section without performing the scan capture operation.

(Consideration of Output Pattern for Input Pattern Inputted after Target Scan Section for which the Optimum Shift Frequency is to be Searched)

An output pattern of the scan path for an input pattern coming after the target scan section or a scan pattern coming after the scan pattern including the target scan section can be further compared with the corresponding expected pattern to search or determined the optimum shift frequency for the target scan section.

For example, the output pattern for the target scan section shifted out from the scan path to search or determine the optimum shift frequency for the target scan section may have an influence on a bit value of the input pattern shifted in following the target scan section. For another example, the output pattern for the scan pattern including the target scan section shifted out from the scan path to search or determine the optimum shift frequency for the target scan section may have an influence on a bit value of the scan pattern shifted in following the scan pattern including the target scan section.

(Case where Following Input Pattern May have Influence on the Target Scan Section for which the Optimum Shift Frequency is to be Searched)

When the output pattern of the scan path for the scan pattern including the target scan section is shifted out from the scan path, the input pattern shifted following the scan pattern including the target scan section may have influence on a bit value of the output pattern for the target scan section.

(Consideration of Shift Frequency for Following Input Pattern)

In order to reduce or remove an influence of an input pattern (or scan pattern), a shift frequency that allows the input pattern (or scan pattern) shifted in following the target scan section to be normally shifted to the scan path can be used as the shift frequency for the input pattern (or scan pattern) shifted following the target scan section or the scan pattern including the target scan section when the output pattern of the scan path for the target scan section or the scan pattern including the target scan section is shifted out.

(Consideration of Shift Frequency for Input Pattern Coming Before or after Target Scan Section)

In order to search or determine the optimum shift frequency for the target scan section, a shift frequency same as the shift frequency for the target scan section or a shift frequency different from the shift frequency for the target scan section can be used as the shift frequency for the input pattern (or a part of the input pattern) coming before or after the target scan section. In some embodiments, a shift frequency that allows the input pattern coming before or after the target scan section to be normally shifted to the scan path is used as the shift frequency for the input pattern.

This is because, as described above, the input pattern coming before or after the target scan section for which the maximum usable shift frequency is to be searched can restrict the maximum usable shift frequency for the target scan section. For example, the maximum usable shift frequency for the input pattern coming before or after the target scan section may be lower than the maximum usable shift frequency for the target scan section.

Figure 18:
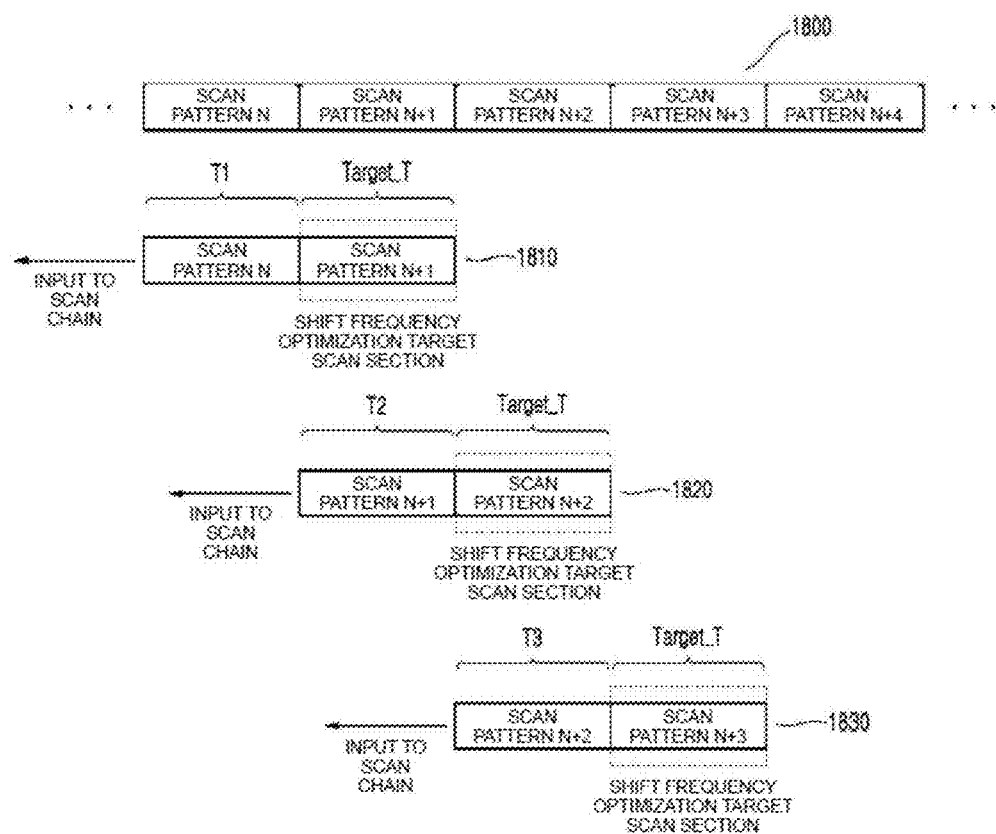
FIGS. 18 to 20 are schematic diagrams for illustrating configuration of scan pattern, scan section, and information on shift frequency, required to search an optimum shift frequency according to some embodiments of the present invention.
Figure 19:
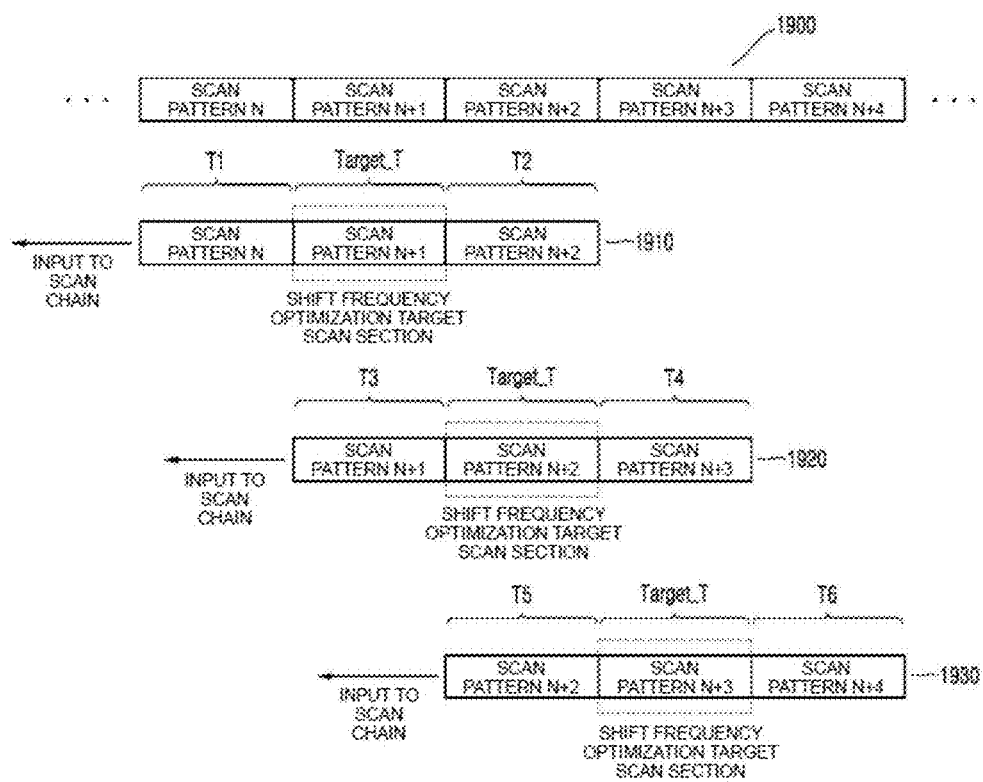
Figure 20:
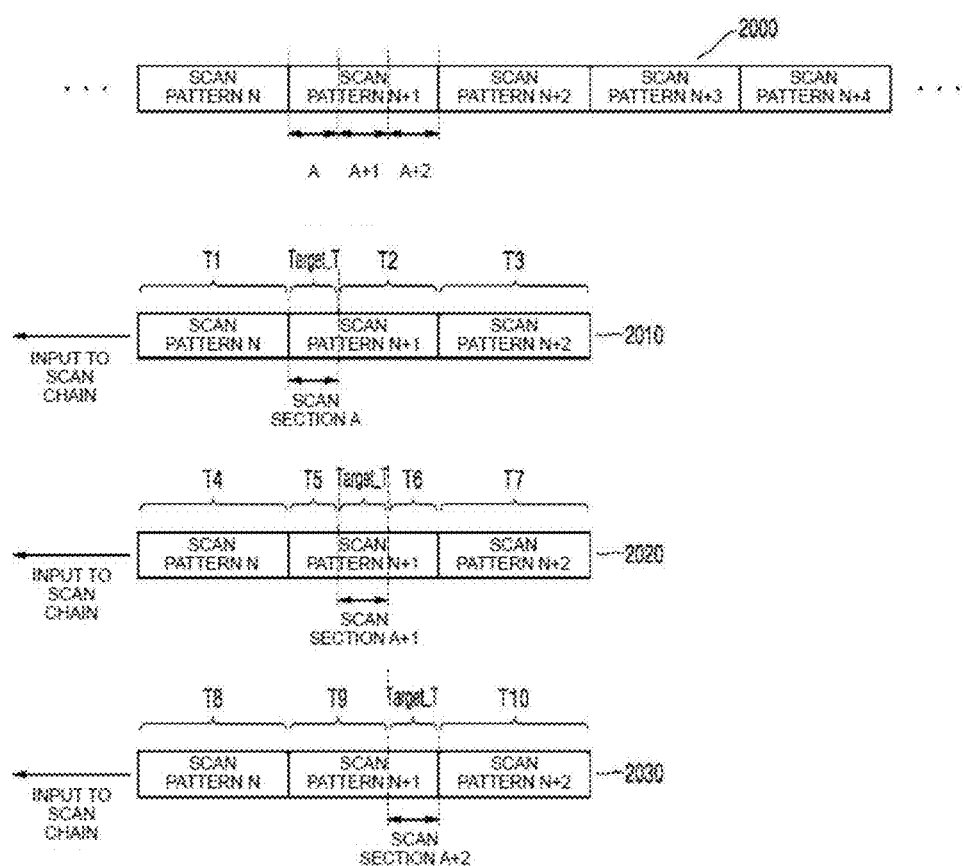

FIGS. 18 to 20 are schematic diagrams for illustrating configuration of scan pattern, scan section, and shift frequency information, required to search the optimum shift frequency according to some embodiments of the present invention.

FIG. 18 shows a case where a scan section for which a usable shift frequency or the optimum shift frequency with which the chip can be tested normally is to be searched is a scan pattern. A scan pattern N+1, a scan pattern N+2, and a scan pattern N+3 of test data 1800 are scan sections for which usable shift frequencies or optimum shift frequencies are to be searched, respectively. FIG. 18 shows configuration of scan pattern, scan section, and shift frequency information required to search or determine the usable shift frequency or the optimum shift frequency for each of the scan pattern N+1, the scan pattern N+2, and the scan pattern N+3.

In FIG. 18, T1, T2, T3, and Target_T indicate information related to scan shift frequency or period, which are referred to as "timing identifiers", "timing set", or "timing information" as appropriate.

In some embodiments of the present invention, the timing information is information related to the shift frequency or the period, which may include or represent the shift frequency or the period. The timing information can be used to identify or control a scan pattern or a scan section. For example, a test apparatus can increase or decrease a shift frequency or a period for a scan pattern or a scan section identified by the timing information.

In FIG. 18, T1 is information related to the shift frequency or the period for the scan pattern N, which can be referred to as "timing information of the scan pattern N". In FIG. 18, Target_T for the scan pattern N+1 indicate information related to the shift frequency or the period of the shift frequency for the scan pattern N+1 that is a scan section for which the usable shift frequency or the optimum shift frequency is to be searched, which can be referred to as "timing information of the scan pattern N+1. That is, in FIG. 18, T1, T2, and T3 indicate timing information for a scan pattern coming before the scan section for which the optimum shift frequency is to be searched, and Target_T indicates timing information for the scan section for which the shift frequency is to be optimized.

In FIG. 18, at least two of Target_T, T1, T2, and T3 can use the same shift frequency or period or shift frequencies different from each other.

In FIG. 18, information on the shift frequency or the period of T1, T2, or T3 contains a shift frequency or a period that allows a scan pattern or a scan section corresponding to T1, T2, or T3 to be normally inputted to the scan path. The shift frequency or the period corresponding to Target_T can be increased or decreased to search an optimum value. Without being limited to the example shown in FIG. 18, one or more shift frequencies, periods, or pieces of timing information can be allocated to or used in a single scan pattern in various ways.

In some embodiments of the present invention, search data 1810, 1820, and 1830 used to search the usable shift frequency or the optimum shift frequency for a scan section may include at least two scan patterns as shown in FIG. 18.

The search data 1810 for searching the usable shift frequency or the optimum shift frequency for the scan pattern N+1 includes at least the scan pattern N+1 and a scan pattern N coming before the scan pattern N+1. For example, the scan section or the scan pattern included in the search data 1810, 1820, and 1830 can be repeatedly inputted to the scan path to search the usable shift frequency or the optimum shift frequency for a specific scan section.

It is determined whether the test is "PASS" or "FAIL" for each scan pattern based on scan test output patterns of a chip using two or more scan patterns included in the search data 1810, 1820, and 1830. For example, the output patterns can be compared with corresponding expected patterns, and the expected patterns can be managed by being included in the search data 1810, 1820, and 1830. In other words, the search data 1810, 1820, and 1830 may include expected patterns corresponding to the output patterns for the scan pattern including the target scan section and the scan pattern coming before the scan pattern including the target scan section. The usable shift frequency or the optimum shift frequency for the scan section is then searched based on the test result. For example, the usable shift frequency or the optimum shift frequency for the scan pattern N+1 corresponding to Target_T can be searched.

In order to search the usable shift frequency or the optimum shift frequency for the scan pattern N+1, a scan test is performed by using the scan pattern N+1 and the scan pattern N coming before the scan pattern N+1. In this case, it is determined whether the test result is "PASS" or "FAIL" based on scan test output patterns of the chip for the two scan patterns N+1 and N. Thereafter, the usable shift frequency or the optimum shift frequency can be searched for the scan pattern N+1. A shift frequency that allows the scan test results for both the scan pattern N+1 and the scan pattern N coming before the scan pattern N+1 to be normal is a usable shift frequency for the scan pattern N+1.

In FIG. 19, the scan section for which the usable shift frequency or the optimum shift frequency is to be searched is a scan pattern. In order to search the optimum shift frequency for the scan section, at least three scan patterns are used including the target scan section and scan patterns coming before and after the target scan section.

For example, search data 1910, 1920, and 1930 used to search the usable shift frequency or the optimum shift frequency for the scan section include at least three scan patterns as shown in FIG. 19. The scan pattern or the scan section included in the search data 1910, 1920, and 1930 used to search the usable shift frequency or the optimum shift frequency can be repeatedly inputted to the scan path. It is determined whether the test of an IC chip is "PASS" or "FAIL" based on a result of comparing output patterns for the scan patterns included in the search data 1910, 1920, and 1930 with corresponding expected patterns. The usable shift frequency can be searched for the scan section for which the optimum shift frequency is to be searched, based on the test result.

In order to search the usable shift frequency or the optimum shift frequency for the scan pattern N+1 in the search data 1910, a scan test is performed by using the scan pattern N+1 and the scan pattern N coming before the scan pattern N+1. A shift frequency that allows the test result to be normal is the usable shift frequency for the scan pattern N+1. In this case, by using a shift frequency with which the scan pattern N+2 coming after the scan pattern N+1 can be normally shifted to the scan path for the scan pattern N+2, a chip test by the scan pattern N+2 can be omitted. Alternatively, a shift frequency that is also determined to allow the chip test result by the scan pattern N+2 to be normal can be set as the usable shift frequency for the scan pattern N+2.

In FIG. 19, at least two of timing information Target_T, T1, T2, T3, T4, T5, and T6 can use the same shift frequency or period or shift frequencies or periods different from each other. The period of the shift frequency is a time interval of a shift operation in which the scan pattern is shifted with the shift frequency, which is the reciprocal of the shift frequency. In some embodiments of the present invention, information on the shift frequency or the period of timing information T1, T2, T3, T4, T5, or T6 contains a shift frequency or a period that allows a scan pattern or a scan section corresponding to T1, T2, T3, T4, T5, or T6 to be normally inputted to the scan path. The shift frequency or the period corresponding to Target_T can be increased or decreased to search an optimum value.

Without being limited to the example shown in FIG. 19, one or more shift frequencies, periods, or pieces of timing information can be allocated to or used in a single scan pattern in various ways.

FIG. 20 shows a case where the scan section for which the usable shift frequency or the optimum shift frequency is to be searched is a part of a scan pattern. That is, scan sections A, A+1, and A+2 included in a scan pattern N+1 are scan sections for which respective optimum shift frequencies are to be searched.

T1, T2, T3, T4, T5, T6, T7, T8, T9, and T10 are pieces of timing information for scan patterns or scan sections coming before or after the scan section for which the usable shift frequency or the optimum shift frequency is to be searched. Target_T is timing information for the scan section for which the shift frequency is to be optimized.

At least two of Target_T, T1, T2, T3, T4, T5, T6, T7, T8, T9, and T10 can use the same shift frequency or period or shift frequencies or periods different from each other.

In some embodiments of the present invention, information on the shift frequency or the period of timing information T1, T2, T3, T4, T5, T6, T7, T8, T9, or T10 contains a shift frequency or a period that allows a scan pattern or a scan section corresponding to T1, T2, T3, T4, T5, T6, T7, T8, T9, or T10 to be normally inputted to the scan path. The shift frequency or the period corresponding to Target_T can be increased or decreased to search a value that allows a scan test to be normal or an optimum value. Without being limited to the example shown in FIG. 20, one or more shift frequencies, periods, or pieces of timing information can be allocated to or used in a single scan pattern in various ways.

Examples of search data 2010, 2020, and 2030 for searching the optimum shift frequency for a scan section that is shorter than a scan pattern or a scan path are shown in FIG. 20. The scan pattern included in the search data 2010, 2020, and 2030 may include at least two scan patterns as shown in FIG. 18 or at least three scan patterns as shown in FIG. 19. When each of the search data 2010, 2020, and 2030 includes three scan patterns, output patterns of the scan path for at least three scan patterns can be compared with corresponding expected patterns.

As explained referring to FIGS. 18 to 20, the scan section or the scan pattern included in the search data can be repeatedly inputted to the scan path to search the usable shift frequency or the optimum shift frequency for a scan section.

Without being limited to the examples shown in FIGS. 18 to 20, pieces of timing information for at least two scan patterns or scan sections included in the search data can be same as each other or different from each other.

The search data used to search the optimum shift frequency for a scan section can include at least two scan patterns as shown in FIG. 18, 19, or 20. In some embodiments of the present invention, the search data may include information related to the timing information shown in FIG. 18, 19, or 20. The timing information can be used to control the timing for inputting the scan pattern or the scan section to the scan path by the test apparatus. The timing corresponds to the shift frequency or the period. For example, as shown in FIGS. 18 to 20, the search data used to search the optimum shift frequency for scan sections adjacent to each other may include scan patterns that are overlapped with each other.

In some embodiments of the present invention, the steps of generating the search data used to search the optimum shift frequency for a number of scan sections are performed in a batch process by using a computer program or software.

For example, operations of configuring or dividing timing information or data related to scan patterns, scan sections, and shift frequencies used to search the optimum shift frequency for each scan section as shown in FIGS. 18 to 20 can be performed in a batch process by using a computer program or software. Further, information including the number of scan sections for which the shift frequency is to be optimized, the bit length of the scan section, the position of the scan section, and the like can be used in the operations.

The search data used to search the usable shift frequency or the optimum shift frequency for a specific scan section may further include expected patterns. In addition, the search data used to search the usable shift frequency or the optimum shift frequency for a specific scan section may further include primary input test data of the IC chip, which are used together when performing a scan test, or primary output expected data.

Figure 21:
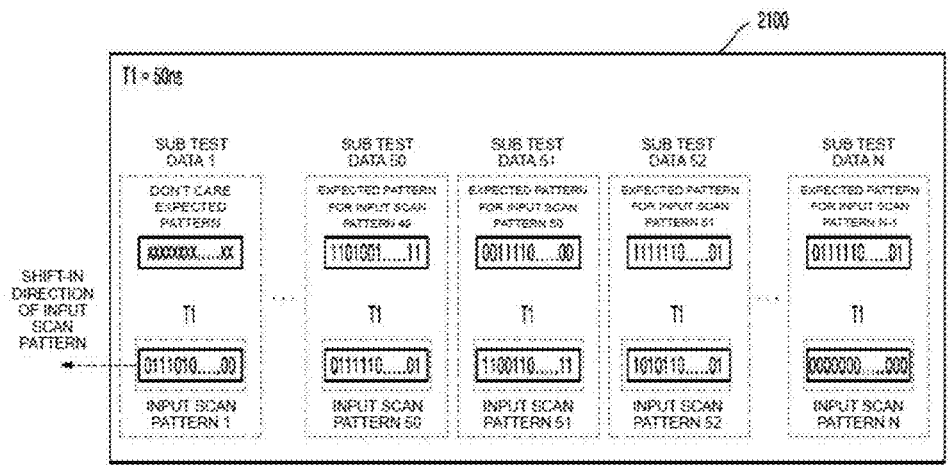
FIGS. 21 to 28 are schematic diagrams for illustrating various methods of generating search data according to some embodiments of the present invention.
Figure 22:
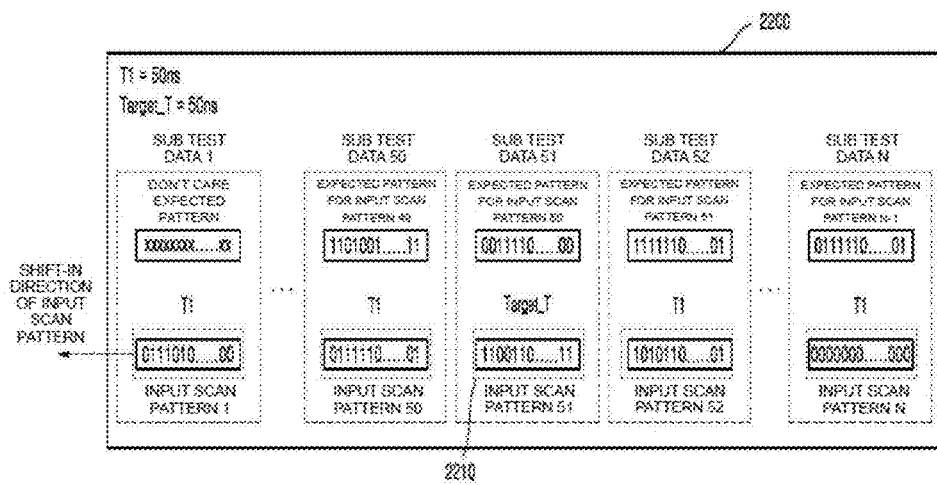
Figure 23:
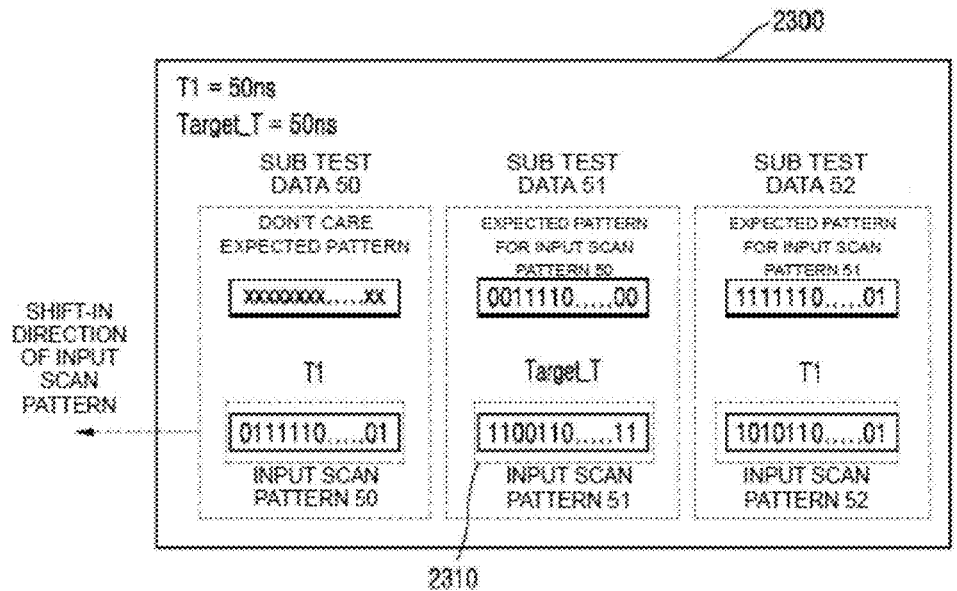
Figure 24:
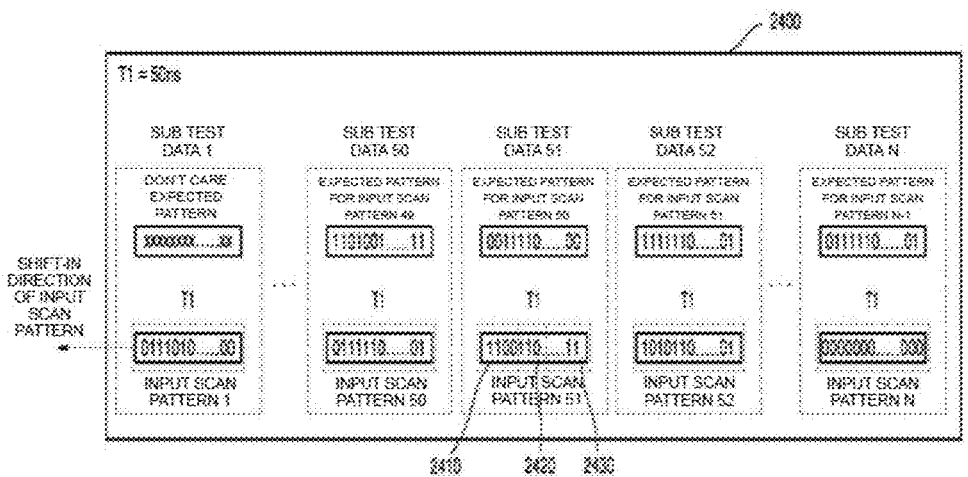
Figure 25:
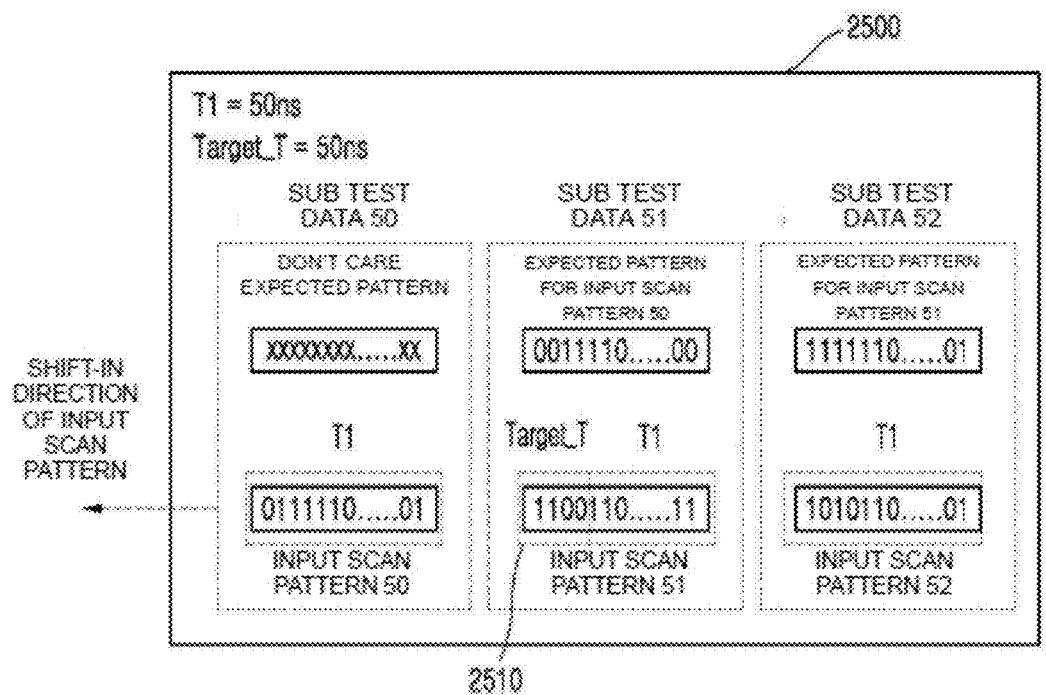
Figure 26:
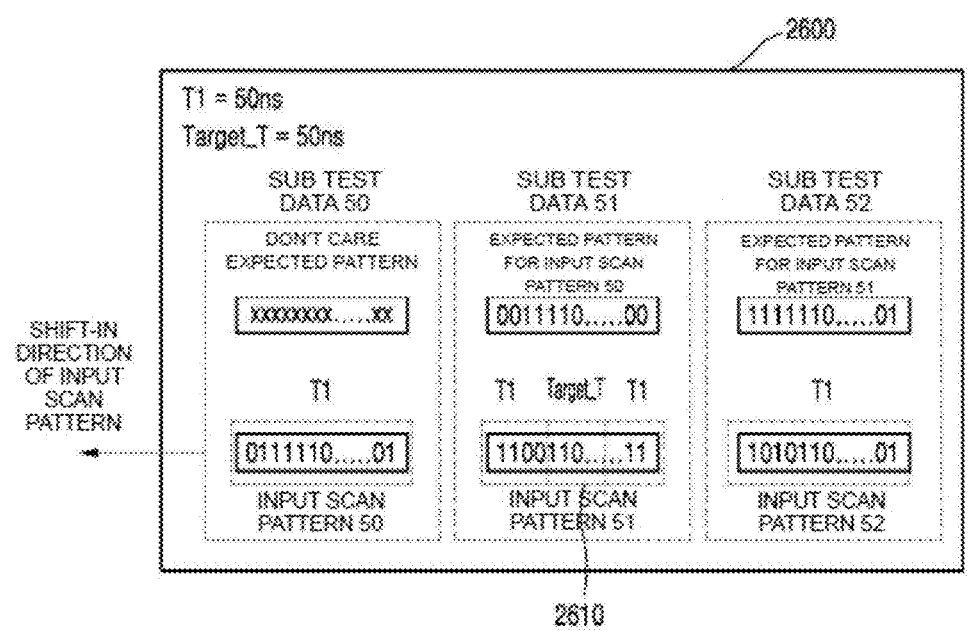

FIGS. 21 to 28 are schematic diagrams for illustrating various methods of generating the search data according to some embodiments of the present invention. FIGS. 21 to 23 show methods of generating the search data when a scan section is a scan pattern, and FIGS. 24 to 26 show methods of generating the search data when a scan section is a part of a scan pattern.

FIG. 21 is a schematic diagram illustrating an example of test data including a plurality of scan patterns.

As shown in FIG. 21, a single shift frequency (e.g., T1=50 ns (i.e., 20 MHz)) is allocated to all scan patterns included in test data 2100. Therefore, all the scan patterns are shifted in and out with respect to the scan path of the IC chip with the same shift frequency.

The test data 2100 may include a plurality of sub test data each including an input scan pattern and an expected pattern in pair. For example, the 51st input scan pattern forms a pair with an expected pattern for the 50th input scan pattern. The test data can be created in a format of Standard Test Interface Language (STIL), Wavefrom Generation Language (WGL), or the like.

The don't care expected pattern for the first sub test data means that the output pattern shifted out from the scan path when the first input scan pattern is shifted in to the scan path is not compared with a specific expected pattern. An output pattern shifted out from the scan path when the first input scan pattern is inputted to the scan path after the flip-flops are set or reset to a specific value may not be a don't care expected pattern.

FIG. 22 is a schematic diagram illustrating an example of a method of generating the search data for searching the optimum shift frequency for each scan section when a scan section is a scan pattern.

As shown in FIG. 22, the timing information Target_T is given to a target scan section 2210 for which the optimum shift frequency is to be searched in the original test data 2100 shown in FIG. 21. The timing information Target_T is used to identify the target scan section 2210 or to control the shift frequency for the target scan section. For example, Target_T can be increased or decreased from the initial value of 50 ns by the test apparatus.

When the target scan section 2210 is an input scan pattern 51, search data 2200 provided with Target_T are repeatedly inputted to the chip to search the usable shift frequency or the optimum shift frequency for the input scan pattern 51. The period of shift frequency for the target scan section 2210 corresponding to Target_T is changed for every repeated input. At this time, periods of shift frequency for the rest of input scan patterns except for the target scan section 2210 are a period that allows the corresponding scan patterns to be normally inputted to the scan path (e.g., T1=50 ns).

For example, the search data 2200 are repeatedly inputted to the chip while decreasing the period corresponding to Target_T until the maximum usable shift frequency for the target scan section 2210 is searched. The output pattern obtained by using the input scan pattern 50 is compared with the expected pattern for the input scan pattern 50 included in the sub test data 51. The output pattern obtained by using the input scan pattern 51 is compared with the expected pattern for the input scan pattern 51 included in the sub test data 52. A shift frequency that allows the test results for both the input scan pattern 50 and the input scan pattern 51 to be normal is a usable shift frequency for the target scan section 2210.

As the size of the search data 2200 used to search the usable shift frequency or the optimum shift frequency for the target scan section 2210 decreases, the time required to search the optimum shift frequency is reduced.

FIG. 23 is a schematic diagram for illustrating an example of a method of generating the search data for reducing the time required to search the optimum shift frequency.

As shown in FIG. 23, search data 2300 for searching the usable shift frequency or the optimum shift frequency for the input scan pattern 51 as a target scan section 2310 include the target scan section 2310 and input scan patterns 50 and 52 coming before and after the target scan section 2310. The expected pattern included in the sub test data 50 coming before the target scan section 2310 is a don't care expected pattern. That is, an output pattern shifted out from the scan path when the input pattern 50 is shifted in to the scan path is not compared with a specific expected pattern.

The search data 2300 are repeatedly inputted to the scan path of the chip while changing the period of shift frequency corresponding to Target_T until the maximum usable shift frequency is searched for the target scan section 2310. The test result obtained by using the input scan pattern 50 is compared with the expected pattern for the input scan pattern 50 included in the sub test data 51. In the same manner, the test result obtained by using the input scan pattern 51 is compared with the expected pattern for the input scan pattern 51 included in the sub test data 52. A shift frequency that allows the test results for both the input scan pattern 50 and the input scan pattern 51 to be normal is a usable shift frequency for the target scan section 2310.

The search data 2300 are not limited to the example shown in FIG. 23, but can further include at least two input scan patterns coming before or after the target scan section.

FIG. 24 is a schematic diagram for illustrating an example of test data including a plurality of scan patterns, and FIGS. 25 to 28 are schematic diagrams for illustrating examples of a method of generating search data for searching the optimum shift frequency when the target scan section is a part of a scan pattern.

In FIG. 24, a single shift frequency (e.g., T1=50 ns (=20 MHz)) is allocated to all scan patterns included in test data 2400. Therefore, all the scan patterns are shifted in or out with respect to the scan path of the IC chip with the same shift frequency.

The test data 2400 may include a plurality of sub test data each including an input scan pattern and an expected pattern in pair. For example, the 51st input scan pattern forms a pair with the expected pattern for the 50th input scan pattern.

The test data 2400 can be divided into a plurality of scan sections. In the present embodiment, for convenience in explanation, a method of generating search data for searching the optimum shift frequency for each scan section when the input scan section 51 is divided into three scan sections 2410, 2420, and 2430 is described with reference to FIGS. 25 to 28.

Figure 27:
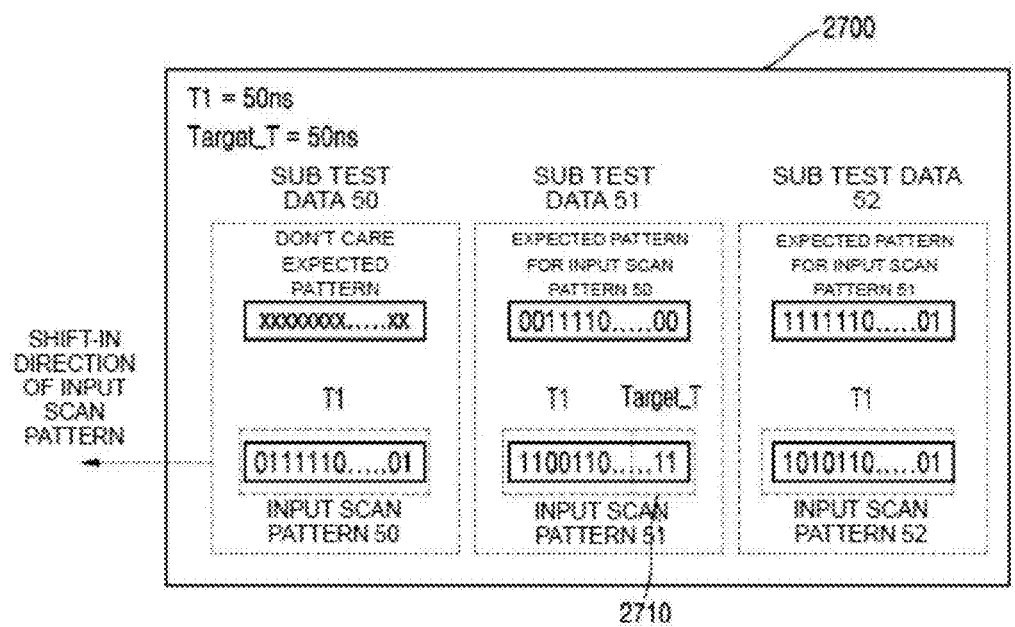

As shown in FIGS. 25 to 27, search data 2500, 2600, and 2700 include the input scan pattern 51 including target scan sections 2510, 2610, and 2710, respectively, and input scan patterns 50 and 52 coming before and after the input scan pattern 51. An expected pattern included in sub test data 50 is a don't care expected pattern. That is, an output pattern shifted out from the scan path when the input scan pattern 50 is shifted in to the scan path is not compared with a specific expected pattern. The timing information Target_T is used to identify the target scan section 2510, 2610, or 2710 or to control the shift frequency for the target scan section. For example, Target_T can be increased or decreased from the initial value of 50 ns by the test apparatus.

As shown in FIG. 25, the search data 2500 applies the timing information Target_T to the first target scan section 2510 that is a part of the input scan pattern 51, and maintains the timing information T1 for the rest of the input scan pattern 51. The search data 2500 are repeatedly inputted to the scan path of the chip while changing the period of shift frequency corresponding to Target_T until the maximum usable shift frequency is searched for the first target scan section 2510. The output pattern obtained by using the input scan pattern 50 is compared with the expected pattern for the input scan pattern 50 included in the sub test data 51. The output pattern obtained by using the input scan pattern 51 is compared with the expected pattern for the input scan pattern 51 included in the sub test data 52. A shift frequency that allows the test results for both the input scan pattern 50 and the input scan pattern 51 to be normal is a usable shift frequency for the first target scan section 2510.

When searching the optimum shift frequencies for the second target scan section 2610 and the third target scan section 2710, respective search data 2600 and 2700 shown in FIGS. 26 and 27 are repeatedly inputted to the scan path of the chip to perform the scan test in the same manner as that shown in FIG. 25.

Figure 28:
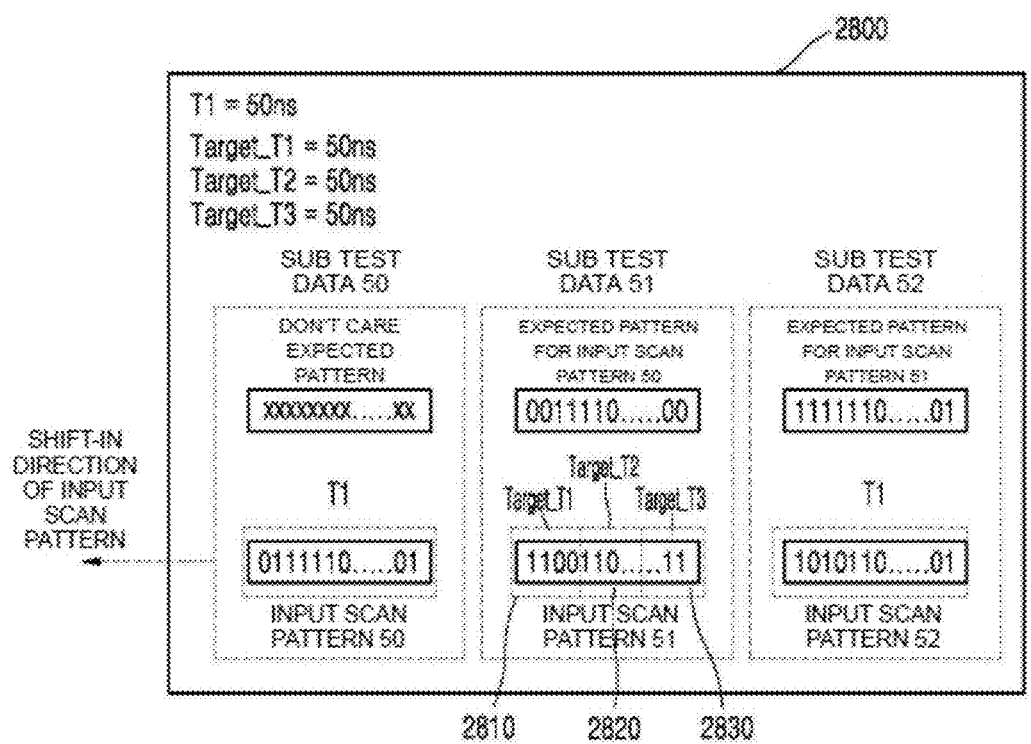

Instead of generating the search data 2500, 2600, and 2700 for each scan section as shown in FIGS. 25 to 27, in order to search the optimum shift frequency for each scan section when a scan pattern is divided into a plurality of scan sections, a single set of search data 2800 can be generated as shown in FIG. 28.

As shown in FIG. 28, the search data 2800 include timing information Target_T1, Target_T2, and Target_T3 for first to third target scan sections 2810, 2820, and 2830, respectively. In other words, as many timing identifiers as the number of target scan sections for which usable shift frequencies or optimum shift frequencies are to be searched simultaneously are provided, and each of the timing identifiers is allocated to the corresponding target scan section 2810, 2820, or 2830. For example, a shift frequency corresponding to Target_T1 is increased or decreased when searching the usable shift frequency or the optimum shift frequency for the first target scan section 2810.

Generation of the single set of search data 2800 for a plurality of target scan sections shown in FIG. 28 allows storage capacity of a storage medium to be saved compared to the case of generating the search data for each target scan section. However, there may be a restriction in the number of timing identifiers or the number of shift frequencies that can be used in the test apparatus.

For example, when the number of usable timing identifiers is limited to three in the test apparatus and a scan pattern is divided into four target scan sections, the optimum shift frequency can be searched by generating the search data (such as search data 2500, 2600, and 2700) for each target scan section as shown in FIGS. 25 to 27.

The search data 2500, 2600, 2700, and 2800 are not limited to the examples shown in FIGS. 25 to 28, but can further include at least two input scan patterns including the input scan pattern including the target scan section and an input scan pattern coming before or after the input scan pattern including the target scan section.

In general, as the size of the search data used to search the usable shift frequency or the optimum shift frequency for a scan pattern or a scan section decreases, the time required to search the shift frequency is reduced. For example, as the number of scan patterns or scan sections decreases, the time required to search the usable shift frequency or the optimum shift frequency is reduced.

In order to calculate the number of shift clock cycles required to search the optimum shift frequency for all scan patterns included in test data, parameters of SN, BL, and FN are defined as follows.

SN: the number of scan patterns constituting the test data.
BL: the length of a single scan pattern. One shift clock cycle is used to shift 1 bit.
FN: the number of times of increasing the shift frequency to search the optimum shift frequency per scan pattern. The shift frequency is sequentially increased from a predetermined low frequency to a predetermined high frequency with a predetermined increment.

In some embodiments of the present invention, it is assumed that SN=5,000, BL=1,000, and FN=20. The number of shift clock cycles required to search the optimum shift frequency for all scan patterns included in test data is calculated as follows in methods 1 and 2.

Method 1
The number of total clock cycles required to search the optimum shift frequency for each scan pattern by using the search data including the whole input scan pattern as shown in FIG. 22 is:
The number of total clock cycles=SN×SN×BL×FN=500,000,000,000

Method 2
The number of total clock cycles required to search the optimum shift frequency for each scan pattern by using the search data including three input scan pattern as shown in FIG. 23 is as follows (at this time, when searching the optimum shift frequency for the first scan pattern, search data including the first and second input scan patterns are used, and when searching the optimum shift frequency for the last input scan pattern, search data including the last input scan pattern and the input scan pattern coming before the last input scan pattern are used).
The number of total clock cycles=(3×(SN−2)×BL×FN)+(2×2×BL×FN)=299,960,000

In the above equation, (3×(SN−2)×BL×FN) is the number of total shift clock cycles used to search the optimum shift frequency for all the scan patterns except for two scan patterns (i.e., the first input scan pattern and the last input scan pattern) of the scan pattern set.

In the above equation, (2×2×BL×FN) is the number of total shift clock cycles used to search the optimum shift frequency for the first input scan pattern and the last input scan pattern.

It is found that using the method 2 provides 99.94% reduction in the number of total shift clock cycles compared to the method 1.

Therefore, in some embodiments, the search data used to search the usable shift frequency or the optimum shift frequency for the scan pattern or the scan section include as small number of scan patterns or scan sections as possible.

In some embodiments of the present invention, as instantiated with reference to FIG. 18, the search data can include at least two scan patterns including a scan pattern including the target scan section for which the shift frequency of the optimum shift frequency is to be searched and a scan pattern coming before or after the target scan section.

Further, in the same manner as the examples shown in FIGS. 19 to 28, the search data can include at least three scan patterns including a scan pattern including the target scan section for which the shift frequency or the optimum shift frequency is to be searched and scan patterns coming before and after the target scan section.

In some embodiments of the present invention, the search data used to search the usable shift frequency or the optimum shift frequency for a scan section can be stored in a computer-readable recording medium in the form of data codes, file, or the like.

Further, the steps of generating the search data used to search the usable shift frequency or the optimum shift frequency for a scan section can be executed in the same apparatus or in a separate apparatus according to the embodiments, such as in a test apparatus or in an apparatus such as a computer.

Figure 29:
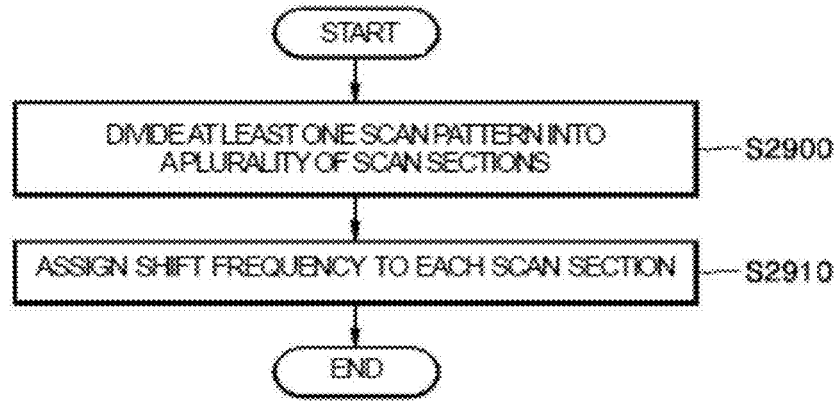
FIG. 29 is a flowchart of a process to minimize the chip test time according to some embodiments of the present invention.

FIG. 29 is a flowchart of a process to minimize the chip test time according to some embodiments of the present invention.

As shown in FIG. 29, the apparatus for minimizing scan test time divides a bit pattern or at least one scan pattern into at least two scan sections (Step S2900). Various methods can be used to divide the bit pattern or the scan pattern set of the test data into scan sections, examples of which are shown in FIGS. 5 to 10.

In the step of dividing the bit pattern or the scan pattern into scan sections, an operation of creating search data for thousands of scan sections obtained by dividing scan patterns or scan groups to test an IC chip or creating a file containing such data can be performed in a batch process by using a computer program or software.

For example, the computer program or the software divides the test data into scan sections or scan section groups by using information related to the division of scan sections, such as the number of scan sections to optimize the shift frequency, the bit length of each scan section, the position of each scan section, and the like, and creates search data for the divided scan sections or the scan section groups or creates a file containing the search data in a batch process.

The information related to the division of scan sections can be obtained via a user interface device such as keyboard, mouse, voice recognizing device, and the like, information data codes or file containing the information, or a data communication network, which can be used by the computer program or the software.

As an example of dividing the scan pattern, the methods shown in FIGS. 5 to 10 can be used. The apparatus for minimizing scan test time allocates a shift frequency to each of the scan sections (Step S2910). The shift frequency allocated to each scan section here is equal to or lower than a shift frequency before the output pattern of the scan path begins to differ from the expected pattern. Dividing the scan pattern into scan sections (Step S2900) and allocating the shift frequency to each scan section (Step S2910) can be performed in the same device or in different devices according to the embodiment, for example, in the test apparatus or a device such as a computer.

That is, the apparatus for minimizing scan test time can search a shift frequency at a time right before the output pattern and the expected pattern become different from each other while increasing the shift frequency, as the maximum shift frequency that can be allocated to the corresponding scan section. Alternatively, the apparatus for minimizing scan test time can search a shift frequency at a time when the output pattern and the expected pattern, which are different from each other, become same as each other while decreasing the shift frequency, as the maximum shift frequency that can be allocated to the corresponding scan section. For example, the apparatus for minimizing scan test time searches a shift frequency that allows the test result to be normal by approaching the boundary between "PASS" and "FAIL" of the scan test while increasing or decreasing the shift frequency of the scan section, and determine the shift frequency searched in this manner as the maximum shift frequency that can be allocated to the corresponding scan section.

Figure 30:
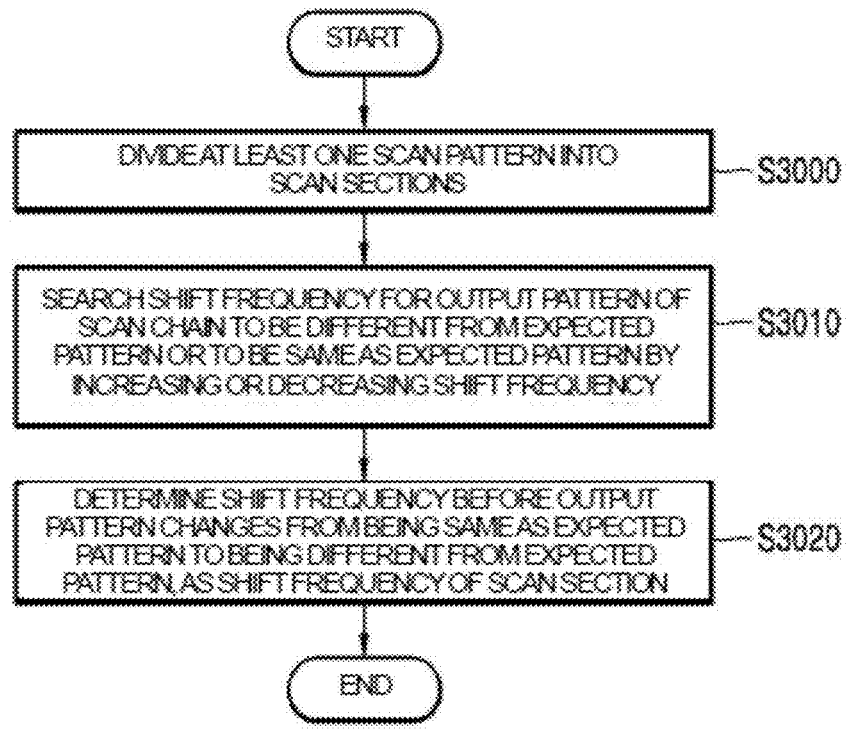
FIG. 30 is a flowchart of a process to determine an optimum shift frequency for each scan section to minimize the chip test time according to some embodiments of the present invention.

FIG. 30 is a flowchart of a process to determine an optimum shift frequency for each scan section to minimize the chip test time according to some embodiments of the present invention.

As shown in FIG. 30, the apparatus for minimizing scan test time divides at least one scan pattern into at least two scan sections (Step S3000).

The apparatus for minimizing scan test time searches a shift frequency at a time when the output pattern and the expected pattern, which are same as each other, become different from each other or when the output pattern and the expected pattern, which are different from each other, become same as each other while increasing or decreasing the shift frequency, for shifting the scan section to the scan path (Step S3010). The chip used to search the optimum shift frequency is a chip tested as a fault-free chip. For example, a chip for which a scan test result has turned out to be normal by using a nominal shift frequency is used to search the optimum shift frequency according to the present embodiment. The same goes for other embodiments.

Thereafter, the apparatus for minimizing scan test time determines a shift frequency that allows the test result to be normal before the output pattern and the expected pattern begin to differ from each other, as the shift frequency for the corresponding scan section (Step S3020). The shift frequency before the output pattern and the expected pattern begin to differ from each other includes a frequency lower than the shift frequency at the time when the output pattern and the expected pattern become different from each other.

For example, when the output pattern and the expected pattern are same as each other with a first shift frequency but become different from each other with a second shift frequency that is obtained by increasing the first shift frequency by a predetermined increment, the apparatus for minimizing scan test time determines a shift frequency that is lower than the second shift frequency and that allows the test result to be normal as the shift frequency for the scan section or provides information on the determined shift frequency.

The increment used to search the optimum shift frequency can be set in advance in the test apparatus or changed appropriately or set by a user.

Although the present embodiment describes a method of searching the optimum shift frequency for each scan section by scaling (increasing or decreasing) the shift frequency for shifting in a scan pattern, the shift frequency can also be searched by scaling a frequency for shifting out the scan pattern. The same goes for other embodiments.

In some embodiments, all the steps in FIG. 30 can be performed in the apparatus for minimizing scan test time. In some embodiments, at least a part of the steps can be performed in a separate device such as a computer.

Figure 31:
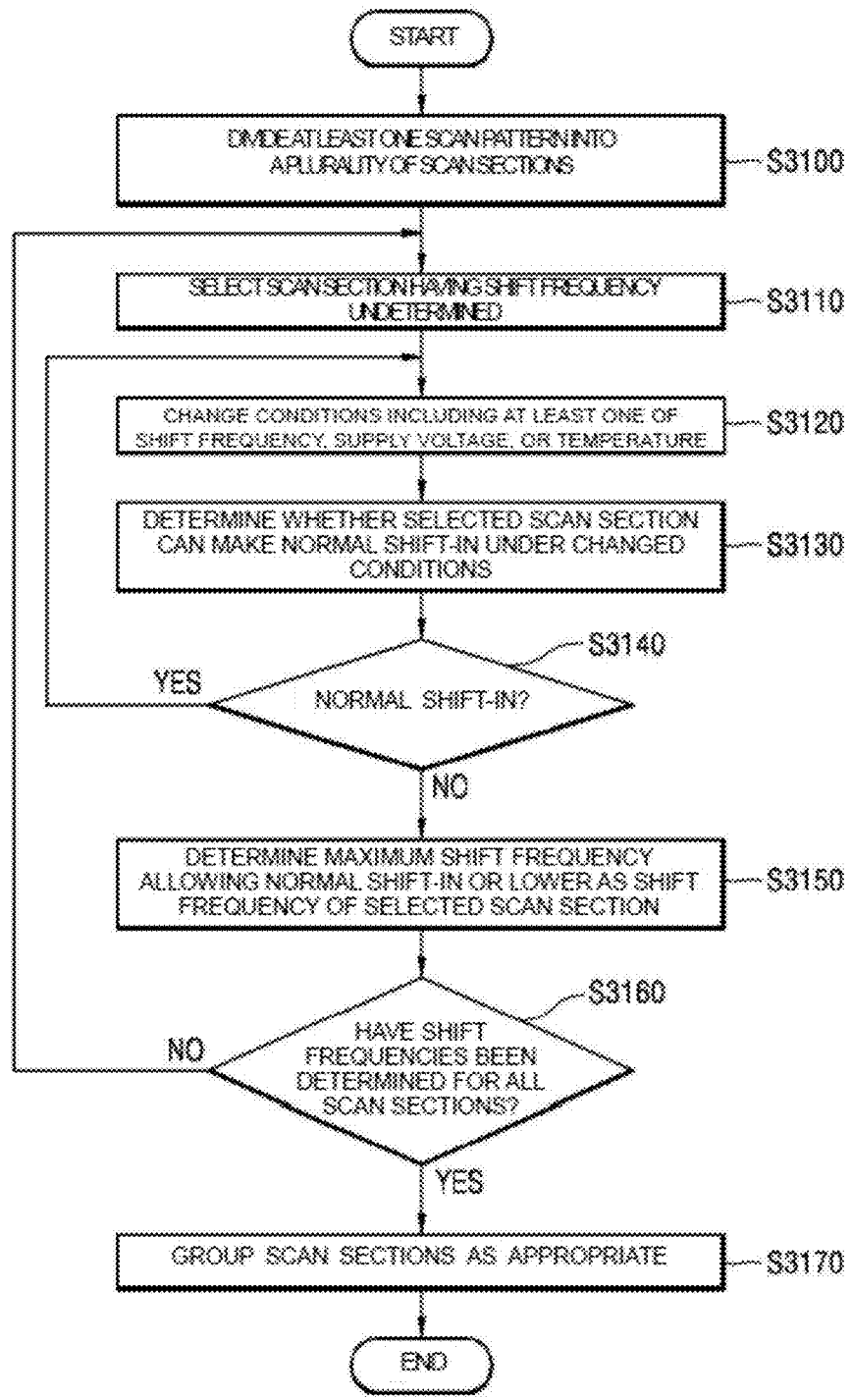
FIG. 31 is a flowchart of a detailed process to minimize the chip test time according to some embodiments of the present invention.

FIG. 31 is a flowchart of a detailed process to minimize the chip test time according to some embodiments of the present invention.

As shown in FIG. 31, the apparatus for minimizing scan test time divides at least one scan pattern into a plurality of scan sections (Step S3100).

The apparatus for minimizing scan test time selects a scan section for which the shift frequency is not yet determined by using the method according to the present embodiment among the scan sections (Step S3110). For example, when there is a predetermined order among the scan patterns for a scan test, the apparatus for minimizing scan test time can select a scan section sequentially from the first scan section. Alternatively, a user selects a scan section for which the shift frequency is to be optimized and the apparatus for minimizing scan test time performs optimization of the shift frequency for the selected scan section. In addition, various methods can be used to select a scan section for which the shift frequency is to be optimized.

The apparatus for minimizing scan test time increases the shift frequency (Step S3120). For example, various frequency can be used for the initial shift frequency, such as the nominal shift frequency or the like.

The apparatus for minimizing scan test time determines whether or not the scan section can be normally shifted to the scan path with the increased shift frequency starting from the initial shift frequency that allows the scan test result to be normal (Step S3130). An example of determining whether or not the scan section selected to determine the shift frequency is normally shifted to the scan path is described with reference to FIG. 32.

When the scan section can be normally shifted in (YES at Step S3140), the apparatus for minimizing scan test time increases the shift frequency (Step S3120) and repeats the step of determining whether or not the scan section can be normally shifted in (Step S3130).

When the scan section cannot be normally shifted in while increasing the shift frequency (NO at Step S3140), the apparatus for minimizing scan test time determines a shift frequency equal to or lower than the maximum shift frequency that allows a normal shift-in as the shift frequency for the corresponding scan section or stores information that can be used for determining the shift frequency in a computer-readable recording medium (Step S3150). The above steps are repeated until the shift frequency is determined for all the scan sections or information that can be used to determine the shift frequency for all the scan sections is stored in the computer-readable recording medium (Step S3160). An example of the information stored in the recording medium includes information on "PASS" or "FAIL" of the shift or the test with respect to each shift frequency for the test target IC chip.

The apparatus for minimizing scan test time groups scan sections as a scan section group as appropriate (Step S3170). For example, when a test apparatus that performs an actual scan test has some constraints in the number of times of changing the shift frequency that can be supported during a scan test, the maximum number of shift frequencies, delay time for changing the shift frequency, or the like, the apparatus for minimizing scan test time can group some scan sections to allow the number of scan sections to satisfy the constraints, to minimize the total scan test time. In this case, a shift frequency equal to or lower than the lowest shift frequency among the optimum shift frequencies for at least two scan sections included in a scan section group can be determined as the shift frequency for the corresponding scan section group. The step of grouping the scan sections (Step S3170) can be omitted in some embodiments.

For example, if the number of times of changing the shift frequency that can be supported in the test apparatus is 5, the apparatus for minimizing scan test time groups the scan sections into five or less scan section groups when the number of current scan sections exceeds 5, and determines a shift frequency equal to or lower than the lowest shift frequency among the optimum shift frequencies for sections included in each scan section group as the shift frequency for the corresponding scan section group. Various methods can be used to group the scan sections into a scan section group so long as the scan test time can be minimized, such as grouping scan sections having same or similar optimum shift frequencies.

The above-mentioned embodiments have described a process of searching the optimum shift frequency by mainly considering the increase of the shift frequency. In some embodiments, the optimum shift frequency for the corresponding scan section can be searched by decreasing the shift frequency.

For example, the apparatus for minimizing scan test time can start with an initial shift frequency with which the test result is "FAIL", and while decreasing the shift frequency, determine whether or not the scan section can be normally shifted to the scan path with the decreased shift frequency. When a shift frequency that allows the scan section to be normally shifted to the scan path is searched while decreasing the shift frequency, the apparatus for minimizing scan test time determines a shift frequency equal to or lower than the maximum shift frequency that allows the scan path to be normally shifted to the scan path as the shift frequency for the corresponding scan section or stores information that can be used for determining the shift frequency in a computer-readable recording medium.

In some embodiments, as the IC chip can be influenced by supply voltage, ambient temperature, or the like, such environmental conditions are reflected on searching the optimum shift frequency. That is, the apparatus for minimizing scan test time can perform the process of searching the optimum shift frequency while changing the conditions such as supply voltage, ambient temperature, or the like.

For example, the apparatus for minimizing scan test time can increase or decrease a voltage supplied to the chip considering the spec of the chip, quality-related policy such as quality assurance (QA), quality control (QC), and the like (Step S3120). The apparatus for minimizing scan test time then searches the optimum shift frequency for each scan section by using the method according to some embodiments of the present invention at different supply voltages. When a plurality of optimum shift frequencies is searched at different supply voltages for a selected scan section, the apparatus for minimizing scan test time determines a shift frequency equal to or lower than the lowest optimum shift frequency among the plurality of optimum shift frequencies, as the shift frequency for the corresponding scan section (Step S3150). In addition, after repeating the process of searching the optimum shift frequency while increasing or decreasing temperature or changing other conditions, the apparatus for minimizing scan test time may determine a shift frequency equal to or lower than the lowest optimum shift frequency among a plurality of optimum shift frequencies obtained in the above manner, as the shift frequency for the corresponding scan section.

It is generally referred to as "electrical testing" or "shmooing" to figure out characteristics of an IC chip, such as frequency range or the like, while changing supply voltage of the IC chip or ambient temperature. It is referred to as "shmoo plotting" to make a chart of characteristic information by way of electrical testing or shmooing. The chart is referred to as "shmoo plot".

Each of the steps shown in FIG. 31 can be performed by other device such as a computer, as well as the apparatus for minimizing scan test time.

Figure 32:
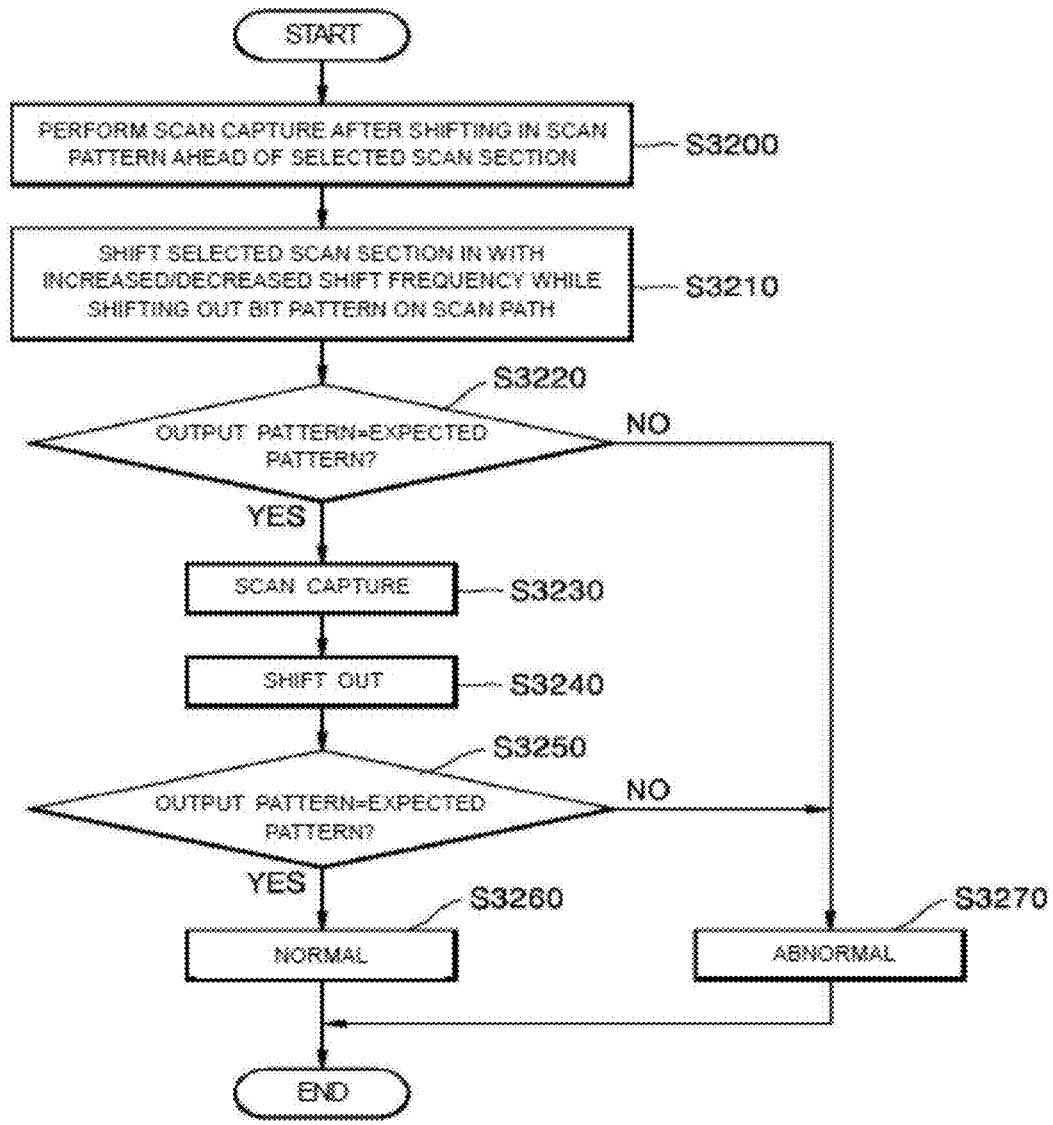
FIG. 32 is a flowchart of a detailed process to determine PASS or FAIL of a test in the process of minimizing the chip test time according to some embodiments of the present invention.

FIG. 32 is a flowchart of a detailed process to determine a normal shift-in in the process of minimizing the chip test time according to some embodiments of the present invention. That is, FIG. 32 corresponds to Step S3130 shown in FIG. 31, but not limited to a specific step in FIG. 31, and can be applied to various embodiments including a step of determining whether or not a scan pattern or a scan section is normally shifted to a scan path.

As shown in FIGS. 12 and 32, the apparatus for minimizing scan test time shifts the input pattern K−1 1202 coming before the target scan section K 1204 that is currently selected to determine the shift frequency to the scan path 1210 (Step S3200). For example, the input pattern K−1 1202 comes before the scan pattern M including the target scan section K 1204, which includes following example of (1) or (2).

(1) When the Input Pattern K−1 1202 is a Scan Pattern Used in the Actual Scan Test The apparatus for minimizing scan test time shifts the scan pattern M−1 to the scan path and performs a scan capture. This is advantageous in reflecting the actual scan test operation. The scan pattern M−1 is a pattern coming before the scan pattern M including the target scan section K.

(2) When the Scan Pattern M−1 is an Output Pattern Expected as a Scan Test Result Using the Scan Pattern M−1 that is Used in the Actual Scan Test The apparatus for minimizing scan test time does not need to perform a scan capture after shifting the scan pattern M−1 to the scan path. Therefore, the time corresponding to the clock for the scan capture can be saved, and accordingly the time for searching the optimum shift frequency can be reduced.

The apparatus for minimizing scan test time performs a scan capture after shifting the input pattern K−1 1202 to the scan path (Step S3200). In some embodiments, the apparatus for minimizing scan test time performs no scan capture at this step. Thereafter, the apparatus for minimizing scan test time shifts the target scan section K 1204 with increased or decreased shift frequency (Step S3210). When the target scan section K 1204 is a part of the scan pattern M as shown in FIG. 14, the scan pattern M including the target scan section K 1204 is shifted to the scan path.

In this case, a bit pattern stored on the scan path while the target scan section K 1204 or the scan pattern M including the target scan section K 1204 is shifted in to the scan path is simultaneously shifted out (Step S3210). The bit pattern shifted out at this step is not limited to the above-mentioned example, but can vary depending on the type of the scan circuit that can perform the shift-in and shift-out operations simultaneously with respect to the scan path.

For example, when the target scan section K 1204 is a part of the scan pattern M, which is shorter than the length of the scan path, as shown in FIG. 14, the scan pattern M including the target scan section K 1204 is shifted to the scan path. At this time, the shift frequency for the part of the scan pattern M other than the target scan section K 1204 is set not to restrict the search of the optimum shift frequency for the target scan section K 1204. To this end, the shift frequency for the part of the scan pattern M other than the target scan section K 1204 is set not to be increased or decreased with the shift frequency for the target scan section K 1204 or set to a shift frequency different from the shift frequency for the target scan section K 1204. Alternatively, a shift frequency that allows the part of the scan pattern M other than the target scan section K 1204 to be normally inputted to the scan path can be used as the shift frequency for the part of the scan pattern M other than the target scan section K 1204.

In some embodiments of the present invention, the shift frequency for the part of the scan pattern M other than the target scan section K 1204 is set to a predetermined shift frequency such as a frequency equal to or lower than the nominal shift frequency, or when the optimum shift frequency is already determined for this part by using the method according to some embodiments of the present invention, a frequency equal to or lower than the optimum shift frequency. The predetermined shift frequency is not limited to the above-mentioned example, but can be various frequencies such as a frequency obtained by adjusting the nominal shift frequency, a frequency set in the apparatus by a program, a frequency set by a user, and the like depending on the embodiment.

The apparatus for minimizing scan test time compares the output pattern K−1 for the input pattern K−1 with the expected pattern K−1 of the test target chip (Step S3220). When a result of the comparison indicates that the output pattern K−1 does not match the expected pattern K−1 (NO at Step S3220), the apparatus for minimizing scan test time determines that the target scan section K 1204 cannot be normally shifted to the scan path with the current shift frequency (Step S3270). The apparatus for minimizing scan test time then stores information on the test FAIL in a computer-readable recording medium.

When the result of the comparison indicates that the output pattern K−1 and the expected pattern K−1 match each other (YES at Step S3220), the apparatus for minimizing scan test time performs a scan capture for the target scan section K 1204 (Step S3230), and then performs a shift-out operation (Step S3240). In some embodiments, the shift-out operation (Step S3240) is performed without performing the scan capture operation (Step S3230). A bit pattern shifted out at this step (Step S3240) can vary depending on the type of the scan circuit that can perform the shift-in and shift-out operations simultaneously with respect to the scan path.

A shift frequency that does not allow the bit pattern of the target scan section K 1204 shifted out to be unintendedly changed is used for the input pattern K+1 1206 that is shifted in at the same time when the output pattern for the target scan section K 1204 is shifted out. That is, a shift frequency that allows the shift-out operation (Step S3240) to be normally performed is used for the input pattern K+1 1206. Further, a shift frequency that allows the input pattern K+1 1206 to be normally shifted to the scan path is used for the input pattern K+1 1206 that is shifted in at the same time when the target scan section K 1204 is shifted out.

The apparatus for minimizing scan test time compares the output pattern K for the target scan section K 1204 with the expected pattern K (Step S3250). When a result of the comparison indicates that the output pattern K for the target scan section K 1204 does not match the expected pattern K (NO at Step S3250), the apparatus for minimizing scan test time determines that the target scan section K 1204 cannot be normally shifted to the scan path with the current shift frequency (Step S3270). The apparatus for minimizing scan test time then stores information on the test FAIL in a computer-readable recording medium.

When the result of the comparison indicates that the output pattern K for the target scan section K 1204 and the expected pattern K match each other (YES at Step S3250), the apparatus for minimizing scan test time determines that the target scan section K 1204 can be normally shifted to the scan path with the current shift frequency (Step S3260). The apparatus for minimizing scan test time then stores information on the test PASS in a computer-readable recording medium.

In some embodiments of the present invention, the usable shift frequency or the optimum shift frequency for the target scan section K 1204 can be searched by comparing the output pattern for the scan pattern coming before the scan pattern including the target scan section K 1204 with the corresponding expected pattern, as well as comparing the output pattern for the scan pattern including the target scan section K 1204 with the corresponding expected pattern.

In some embodiments of the present invention, the test apparatus determines whether or not the test results for both the target scan section K 1204 and the input pattern K−1 1202 coming before the target scan section K 1204 are normal. When both test results are normal, the shift frequency used for the target scan section K 1204 is determined to be a shift frequency with which the target scan section K 1204 can be normally shifted to the scan path.

Figure 33:
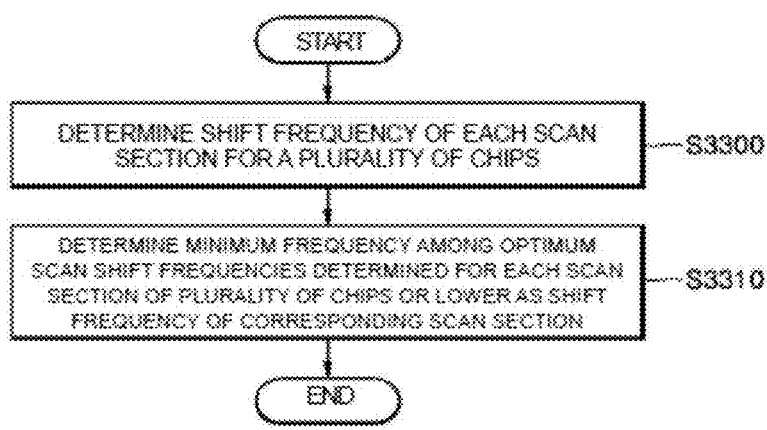
FIG. 33 is a flowchart of another process to minimize the chip test time according to some embodiments of the present invention.

FIG. 33 is a flowchart of another process to minimize the chip test time according to some embodiments of the present invention.

There may be a process variation between IC chips on different wafers or IC chips on the same wafer depending on the type and the condition of the IC chip manufacturing process, which can have an influence on the operation frequency and the power consumption of the IC chip. The deep sub-micron manufacturing process and the low-power process more influence on the operation frequency and the power consumption.

As shown in FIG. 33, the apparatus for minimizing scan test time performs a step of determining the optimum shift frequency for a plurality of chips (Step S3300). The plurality of chips may be IC chips on the same wafer or IC chips on different wafers, which may be chips determined to be fault free in advance.

The apparatus for minimizing scan test time determines a shift frequency equal to or lower than the lowest shift frequency among a plurality of optimum shift frequencies searched for a scan section for the plurality of IC chips as the optimum shift frequency for the corresponding scan section or stores information that can be used for determining the shift frequency in a computer-readable recording medium (Step S3310), and performs this process for each scan section. An example of the information stored in the recording medium includes information on "PASS" or "FAIL" of the shift or the test with respect to each shift frequency.

For example, when the shift frequency for the target scan section K of the first test target chip is A and the shift frequency for the target scan section K of the second test target chip is B, if the shift frequency A is lower than the shift frequency B, the test apparatus selects a shift frequency equal to or lower than the shift frequency A as the shift frequency for the target scan section K or stores information that can be used to select the shift frequency in a computer-readable recording medium.

The steps shown in FIG. 33 can be performed by various devices such as a computer and the like as well as the apparatus for minimizing scan test time by using information on the shift frequencies searched for each scan section for the scan pattern set and the plurality of chips.

Figure 34:
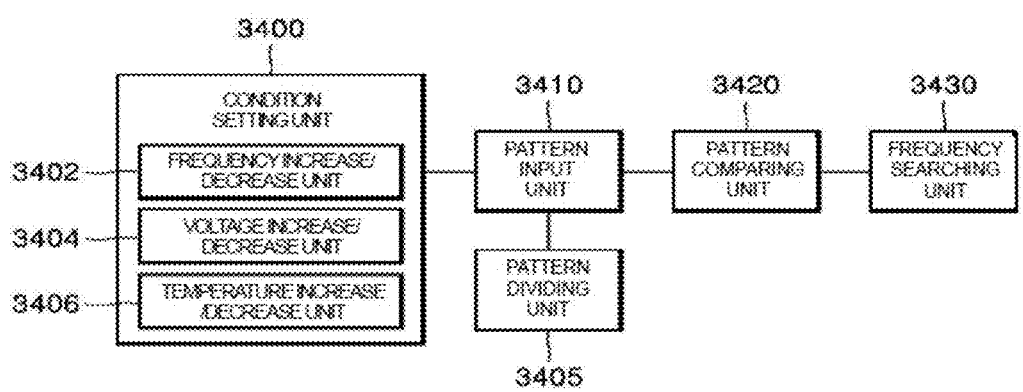
FIG. 34 is a block diagram of an apparatus for minimizing chip test time according to some embodiments of the present invention.

FIG. 34 is a block diagram of an apparatus for minimizing chip test time according to some embodiments of the present invention.

The apparatus for minimizing chip test time shown in FIG. 34 can perform the method according to some embodiments of the present invention to optimize the shift frequency for each scan section, to which whole or a part of the methods shown in FIGS. 12 to 33 can be applied.

As shown in FIG. 34, the apparatus for minimizing chip test time includes a condition setting unit 3400, a pattern dividing unit 3405, a pattern input unit 3410, a pattern comparing unit 3420, and a frequency searching unit 3430. The condition setting unit 3400 includes a frequency increase/decrease unit 3402, a voltage increase/decrease unit 3404, and a temperature increase/decrease unit 3406.

The condition setting unit 3400 sets various conditions for searching the optimum shift frequency for each scan section. Specifically, the frequency increase/decrease unit 3402 increases or decreases the shift frequency, the voltage increase/decrease unit 3404 increases or decreases a voltage supplied to the chip, and the temperature increase/decrease unit 3406 increases or decreases ambient temperature in the test environment. The condition setting unit 3400 can increase or decrease the shift frequency while setting the conditions including supply voltage, ambient temperature, and the like. For example, the condition setting unit 3400 can be provided in the host computer 200/300, the tester main unit 210/310, the tester head 220/320, or the prober 350.

The pattern dividing unit 3405 divides at least one scan pattern into a plurality of scan sections. For example, the pattern dividing unit 3405 can be provided in the host computer 200/300, the tester main unit 210/310, the tester head 220/320, or the prober 350. The pattern dividing unit 3405 divides the test data into at least one scan section by using the methods shown in FIGS. 5 to 10.

The pattern input unit 3410 allows a scan section to be shifted to the scan path of the test target chip under a condition set by the condition setting unit 3400. Specifically, the pattern input unit 3410 allows scan patterns or scan sections coming before and after a target scan section for which the optimum shift frequency is to be searched to be sequentially shifted to the scan path. For example, the pattern input unit 3410 can be provided in the host computer 200/300, the tester main unit 210/310, the tester head 220/320, or the prober 350.

The pattern comparing unit 3420 compares the output pattern that is the test result by the scan section shifted in the test target chip by the pattern input unit 3410 with the expected pattern. For example, the pattern comparing unit 3420 can be provided in the host computer 200/300, the tester main unit 210/310, the tester head 220/320, or the prober 350. There exists a time or a frequency when or with which the output pattern and the expected pattern, which are same as each other, become different from each other or the output pattern and the expected pattern, which are different from each other, become same as each other with increase or decrease of the shift frequency by the condition setting unit 3400.

The frequency searching unit 3430 stores shift frequency information for searching a shift frequency before the output pattern and the expected pattern become different from each other or a shift frequency that allows the output pattern and the expected pattern match each other based on a result of comparison or information on the result of comparison by the pattern comparing unit 3420 in a computer-readable recording medium. Further, the frequency searching unit 3430 determines the optimum shift frequency for a scan section by using the above-mentioned information.

In some embodiments of the present invention, the frequency searching unit 3430 stores a shift frequency that allows at least both the output pattern of the target scan section and the output pattern of a scan section coming before the target scan section to be same as respective expected patterns, as usable shift frequency information for the target scan section in a computer-readable recording medium. In FIG. 34, at least two units can be integrated in a single module or each unit can be further divided into sub units. The frequency searching unit 3430 can be provided, for example, in the host computer 200/300, the tester main unit 210/310, the tester head 220/320, or the prober 350.

The apparatus for minimizing scan test time described above can be implemented in various forms using hardware or software. Further, whole or a part of the apparatus for minimizing scan test time can be embedded in the test system shown in FIGS. 2 and 3 or can be implemented with a separate device such as a computer.

Figure 35:
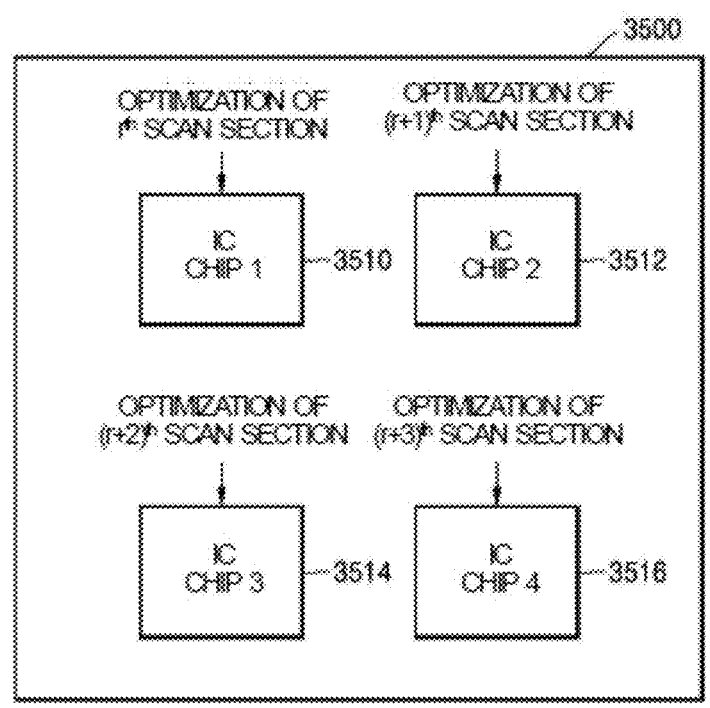
FIG. 35 is a schematic diagram for illustrating a method of searching or determining optimum shift frequencies for a plurality of scan sections in parallel according to some embodiments of the present invention.

FIG. 35 is a schematic diagram for illustrating a method of searching or determining optimum shift frequencies for a plurality of scan sections in parallel according to some embodiments of the present invention.

As shown in FIG. 35, the apparatus for minimizing scan test time can reduce the time required to search or determine the optimum shift frequency by searching or determining optimum shift frequencies for different scan sections for a plurality of IC chips in parallel For example, the optimum shift frequencies can be searched or determined together for different scan sections for a plurality of IC chips 3510, 3512, 3514, and 3516 positioned on a test interface board 3500 of the test system. In some embodiments of the present invention, the optimum shift frequencies for different scan sections can be searched or determined in parallel in a plurality of test systems or on a plurality of test interface boards.

When h hours is required to sequentially search or determine the optimum shift frequency one by one for the whole scan sections, a parallel search or determination of shift frequencies for n scan sections can reduce the time to about h/n hours. Therefore, thousands of scan patterns to test IC chips can be divided into shorter scan sections to optimize the shift frequency in the same time.

Figure 36:
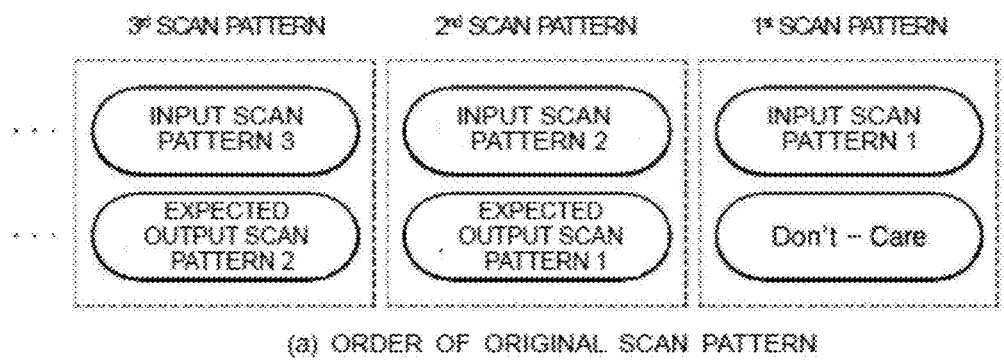
FIG. 36 is a schematic diagram for illustrating a reordering of scan patterns to minimize the chip test time according to some embodiments of the present invention.
Figure 36:
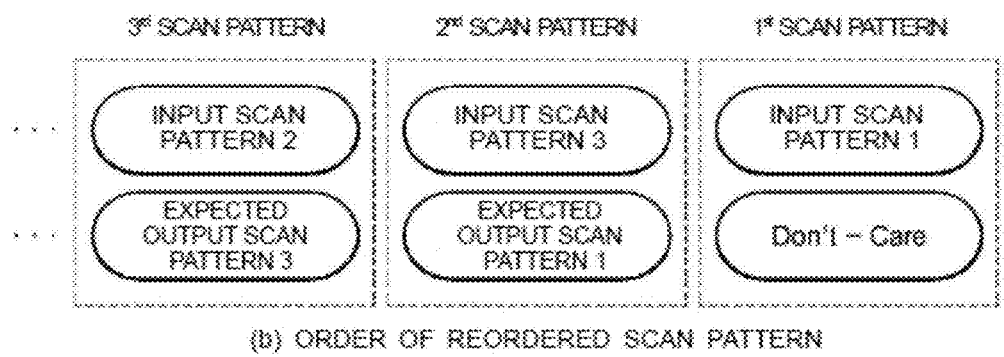

FIG. 36 is a schematic diagram for illustrating an example of reordering scan patterns to minimize the chip test time according to some embodiments of the present invention.

As shown in FIG. 36, scan patterns on a scan pattern set for a scan test have a predetermined order. However, the order of scan patterns is not fixed, but can be reordered to reduce the total scan test time by allocating a high shift frequency for each scan section. For example, the second scan pattern and the third scan pattern on the original scan pattern set can be changed as shown in FIG. 36. When the order of the scan patterns is changed, the order of expected output scan patterns is changed accordingly.

When the scan patterns shifted to the scan path is reordered, a switched part of a circuit on the IC chip and the number of switching activities can be changed by a scan shift, and the power consumption can be changed accordingly, and hence the shift frequency that can be allocated to a scan pattern (or scan section) can be increased. Based on this property, the total scan test time can be further reduced by searching or determining the optimum shift frequency for each scan section by using the above-mentioned embodiments after reordering the scan patterns.

An example of the method of reordering the scan patterns includes arbitrarily reordering at least once scan patterns on the original scan pattern set, determining the optimum shift frequency for the reordered scan pattern set by using one of the methods according to some embodiments, and determining a scan pattern set that provides the shortest scan test time as the order of the scan patterns. Alternatively, various methods can be used to reorder the scan patterns, such as arranging scan patterns having the smallest difference between bit patterns to be adjacent to each other.

Another example of reordering the scan patterns includes, while arranging scan patterns for which the order is not determined after Kth scan pattern (K is an integer equal to or larger than 1), determining a scan pattern that can have the highest shift frequency by using the method of searching the optimum shift frequency described above as the next pattern of the Kth scan pattern.

Whole or a part of the operation of reordering the scan patterns can be performed by hardware such as a processor and firmware or software included in the test system or by a separate device such as a computer.

Further, when a considerable time is required to find the optimum order of the scan patterns, the number of reordering the scan patterns or the required time to find the optimum order of the scan patterns can be limited.

In some embodiments of the present invention, it is possible to reduce the time for a stress test or a burn-in test of an IC chip or to improve the test quality by using optimum shift frequencies for at least two test data. In some embodiments of the present invention, the time for the stress test or the burn-in test of the IC chip can be reduced or the test quality can be improved by applying optimum shift frequencies to at least two scan patterns or scan sections. The optimum shift frequency for each of the scan patterns or scan sections can be searched by using the method of minimizing the scan test time according to some embodiments of the present invention.

The stress test or the burn-in test is performed to test the quality of an IC chip or to find an IC chip having an early-life failure by operating the IC chip for an extended time to apply a stress to the IC chip or by applying high voltage and high temperature to the IC chip to accelerate. In general, the burn-in test is performed for several tens of hours in high-temperature environment over 100° C. Hereinafter, the stress test and the burn-in test are collectively referred to as "burn-in test". Further, a test system (apparatus) that can perform such a burn-in test is referred to as "burn-in test system (apparatus)".

The aging of an IC chip is largely affected by the heat, and the heat is mainly generated by the power consumption of the IC chip.

For example, Equation 2 shows major factors that affect the dynamic power dissipation of an IC chip, which indicates the power consumption of the chip when a circuit is active.

$$P = \alpha \times C \times f \times V_{DD}^2 \qquad \text{[Equation 2]}$$

α: activity factor
C: average switched capacitance (at each cycle)
f: circuit frequency
$V_{DD}$: supply voltage.

In the scan mode of an IC chip, an activated circuit of the IC chip can be changed depending on a bit pattern of a scan pattern. In general, switching activities are generated in more parts of a circuit in the scan mode than in the functional mode of the IC chip. Therefore, the average switched capacitance C may increase in the scan mode and the power consumption P increased accordingly as defined by Equation 2.

Further, as the shift frequency increases, the power consumption P increases in proportion to the operation frequency f of a circuit of the IC chip as defined by Equation 2.

Increased switching activities of the IC chip further increases the power consumption of the IC chip, which also increases heat temperature of the IC chip. Accordingly, the aging of the IC chip can be further accelerated.

In some embodiments of the present invention, the burn-in test apparatus employs the maximum shift frequency that can be allocated to each scan section or test data to reduce the burn-in test time by further accelerating the aging of the IC chip at the time of performing a burn-in test.

For example, the burn-in test apparatus can accelerate the burn-in test by using scan patterns or scan sections while performing a burn-in test of an IC. At this time, the scan test can be performed together.

Further, using the nominal shift frequency when performing a scan shift operation may allow high stress to be applied to one part of circuit portion activated by the scan pattern and relatively low stress to be applied to the other part of the circuit portion. However, for example, by dividing the scan patterns of the test data into scan sections and using the maximum shift frequency that can be allocated to each of the scan sections to perform the burn-in test, it is possible to reduce a phenomenon in which aging of a specific portion of the circuit is accelerated or aging of a specific portion of the circuit is relatively slowed down.

Figure 41:
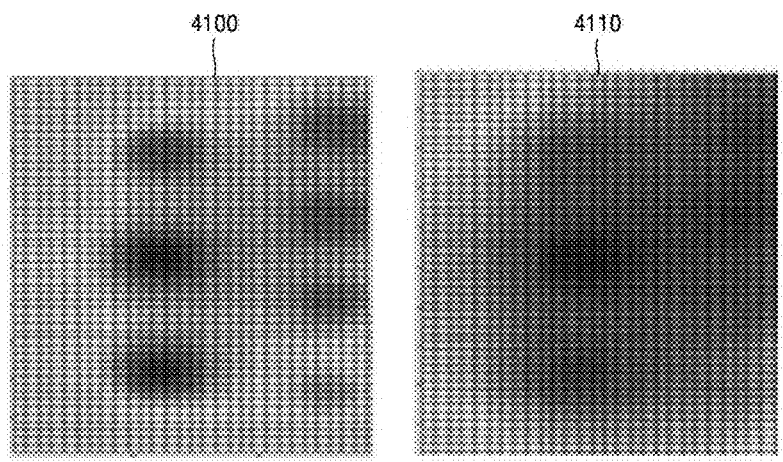
FIG. 41 is a thermal image showing heat generation states of IC chips in a case where the shift frequency is not optimized and in a case where the shift frequency is optimized for each scan section.

For example, FIG. 41 shows a difference in heat generation of the same IC chip between a case 4100 where the shift frequency is not optimized for scan patterns of test data and a case 4110 where the scan patterns are divided into scan sections and the shift frequency is optimized for each scan section. The comparison found that the case 4110 where the scan sections for which the shift frequency is optimized are used exhibits more balanced and high heat generation than the case 4100 where the test data for which the shift frequency is not optimized are used.

That is, it is possible to improve not only the speed but also the quality of the burn-in test by applying the stress as much as possible to different portions of the IC chip activated by the bit pattern of the scan pattern in a more balanced manner. The time for the burn-in test can be saved or the quality of the burn-in test can be improved by using the maximum usable shift frequency for each scan section of the test data for testing the chip.

Figure 37:
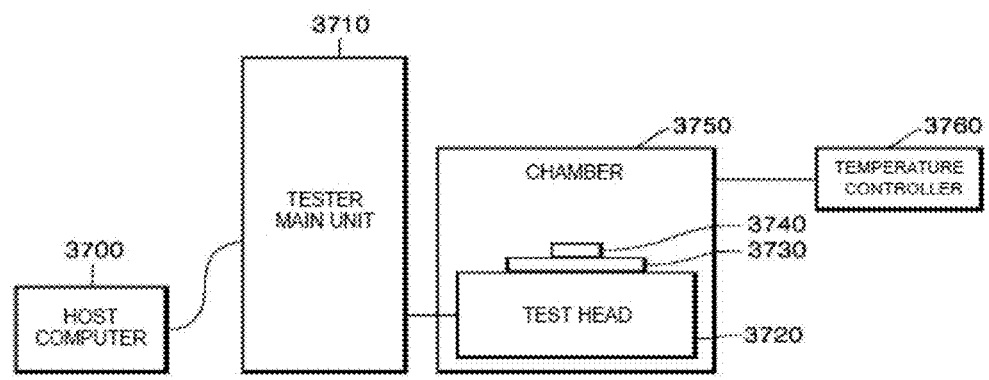
FIGS. 37 and 38 are schematic diagrams of burn-in test systems according to some embodiments of the present invention.
Figure 38:
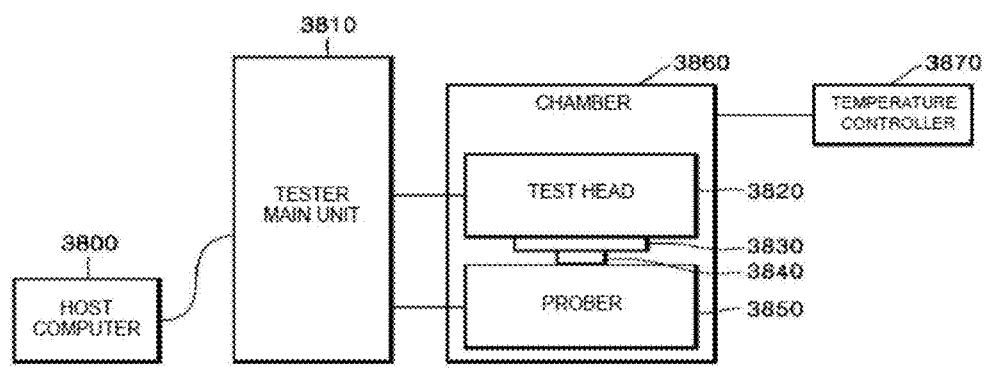

FIGS. 37 and 38 are schematic diagrams of burn-in test systems according to some embodiments of the present invention.

As shown in FIGS. 37 and 38, the burn-in test system includes a host computer 3700/3800, a tester main unit 3710/3810, a tester head 3720/3820, an interface board 3730/3830, a temperature control unit 3760/3870, a chamber 3750/3860, and a prober 3850.

A device under test (DUT) 3740/3840 that is placed on the interface board 3730/3830 for a test is an IC on a wafer, a packaged IC, or the like. When the DUT 3740/3840 is an IC chip on a wafer, the chip test system further includes the prober 3850.

The tester main unit 3710/3810 performs overall control of the scan test and the burn-in test. For example, the tester main unit controls overall processes of setting up for a DUT test, generating an electrical signal for the DUT test, observing and measuring a test result signal of the DUT, and temperature control of the chamber using the temperature control unit. The tester main unit can be implemented as a computer including a central processing unit (CPU), a memory, a hard disk, a user interface, and the like. In some embodiments, the tester main unit further includes a device power supply for supplying a power to the DUT. The tester main unit further controls a digital signal processor (DSP, not shown) for processing various digital signals and the tester head. The tester main unit includes dedicated hardware such as a controller and a signal generator for applying a signal to the DUT 3740/3840, software, firmware, and the like. The tester main unit is also referred to as a "main frame" or a "server".

The host computer 3700/3800 is a computer such as a personal computer, a workstation, or the like, which is a device that allows a user to execute a test program, control a test process, and analyze a test result. In general, the host computer includes a CPU, a storage unit such as a memory and a hard disk, a user interface, and the like. The host computer is connected to the tester main unit via a wired or wireless communication. The host computer includes dedicated hardware, software, firmware, and the like for controlling the test. Although the host computer and the tester main unit are separately shown in the drawings, the host computer and the tester main unit can be provided in an integrated manner.

The memory of the tester main unit or the host computer includes a DRAM, an SRAM, a flash memory, and the like. The memory stores therein programs and data for performing the DUT test.

The software or the firmware of the tester main unit or the host computer for performing the burn-in test or the scan test includes a device driver program, an operating system (OS) program, and a program for performing a DUT test, and these programs are stored in a memory in the form of instruction codes for setting up for the DUT test, generating a signal for the DUT test, and observing and measuring a result test signal of the DUT and executed by the CPU.

Therefore, the scan pattern can be applied to the DUT by these programs. Further, reporting and analysis data for the DUT test and the test result can be automatically obtained by the programs. Languages used in the program include C, C++, java, and the like. The programs can be stored in a storage device such as a hard disk, a magnetic tape, a flash memory, or the like.

The CPU of the tester main unit or the host computer is a processor, which executes the instruction codes of the software or the program stored in the memory. For example, when a user command is inputted via a user interface such as a keyboard, a mouse, or the like, the CPU analyzes the user command, and after performing an operation corresponding to the user command by executing the software or the programs, provides a result of the operation to a user via a user interface such as a speaker, a printer, a monitor, or the like.

The user interface of the tester main unit or the host computer allows a user and an apparatus to transmit and receive information. For example, the user interface includes an input interface unit such as a keyboard, a touch screen, a mouse, and the like and an output interface unit such as a speaker, a printer, a monitor, and the like.

The tester head 3720/3820 includes a channel and the like for transmitting an electrical signal between the tester main unit and the DUT. The interface board is provided over the tester head. In general, an interface board used to test a packaged IC chip is referred to as a "load board", and an interface board used to test an IC chip on a wafer is referred to as a "probe card".

The chamber 3750/3860 provides a space for aging the DUT. The chamber controls temperature of the DUT positioned in the chamber with a control of the temperature control unit. The temperature control unit can be included in the tester main unit or the host computer. The tester main unit or the host computer can control the burn-in test time or the supplied voltage with respect to the DUT.

The burn-in test systems (apparatuses) shown in FIGS. 37 and 38 are mere examples to help understanding of the present invention. The system can be designed and modified in various forms by integrating the elements as appropriate or dividing one element into a plurality of elements depending on the embodiment Further, the examples shown in FIGS. 37 and 38 can be implemented to perform the burn-in test and the scan test at the same time or to perform either one at one time.

In some embodiments of the present invention, as described above, the burn-in test system can perform the burn-in test by using the optimum shift frequency for each scan section. At the same time, the system can perform a test for determining whether or not the chip is normal.

In some embodiments of the present invention, as described above, the burn-in test system can perform the scan test and the burn-in test together by using the optimum shift frequency for each scan pattern or scan section. In general, an IC chip generates switching activities in more circuit portions in the scan mode than in the functional mode, and hence the burn-in test time can be saved by more accelerating the aging of the device with the scan test. Further, the burn-in test using the maximum shift frequency that can be allocated to each divided scan section can help further reducing the burn-in test time, with simultaneous reduction of phenomenon of speeding up of the aging in only a specific portion of the circuit by a specific scan pattern. That is, it is possible to improve the quality of the burn-in test by applying the stress as much as possible to the IC chip in a well-balanced manner. As the length of a scan section using the optimized shift frequency decreases, the above-mentioned effect increases.

The present invention is not limited to a mode of performing the burn-in test and the scan test at the same time. In some embodiments, the burn-in test includes only the process of shifting the scan pattern without performing the scan test.

Figure 39:
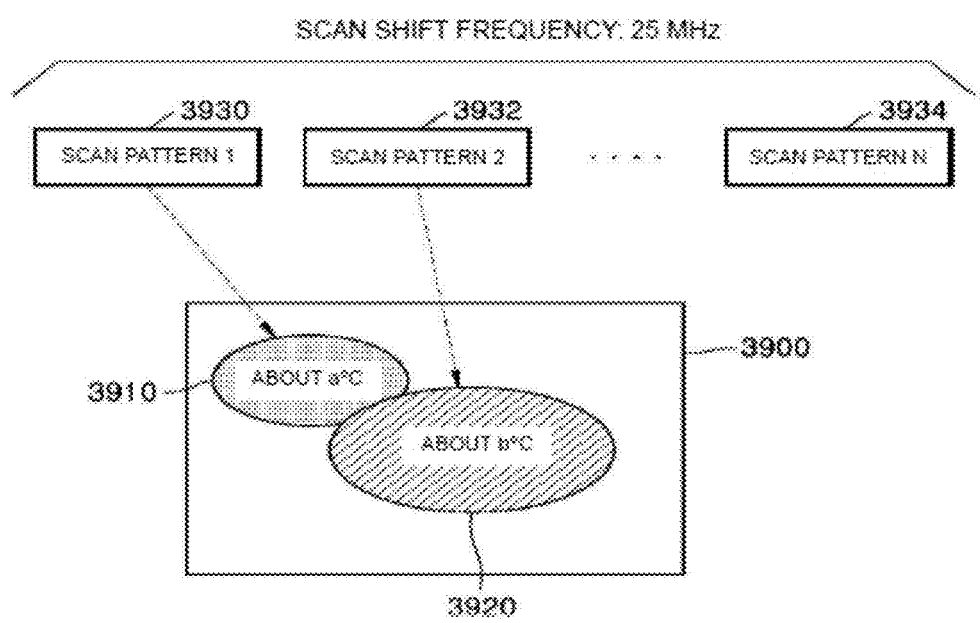
FIG. 39 is a schematic diagram for illustrating an influence of temperature on an IC chip during a burn-in test using a constant shift frequency.

FIG. 39 is a schematic diagram for illustrating an influence of temperature on an IC chip during a burn-in test using a constant shift frequency.

As shown in FIG. 39, a plurality of scan patterns is shifted to a scan path of an IC chip 3900 with the same scan shift frequency (e.g., 25 MHz). Portions of the IC chip activated by each scan pattern can differ from each other. For example, a portion 3910 of the IC chip activated by a scan pattern 1 3930 and a portion 3920 of the IC chip activated by a scan pattern 2 3932 can differ from each other.

Further, the portions of the IC chip activated by each pattern can have different heats generated by the number of switching activities according to the scan shift frequency or the scan pattern and the like. For example, temperature of the portion 3910 of the IC chip activated by the scan pattern 1 is a° C., and the portion 3920 of the IC chip activated by the scan pattern 2 is b° C.

The shift frequency can be increased to accelerate the aging of the IC chip by generating more stress or heat on the IC chip. However, too high shift frequency may cause an over kill in which a normal chip is determined to be defective. On the other hand, too low shift frequency may not effectively accelerate the aging of the IC chip due to insufficient stress or heat generated in the IC chip.

Figure 40:
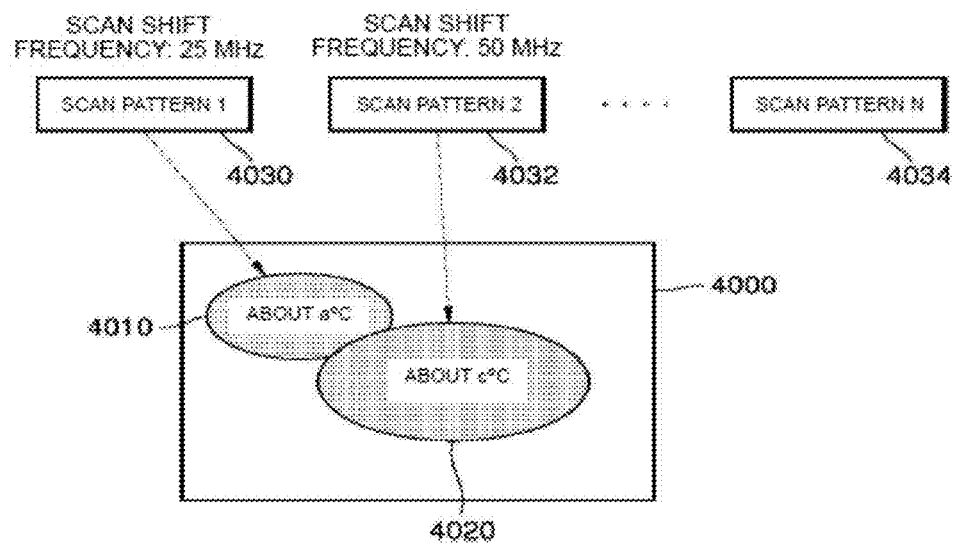
FIG. 40 is a schematic diagram for illustrating an influence of temperature on an IC chip during a burn-in test using an optimum shift frequency for each scan pattern according to some embodiments of the present invention.

FIG. 40 is a schematic diagram for illustrating an influence of temperature on and IC chip during a burn-in test using an optimum shift frequency for each scan pattern according to some embodiments of the present invention. FIGS. 39 and 40 show examples in which the same IC chip and the same scan pattern are employed.

As shown in FIG. 40, the aging of the IC chip can be accelerated by shifting the scan pattern using the optimum shift frequency for each scan pattern.

In general, the burn-in test is performed for several tens of hours in high-temperature environment over 100° C., and hence the burn-in test time and the power dissipated in the test increases the chip cost. That is, an IC chip test service company generally issues an invoice with an amount proportional to the test time, and hence the chip test time has large influence on the chip cost. Further, the high temperature over 100° C. in the chamber used in the burn-in test is generally obtained from the electricity, which requires considerable cost, and hence it may also have large influence on the cost of the test service company and the chip cost.

Therefore, reducing the burn-in test time and the power dissipated in the burn-in test is significant in reduction of the test cost. Further, the reduction of the burn-in test time is significant in the time-to-market of a product.

For example, when the maximum usable scan shift frequency for the scan pattern 1 3930 shown in FIG. 39 is 25 MHz and the shift frequency for the scan pattern 2 3932 can be increased more, the aging of the IC chip can be more accelerated with temperature c° C. higher than temperature b° C. shown in FIG. 39 by optimizing the shift frequency for a scan pattern 2 4032 as shown in FIG. 40.

Although FIGS. 39 and 40 describe a case where the scan pattern is shifted to the scan path with the shift frequency allocated to the scan pattern for the convenience of explanation, the scan pattern can be divided into at least two scan sections so that the scan sections can be shifted to the scan path with respective shift frequencies as shown in FIGS. 5 to 10.

A junction temperature of the test target chip needs to be maintained within a predetermined range in order to make the burn-in test time and the quality of the burn-in test predictable. For example, the junction temperature of the test target device or IC chip can be determined by Equation 3.

$$T_j = T_a + P + \theta_{ja} \quad \text{[Equation 3]}$$

In Equation 3, $T_j$ is junction temperature of test target device or IC chip, $T_a$ is ambient temperature, P is power consumption of test target device or IC chip, and $\theta_{ja}$ is thermal resistance of test target device or IC chip.

From Equation 3, controllability of $T_j$ depends on controllabilities of $T_a$ and P. For example, $T_a$ can be controlled to appropriate temperature by using a device such as a chamber or a thermal chuck for controlling ambient temperature of the test target device or IC chip. Therefore, a way to controlling the power consumption P is required during the burn-in test of the chip. For example, fluctuation of the power consumption during the burn-in test of the chip may have large influence on the junction temperature $T_j$ of the chip, and then can affect badly the quality of reliability screening process of the chip.

Figure 42:
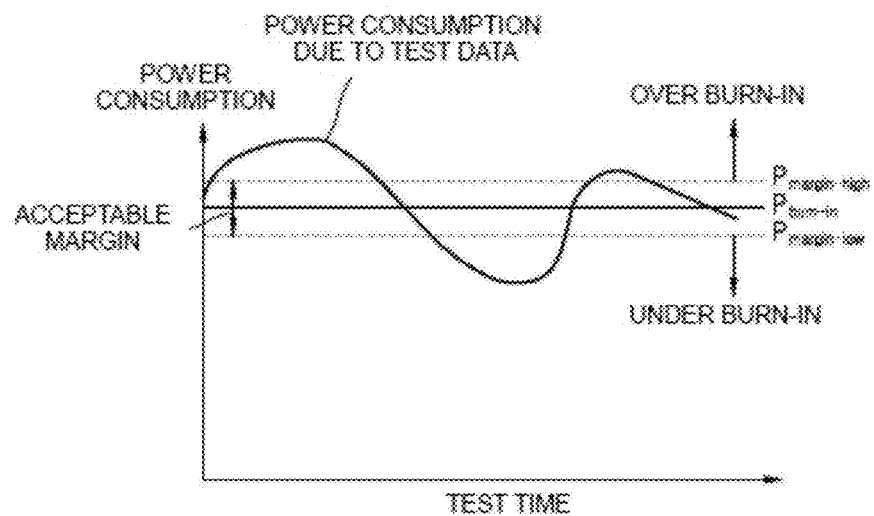
FIG. 42 is a graph showing a power consumption generated during a burn-in test before the power consumption of test data is adjusted.

The time required to the burn-in test can be estimated based on a median value of the junction temperature $T_j$ in Equation 3. For example, the junction temperature can be determined by a value of the power consumption $P_{burn-in}$ as shown in FIG. 42. $P_{burn-in}$ can take a median value or an average of the power consumption by the test data or a power consumption value expected when performing the good quality burn-in test according to the QA (Quality Assurance) or QC (Quality Control) guidelines.

Figure 43:
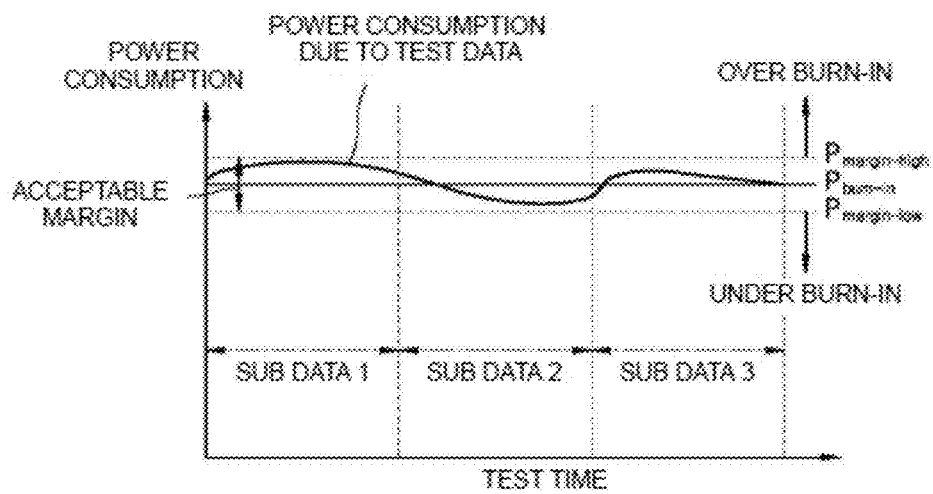
FIG. 43 is a graph showing a power consumption generated during a burn-in test after the power consumption of the test data is adjusted.

FIG. 42 is a graph showing a power consumption generated during a burn-in test before the power consumption of test data is adjusted. FIG. 43 is a graph showing a power consumption generated during a burn-in test after the power consumption of the test data is adjusted.

As shown in FIG. 42, when the power consumption is higher than $P_{burn-in}$ or $P_{margin-high}$ on which a margin is reflected, an over burn-in state may occur, which can badly affect the yield of the chip.

On the other hand, when the power consumption is lower than $P_{burn-in}$ or $P_{margin-low}$ on which a margin is reflected, an under burn-in state may occur, which can cause a situation where a potentially defective chip passes the test process.

Therefore, in order to achieve precise estimation of the burn-in test time and the quality of the burn-in test, the power consumption by the test data needs to be close to $P_{burn-in}$ as shown in FIG. 43. That is, variation of the heat generated in the IC chip needs to be minimized by suppressing fluctuation of the power consumption by the test data.

An example of reducing the burn-in test time or having the burn-in test time predictable and improving the quality of the burn-in test by optimizing the power consumption in the burn-in test is described below.

Step 1

Test data are divided into at least two pieces of sub data. For example, the test data can be divided into three pieces of sub data with respect to the test time axis as shown in FIG. 43.

Step 2

A shift frequency for inputting each piece of sub data to the chip is searched or determined, which minimizes a difference in the power consumption between the at least two pieces of sub data divided at Step 1. Alternatively, a shift frequency for inputting each piece of sub data to the chip is searched or determined, which makes the power consumption by each piece of sub data close to or equal to estimated power consumption (or estimated current consumption) for the burn-in test. For example, it is possible to make the power consumption by the test data close to $P_{burn-in}$ by adjusting the shift frequency for each piece of sub data as shown in FIG. 43.

Step 3

A burn-in test is performed by using the shift frequency searched or determined for each piece of sub data at Step 2. For example, the burn-in test can be performed in a manner that the power consumption in each data section becomes close to $P_{burn-in}$ as shown in FIG. 43.

The pieces of sub data at Steps 1 to 3 are scan sections or functional test data (data used to test functions of the chip).

Steps 1 to 3 can be performed in the same device or in different devices from each other according to the embodiment, for example, in the test apparatus or a device such as a computer.

In some embodiments, the burn-in test time is reduced or made predictable and the quality of the burn-in test can be improved by optimizing the power consumption in the burn-in test as follows.

Step 1

Test data are divided into at least two pieces of sub data.

Step 2

The maximum shift frequency with which a result of a test of a normal chip is outputted as normal is searched or determined for each piece of sub data. For example, the maximum shift frequency is the optimized shift frequency for minimizing the test time or a shift frequency obtained by reflecting a margin on the optimized shift frequency.

Step 3

Power consumption or current consumption is measured or estimated by using the maximum shift frequency searched or determined for each piece of sub data at Step 2.

Step 4

A piece of sub data is searched, which may cause the power consumption or the current consumption measured or estimated at Step 3 to be larger than a reference of power consumption for the optimum burn-in test. For example, the reference of power consumption for the optimum burn-in test is $P_{burn-in}$ or $P_{margin-high}$ in FIG. 42 or 43.

Step 5

The power consumption of the sub data is adjusted to be equal to or close to the power consumption or the current consumption for the optimum burn-in test by lowering the shift frequency for the sub data searched at Step 4. For example, the reference of power consumption for the optimum burn-in test is $P_{burn-in}$, $P_{margin-high}$, or $P_{margin-low}$ in FIG. 42 or 43. On the other hand, the power consumption or the current consumption measured or estimated at Step 3 may be smaller than the reference of power consumption for the optimum burn-in test. In this case, however, if the shift frequency for the corresponding sub data is increased to make the power consumption of the sub data equal to or close to the power consumption or the current consumption for the optimum burn-in test, a test fail may occur, which needs for attention.

Step 6

A burn-in test is performed by using the shift frequency for each piece of sub data adjusted at Step 5.

In some embodiments of the present invention, the pieces of sub data at Steps 1 to 6 are scan sections or functional test data.

Steps 1 to 6 can be performed in the same device or in different devices from each other according to the embodiment, for example, in the test apparatus or a device such as a computer.

In some embodiments, a method of searching or determining shift frequency corresponding to desired power consumption is as follows. A power consumption value dissipated by a piece of sub data is measured or estimated by using a predetermined shift frequency. Thereafter, a value of a constant in $\alpha \times C \times V_{dd}^2$ is calculated by using a relation between power consumption and shift frequency, such as Equation 2. The values of the constant and the desired power consumption are substituted into Equation 2 to calculate the shift frequency.

In some embodiments of the present invention, the shift frequency can be searched or determined by measuring or estimating the power consumption dissipated by the sub data while increasing or decreasing the shift frequency.

In some embodiments of the present invention, the power consumption dissipated by the sub data can be measured or estimated by using a device or software for measuring or estimating power consumption or current consumption.

Figure 44:
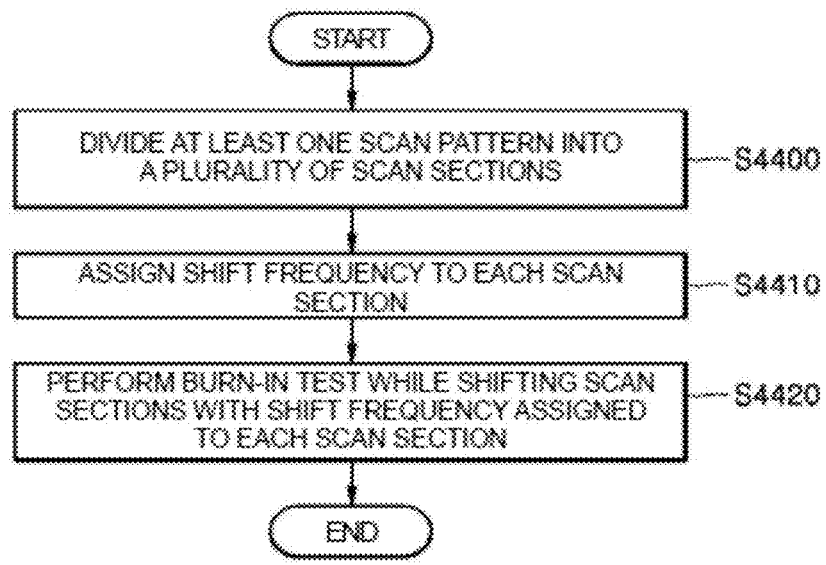
FIG. 44 is a flowchart of a process to search an optimum shift frequency for each scan section to minimize the burn-in test time according to some embodiments of the present invention.

FIG. 44 is a flowchart of a process to search an optimum shift frequency for each scan section to minimize the burn-in test time according to some embodiments of the present invention.

As shown in FIG. 44, an apparatus for minimizing burn-in test time divides at least one scan pattern into at least two scan sections (Step S4400). The methods shown in FIGS. 5 to 10 can be used to divide the at least one scan pattern. The apparatus for minimizing burn-in test time allocates a plurality of shift frequencies to respective scan sections (Step S4410). The shift frequency allocated to each scan section is lower than a shift frequency with which an output pattern of a scan path becomes different from corresponding expected pattern. The apparatus for minimizing burn-in test time then performs a burn-in test while shifting each scan section with the shift frequency allocated to the corresponding scan section (Step S4420).

Dividing the scan pattern into scan sections (Step S4400), allocating the shift frequency to each scan section (Step S4410), performing the burn-in test (Step S4420), and the like can be performed in the same device or in different devices from each other depending on the embodiment.

The apparatus for minimizing burn-in test time searches a shift frequency right before the output pattern and the expected pattern become different from each other while increasing or decreasing the shift frequency or determines the searched frequency as the maximum shift frequency that can be allocated to the corresponding scan section. In some embodiments, each scan section is allocated with a shift frequency lower than the maximum shift frequency searched by scaling the shift frequency.

Various embodiments described above can be used to search the optimum shift frequency for each scan section to perform a burn-in test according to some embodiments of the present invention. For example, the apparatus for minimizing burn-in test time searches the optimum shift frequency for each scan section by performing at least one of the methods shown in FIGS. 12 to 33. Further, the method of reordering the arrangement of the scan patterns shown in FIG. 36 can also be applied to the reduction of the burn-in test time and the improvement of the quality of the burn-in test.

Figure 45:
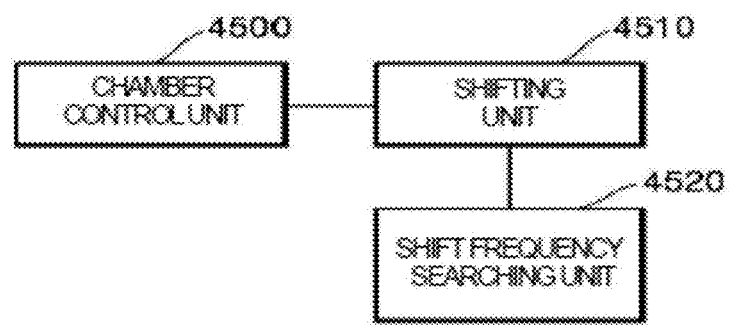
FIG. 45 is a block diagram of an apparatus for minimizing burn-in test time according to some embodiments of the present invention.

FIG. 45 is a block diagram of an apparatus for minimizing burn-in test time according to some embodiments of the present invention.

As shown in FIG. 45, the apparatus for minimizing burn-in test time includes a chamber control unit 4500, a shifting unit 4510, and a shift-frequency searching unit 4520.

The chamber control unit 4500 controls voltage, temperature, burn-in test time, and the like applied to a test target IC chip.

The shift-frequency searching unit 4520 searches the optimum shift frequency for each scan section to shift scan sections to a scan path of the IC chip in the burn-in test. For example, the shift-frequency searching unit 4520 determines the optimum shift frequency for each scan section based on at least one method according to some embodiments of the present invention described above. In some embodiments, the process of determining the optimum shift frequency is performed in the apparatus for minimizing burn-in test time. In some embodiments, the process of determining the optimum shift frequency is performed in a separate device, and in this case, the determined shift frequency is sent to the shift-frequency searching unit 4520.

The shifting unit 4510 shifts scan sections to the scan path by using the optimum shift frequency searched by the shift-frequency searching unit 4520 while the burn-in test is performed by the chamber control unit 4500, thus minimizing the burn-in test time.

In some embodiments of the present invention, only the burn-in test is performed by using the optimum shift frequency for each scan section. In some embodiments, a chip test for testing whether or not the chip is normal is performed together with the burn-in test. The apparatus for minimizing burn-in test time can perform a scan test described above together with the burn-in test.

The apparatus for minimizing burn-in test time can be implemented as a part of the burn-in test system shown in FIGS. 37 and 38. In some embodiments, only the burn-in test can be performed by using the optimum shift frequency for each scan section. In some embodiments, the chip test can be performed together with the burn-in test. For example, only the burn-in test can be performed using a scan pattern set in which the optimum shift frequency is allocated for each scan section or both the burn-in test and the scan test can be performed using the scan pattern set.

The apparatus for minimizing burn-in test time can reorder scan patterns shifted to the scan path by using the method of reordering the scan patterns shown in FIG. 36. In this case, a portion of the circuit where a switching activities occurs on the IC chip and the number of switching activities can be changed by a shift of the scan patterns reordered on the scan pattern set, and operation characteristics of the circuit, such as power consumption and the like, can be changed accordingly. This may increase the shift frequency that can be allocated to the scan pattern (or scan section). Therefore, by using such characteristics, the overall burn-in test time can be further reduced or the quality of the burn-in test can be further improved by searching or determining the optimum shift frequency for each section by using at least one method according to some embodiments of the present invention after reordering the scan patterns. In some embodiments, reordering the scan patterns is performed in the apparatus for minimizing burn-in test time. In some embodiments, reordering the scan patterns is performed in a separate device such as a computer, and an output from the separate device can be used in the apparatus for minimizing burn-in test time.

FIG. 46 is a table showing experimental results using a micro control unit (MCU) processor IC chip and a test pattern for the IC chip, in a case where the scan section for which the shift frequency is to be determined has one-to-one correspondence with a scan pattern. The table shows shift frequencies searched for each scan pattern by using the power-limit-based method of searching the maximum usable shift frequency within a range where the power consumption by the scan pattern does not exceed the tolerable power consumption of the IC chip and the shift-frequency-scaling-based method described above according to some embodiments of the present invention.

In FIG. 46, the optimization using the shift-frequency-scaling-based method employed the method shown in FIG. 12. Referring to FIG. 46, a difference in the maximum shift frequency between the power-limit-based method and the shift-frequency-scaling-based method is caused by circuit structure and characteristics, various physical condition and environment, and the like, which can have an influence on the shift frequency, as well as the power consumption of the IC chip in an actual IC chip and an actual test environment for testing the IC chip.

The power consumption limit shown in FIG. 46 is average power consumption of about 285 mW when the IC chip is operated in the functional mode with a frequency of 80 MHz that is a functional frequency limit of the IC chip.

In general, the functional frequency limit and a frequency limit over which the IC chip can be damaged or a scan shift frequency limit may differ from each other. For example, the frequency limit may vary because circuit operation characteristics, power consumption, effect of signal crosstalk, critical timing path, or the like may be different in the scan test mode or the functional mode. Further, it can be restricted by various factors including a difference in voltage or power supplied to different locations on the circuit and the like.

The first column in the table shown in FIG. 46 is scan pattern number, and the second column is power consumption by leakage current of the IC chip. The third column is dynamic power consumption dissipated by a scan shift using the nominal shift frequency of 25 MHz. The fourth column is a sum of the second column and the third column, which is the total power consumption for each scan pattern when using the nominal shift frequency of 25 MHz. The fifth column is the maximum usable shift frequency for each scan pattern below the power consumption limit of 285 mW.

The sixth column is a result of testing the MCU IC chip using the shift frequency in the fifth column for each scan pattern, indicating test PASS or FAIL.

The seventh column is the maximum shift frequency searched by using the shift-frequency-scaling-based method described above according to some embodiments of the present invention, all of which allowed the test to be passed.

The eighth column is increase/decrease ratio (%) of the seventh column that is the result by the shift-frequency-scaling-based method with respect to the fifth column that is the result by the power-limit-based method with respect to the fifth.

As shown in FIG. 46, except for the sixth scan pattern with which the scan test was failed with the power-limit-based method, the shift frequency searched by the shift-frequency-scaling-based method is higher by about 30% or more on average. There may be various reasons for this, such as occurrence of a false critical path depending on a shifted bit pattern, a bit on a scan pattern corresponding to a don't-care bit that has no effect on the test result, or the like.

As is the case in the sixth scan pattern shown in FIG. 46, there may occur a case where the IC chip cannot be tested normally even when a shift frequency that allows the power consumption dissipated by the scan pattern not to exceed the tolerable power consumption of the IC chip is used. This is because the shift frequency limit can be influenced by various factors including signal delay time of the critical timing path due to a circuit structure of the IC chip, signal crosstalk, difference in voltage or power supplied to different locations on the circuit, signal or power noise, chip manufacturing process variation, physical characteristics of the circuit, and the like, as well as the power consumption. It can be further influenced by test environment and conditions such as ambient temperature of the test target chip, connection status of the chip and the chip test apparatus, and the like.

Even when the scan section or the scan pattern is loaded into the scan path with a bit value changed unintendedly while being shifted in during the process of searching the optimum shift frequency by scaling the shift frequency, a result pattern after a scan capture operation may appear as a normal bit pattern on the scan path depending on the circuit structure of the IC chip.

Therefore, a more precise optimum shift frequency can be searched by checking whether or not the primary output result is normal (PASS) by comparing the output result of the primary output port of the IC chip with the expected result before loading the scan section into the scan path with increase or decrease of the shift frequency and performing the scan capture operation.

Figure 47:
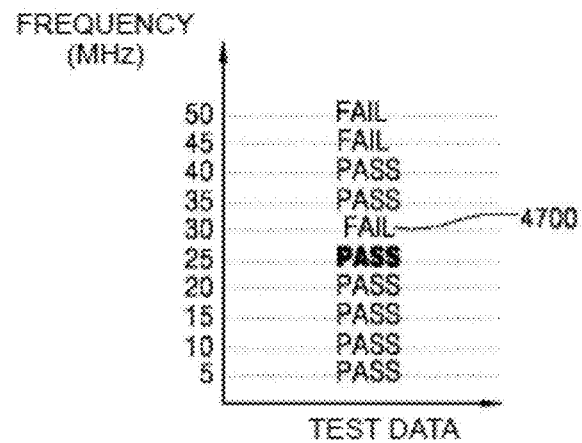
FIG. 47 is a graph showing a test fail hole that can be generated during an IC chip test.

FIG. 47 is a graph showing a test fail hole that can be incurred during an IC chip test.

Testing an IC chip requires setting up the test apparatus, the test data, or the test program. At this time, an abnormal test fail may occur in a normal shift frequency range where a normal IC chip is supposed to be determined to be fault-free. This abnormal test fail is referred to as a "test fail hole", a "test frequency fail hole", or a "test period fail hole".

FIG. 47 shows a case where an abnormal test fail 4700 occurred at 30 MHz when testing an IC chip. The test fail hole may cause the mass production test of the IC chip to be unstable and can badly affect the yield badly, and hence this should be removed.

Figure 48:
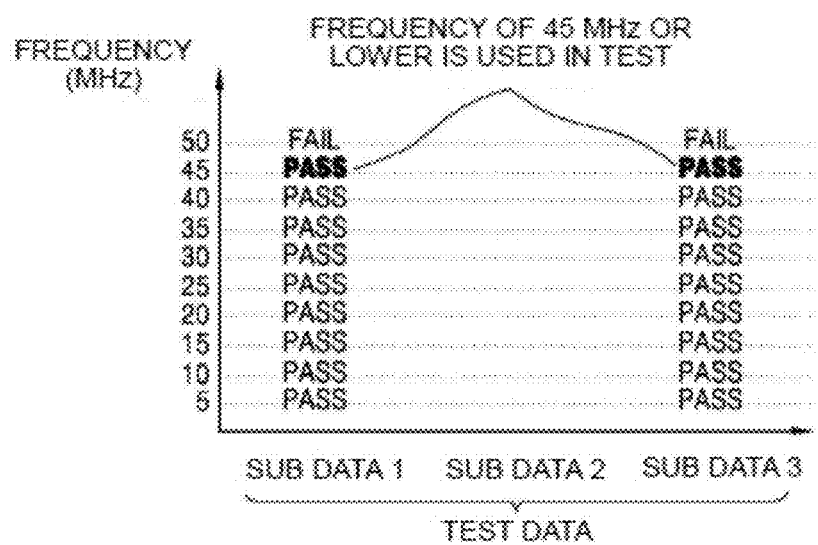
FIG. 48 is a graph showing a method of solving the test fail hole problem according to some embodiments of the present invention.

FIG. 48 is a graph showing a method of solving the test fail hole problem according to some embodiments of the present invention.

FIG. 48 shows an example of solving the test fail hole problem, which disables a test for specific sub data that cause the test fail hole or influence generation of the fail hole.

For example, a method can be used, which does not allow test output data of the IC chip for sub data that caused the fail hole to be compared with the expected data. This method can be referred to as "test data masking" or "expected result masking" of test data. In the following embodiments, the sub data means scan pattern, scan section, or functional test data. A case where the test data masking is applied to a scan pattern can be referred to as "scan pattern masking" or "expected result masking" of scan test. For another example, the sub data that influence generation of the test fail hole are removed or unused.

In the case shown in FIG. 48, the second sub data that caused the fail hole at 30 MHz can be searched, and the second sub data can be subject to the masking or removed. However, masking or removing the sub data can lower the fault coverage of the test target IC chip. Further, masking or removing the sub data may cause a faulty IC chip to be tested as fault-free. This may eventually cause a field escape problem in which a faulty IC chip is released to a field.

Therefore, in some embodiments, sub data that cause the fail hole or influence generation of the fail hole and a shift frequency corresponding to the fail hole are searched, and a frequency is used, which causes no fail hole at specific sub data that cause the fail hole or influence generation of the fail hole.

Figure 49:
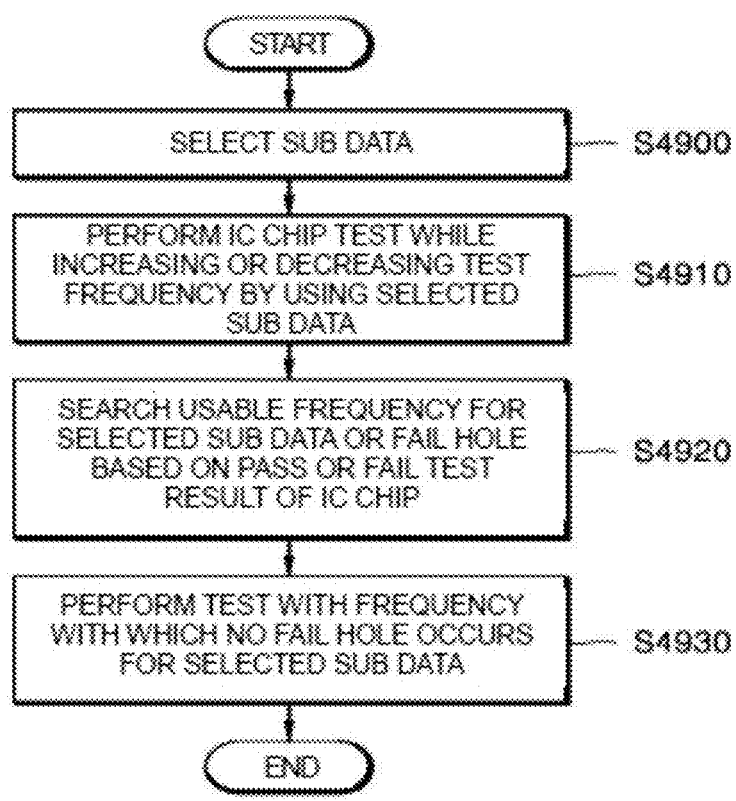
FIG. 49 is a flowchart of a process to solve the test fail hole problem according to some embodiments of the present invention.

FIG. 49 is a flowchart of a process to solve the test fail hole problem according to some embodiments of the present invention.

As shown in FIG. 49, the test apparatus selects sub data constituting the test data (Step S4900). The sub data may be scan pattern or scan section. The test apparatus performs a test of the IC chip while increasing or decreasing the frequency for the sub data (Step S4910), and searches usable frequency or fail hole for the selected sub data based on the test result of the IC chip (Step S4920). The test apparatus then tests the IC chip using a frequency that causes no fail hole for the selected sub data (Step S4930).

Various methods of searching the usable shift frequency for a scan pattern or a scan section by scaling the shift frequency as described above can be used when searching the fail hole for a scan pattern or a scan section.

Figure 50:
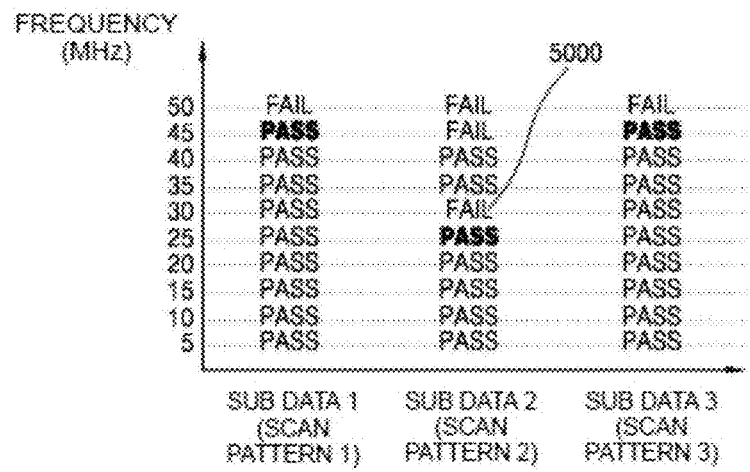
FIG. 50 is a graph showing another process to solve the test fail hole problem according to some embodiments of the present invention.

FIG. 50 is a graph showing another process to solve the test fail hole problem according to some embodiments of the present invention.

Referring to FIG. 50, a frequency equal to or lower than 25 MHz can be used for the second sub data that caused a test fail hole 5000. The sub data may be scan pattern, scan section, or functional test data.

When the first sub data, the second sub data, and the third sub data are the first scan pattern, the second scan pattern, and the third scan pattern, respectively, the first scan pattern, the second scan pattern, and the third scan pattern are sequentially shifted to the scan path of the test target IC chip. Various methods to search the usable shift frequency for the scan pattern or the scan section by scaling the shift frequency as described above can be used to search the test fail hole 5000 for the second scan pattern or a scan section included in the second scan pattern.

For example, the first scan pattern or the third scan pattern coming before or after the second scan pattern is shifted in using a frequency that allows the first scan pattern or the third scan pattern to be normally inputted to the scan pattern while increasing or decreasing the shift frequency for the second scan pattern. The fail hole and the usable shift frequency range can be searched for the second scan pattern by using a scan test result. The shift frequencies for the first scan pattern or the third scan pattern used when searching the fail hole or the usable shift frequency for the second scan pattern may be same or different from each other.

In the scan test process of searching the fail hole or the usable shift frequency for the second scan pattern, not only the output pattern for the second scan pattern but also the output pattern for the first scan pattern coming before the second scan pattern can be compared with the corresponding expected pattern. In this case, when the test results for both the first scan pattern and the second scan pattern are normal, the current shift frequency is determined as the usable shift frequency for the second scan pattern. For another example, the output pattern for the third scan pattern coming after the second scan pattern can be compared with the corresponding expected pattern. In this case, when the test results for both the second scan pattern and the third scan pattern are normal, the current shift frequency is determined as the usable shift frequency for the second scan pattern.

In some cases, the scan pattern that causes the test fail hole or influences generation of the test fail hole may be the first scan pattern or the third scan pattern coming before or after the second scan pattern. It is because the shift frequency for the second scan pattern may influence a bit value on the scan path when the output pattern for the first scan pattern is shifted out. Further, it is because a bit value on the scan path when the test result for the second scan pattern is shifted out may be influenced by the shift frequency for shifting in the third scan pattern to the scan path. Therefore, when there is a test fail hole in the test result by a specific scan section or scan pattern, it should be checked whether a scan section or scan pattern coming before or after the target scan section or scan pattern influences generation of the fail hole.

For example, a frequency that allows the second scan pattern to be normally shifted to the scan path for the second scan pattern is used, and the test result is checked by increasing the shift frequency for the third scan pattern. If the test result for the second scan pattern is FAIL and the test result for the third scan pattern is PASS, a frequency that causes no test fail on the second scan pattern should be used as the shift frequency for the third scan pattern. This can eliminate the influence of the third scan pattern on the fail hole appeared on the test result of the second scan pattern.

In some embodiments of the present invention, the scan test is performed while increasing or decreasing the shift frequency. When a fail hole is incurred at a specific shift frequency while performing the scan test, a specific scan pattern is searched, for which the scan test using the shift frequency corresponding to the fail hole turns out to be FAIL. The chip test is then performed by using a shift frequency lower than the shift frequency with which the fail hole is incurred for the specific scan pattern and the scan pattern coming before or after the specific scan pattern. That is, a shift frequency lower than the shift frequency with which the fail hole is incurred can be used for the neighboring scan patterns that can influence generation of the fail hole.

In some embodiments of the present invention, a scan section or scan pattern for which a fail hole is incurred and the corresponding shift frequency are searched by using the shift frequency scaling. A shift frequency that causes no fail hole within a range of margin for the shift frequency considering manufacturing process and test process is then used for the scan section or scan pattern. For example, a shift frequency that is higher than the shift frequency corresponding to the fail hole and causes no fail hole within the range of margin can be used for the scan section or scan section. For another example, a shift frequency that is higher than the shift frequency corresponding to the fail hole and causes no fail hole within the range of margin can also be used for a scan section or scan pattern neighboring the scan section or scan pattern corresponding to the fail hole.

As described above, using the frequency or the period that causes no fail hole for specific sub data in the mass production test of the chip can solve the problem in which the fault coverage of the chip is lowered due to the method of masking or removing the sub data. Further, the field escape problem in which a faulty IC chip is released to the field can be eliminated. A range of frequency or period that causes no fail hole can be searched and used for the chip test.

Figure 51:
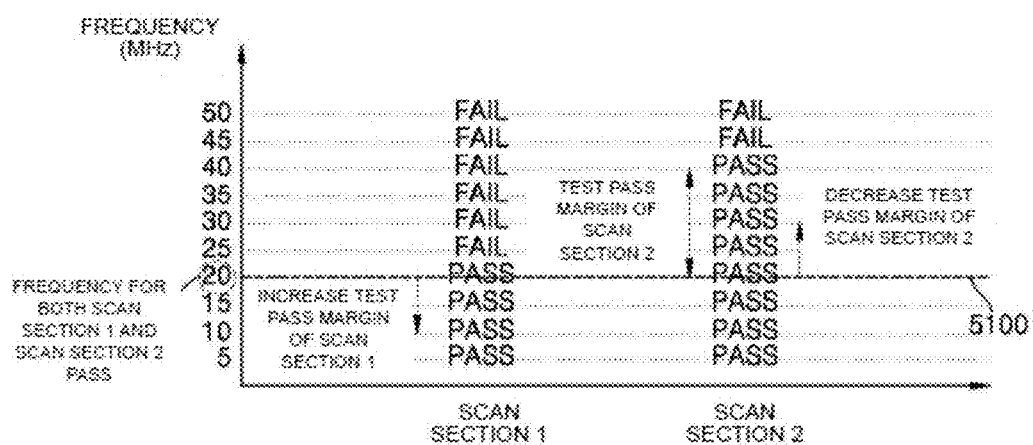
FIG. 51 is a graph showing a method of searching a shift frequency for reducing test time and improving yield according to some embodiments of the present invention.

FIG. 51 is a graph showing a method of searching a shift frequency for reducing the test time and improving the yield according to some embodiments of the present invention.

In the example shown in FIG. 51, at least two scan sections are shifted to the scan path with different shift frequencies from each other, to test a chip. At this time, with reference to a specific shift frequency (e.g., nominal shift frequency) 5100 that allows all test results for the at least two scan sections to be normal, a shift frequency with increased margin is used for the first scan section having a small test pass margin, and a shift frequency with decreased margin is used for the second scan pattern having a large test pass margin.

The shift frequency margin of a scan section can be searched or determined by using test pass or fail information of the scan section. For example, a margin can be searched or determined, which indicates an interval between a frequency or a period that defines the boundary between test pass and test fail of a scan section and the specific shift frequency 5100. Test results for both the scan section using the shift frequency on which the margin is reflected and a scan section coming before the scan section should be normal.

When the margin is increased for a scan section having a small shift frequency margin, it is less influenced by variations in chip manufacturing process, test environment, and the like in the chip test. This can improve the yield of the chip accordingly.

When the margin is decreased for a scan section having a large shift frequency or period margin, the test time can be saved.

In this manner, improvement of the yield and reduction of the test time, which may be in a trade-off relation, can be achieved together by considering the frequency margin for each scan section.

As shown in FIG. 51, both the first scan section and the second scan section exhibit the test pass at the nominal shift frequency 5100 of 20 MHz. With reference to 20 MHz, when the margin of the shift frequency for the first scan section is smaller than a predetermined reference margin value, the test apparatus increases the margin of the shift frequency for the first section to improve the yield of the chip in the mass production test. That is, the shift frequency for the first scan section is changed to a frequency lower than 20 MHz to allow the shift frequency for the first scan section to meet the reference margin value. On the other hand, with reference to 20 MHz, when the margin of the shift frequency or the period for the second scan section is larger than the reference margin value, the test apparatus decreases the margin of the shift frequency or the period for the second section to reduce the total test time in the mass production test. That is, the shift frequency for the second scan section is changed to a frequency higher than 20 MHz to allow the shift frequency for the second scan section to meet the reference margin value.

When performing a chip test by searching the optimum shift frequency for at least two scan sections, there may be a problem in the shift timing of a boundary bit between two neighboring scan sections.

When a period between the last bit of a scan section S1 and the first bit of a scan section S2 sequentially shifted in to a scan path following the scan section S1 is CP_boundary (clock period of boundary bits), a first CP_boundary between the scan section S1 and the scan section S2 when the maximum optimum shift frequency is searched for the scan section S2 may be different from a second CP_boundary between the scan section S1 and the scan section S2 when the optimum shift frequencies determined for both the scan section S1 and the scan section S2. For example, when the second CP_boundary is smaller than the first CP_boundary, a scan test using the scan section S1 and the scan section S2 may determine a fault-free chip as a faulty chip.

In this case, following methods can be used to solve the problem of shift timing of the boundary bit between two neighboring scan sections.

(1) In a case where the maximum shift frequency for the scan section S1 is determined, the optimum shift frequency determined for the scan section S1 is used for the scan section S1 when searching the maximum optimum shift frequency for the scan section S2 that is shifted in following the scan section S1.

(2) Set an edge of a clock for performing a shift operation of a scan bit to a position corresponding to a boundary of a clock definition period (CDP) or a position near the boundary. The CDP is a time interval for defining a shape of the clock, in which the rising time or the falling time of a clock signal is defined. The CDP can be set in the test apparatus or the test data.

(3) Adjust a period of shift frequency or a shift time interval between the last bit of the scan section S1 and the first bit of the scan section S2 sequentially shifted to the scan path following the scan section S1. For example, when a scan test is performed using a scan pattern including the scan section S1 and the scan section S2, the period can be adjusted to a value that allows a fault-free chip to be tested as normal. The period of shift frequency or the shift time interval can be defined in the test data or in the test apparatus. For example, when creating new test data in which the optimum shift frequency is allocated to each of the scan section S1 and the scan section S2, timing information for the last bit of the scan section S1 and the first bit of the scan section S2 is newly created, to which a period that allows a fault-free chip to be tested as normal is allocated. For example, a period of the nominal shift frequency can be used for the timing information.

(4) When a fault-free chip is determined to be a faulty chip due to the problem of shift timing of the boundary bit between two neighboring scan sections, the period of shift frequency for a scan section of scan pattern including the boundary bit is increased.

The scan shift frequency information or the scan section information including the scan shift frequency information obtained by applying the present invention can be stored in a computer-readable recording medium as computer-readable program codes or data. An example of the program codes includes computer-executable program or software. The program codes or data can be executed or used in a scan test apparatus, a burn-in test apparatus, a computer, and the like. The computer-readable recording medium can be any data storage device that can store data which can thereafter be read by a computer system. Examples of the computer-readable recording medium include ROM, RAM, CD-ROM, magnetic tape, floppy disk, and optical data storage device.

The computer-readable recording medium may also be distributed over networks coupled to computer systems so that computer-readable codes can be stored and executed in a distributed manner. In addition, functional programs, codes, and code segments for accomplishing at least one embodiment of the present invention can be easily construed by programmers skilled in the pertinent art. In some embodiments of the present invention, the program codes or data can be stored in a server computer, and a client computer can be connected to the server computer to use or download the program codes or data. For example, the program codes can be executed in a server computer or a client computer.

It is an object of the present invention to provide an apparatus, a method, and a system for testing an IC capable of reducing test time and enhancing test quality and yield by optimizing a shift frequency of test data.

According to some embodiments of the present invention, the optimum shift frequency for reducing scan test time can be provided while solving the over kill problem in which a normal chip is determined to be defective when increasing the shift frequency by considering only the power consumption or the critical path delay time for each scan pattern, each scan section, or each scan group at the time of testing an IC chip.

Further, according to some embodiments of the present invention, the optimum shift frequency can be provided by considering an effect of power supply noise or crosstalk between signal lines when testing an IC chip.

Moreover, according to some embodiments of the present invention, the optimum shift frequency can be provided by considering an effect of IR-drop or Ground-bounce that can be caused by excessive circuit switching activities due to the scan test, manufacturing process variation, deep sub-micron manufacturing process, low-power manufacturing process, or low-power design when testing an IC chip.

Further, according to some embodiments of the present invention, the optimum shift frequency can be provided by considering an effect of critical path timing on the scan path that can be generated when increasing the shift frequency at the time of testing an IC chip.

Moreover, according to some embodiments of the present invention, when a critical path on the scan path becomes a false critical path by the bit values on the scan path when testing an IC chip, the test time can be minimized by ignoring the critical timing constraint and increasing the scan shift frequency to the maximum level within a frequency range that is allowable for the IC chip to operate normally.

Further, according to some embodiments of the present invention, don't care bits on the scan pattern set allows a higher shift frequency to be used when testing an IC chip. The don't care bit is a bit having no effect on the scan test result.

Moreover, according to some embodiments of the present invention, for a low-power IC chip that employs the technique of multiple voltage islands or multiple voltage domains or regions, the optimum shift frequency can be provided reflecting power consumption allowable for each voltage island or each voltage domain or region.

Further, according to some embodiments of the present invention, searching the optimum shift frequency for scan patterns or scan sections when testing an IC chip dispenses with a need for circuit design information of the IC chip, and hence the shift frequency for each scan pattern or each scan section can be provided only with a scan pattern set without the circuit design information of the chip.

Moreover, according to some embodiments of the present invention, searching the optimum shift frequency for scan patterns or scan sections having power consumption or current consumption equal to or higher than a predetermined level after allocating a predetermined constant shift frequency such as the nominal shift frequency to all scan sections when testing an IC chip allows the processing time to be reduced compared to a method of searching the optimum shift frequency for all scan patterns or each of the scan sections.

Further, according to some embodiments of the present invention, an increase of the test time can be suppressed, which may happen to solve the fail hole problem in which an abnormal test fail occurs within a frequency range that is supposed to allow an IC chip test to be passed. In addition, a decrease of the fault coverage of the chip or an occurrence of a field escape problem can be suppressed, which may happen to solve the fail hole problem.

Moreover, according to some embodiments of the present invention, the test time can be reduced and the test quality can be improved in a stress or burn-in test to accelerate aging of a chip. In addition, the time required for the stress or burn-in test can be estimated precisely, and the quality of the stress or burn-in test can be estimated precisely.

Further, information for improving the yield can be obtained or the yield can be improved through the IC chip test.

The present invention should not be limited to these embodiments but various changes and modifications can be made by one of ordinarily skill in the art within the subject matter, the spirit and scope of the present invention as hereinafter claimed. Specific terms in the specification and drawings are used for illustrative purposes and not to be considered as limitations of the present invention. Exemplary embodiments of the present invention have been described for the sake of brevity and clarity. Accordingly, one of ordinary skill in the art would understand the scope of the claimed invention is not to be limited by the explicitly described above embodiments but by the claims and equivalents thereof.

What is claimed is:

1. An apparatus for performing a scan test of an integrated-circuit (IC) chip, the IC chip including a scan input port, a scan path, and a scan output port, where the apparatus inputs a scan pattern to the scan path via the scan input port, compares an output pattern outputted via the scan output port with a predetermined expected pattern, and determines whether or not a result of the scan test is pass or fail based on a result of comparing the output pattern with the predetermined expected pattern, the apparatus comprising:
a processor; and
a non-transitory storage medium containing program instructions, execution of which by the processor causes the processor to provide functions of a shift-frequency searching unit that executes the scan test of the IC chip with at least a portion of a scan pattern set including n scan patterns divided into m scan sections, where n is a positive integer equal to or larger than 1 and m is a positive integer equal to or larger than 2, and searches a usable shift frequency for a target scan section from among the m scan sections, wherein
when searching the usable shift frequency for the target scan section, the shift-frequency searching unit controls a shift frequency of the target scan section independently from a shift frequency of at least one scan section shifted to the scan input port right before or right after the target scan section by increasing or decreasing the shift frequency of the target scan section differently from the shift frequency of the at least one scan section shifted to the scan input port right before or right after the target scan section or setting the shift frequency of the target scan section differently from the shift frequency of the at least one scan section shifted to the scan input port right before or right after the target scan section, while executing the scan test, to search a shift frequency with which a result of the scan test indicates the pass or a shift frequency with which the result of the scan test indicates the fail.

2. The apparatus according to claim 1, wherein when searching the usable shift frequency for the target scan section, the shift-frequency searching unit searches a shift frequency with which the result of the scan test changes from the pass to the fail or a shift frequency with which the result of the scan test changes from the fail to the pass by increasing or decreasing the shift frequency of the target scan section while executing the scan test.

3. The apparatus according to claim 1, wherein when searching the usable shift frequency for the target scan section, the shift-frequency searching unit determines, when both a result of the scan test for a second scan pattern, a whole or a part of which constitutes the target scan section, and a result of the scan test for a first scan pattern shifted to the scan input port right before the second scan pattern indicate the pass, a shift frequency used at the scan test for the target scan section as the usable shift frequency for the target scan section.

4. The apparatus according to claim 1, wherein when searching the usable shift frequency for the target scan section, the shift-frequency searching unit increases or decreases the shift frequency of the target scan section based on a binary search scheme.

5. The apparatus according to claim 1, wherein the IC chip includes a chip on a wafer or a packaged chip.

6. The apparatus according to claim 1, wherein after searching a plurality of usable shift frequencies for the target scan section, the shift-frequency searching unit allocates an optimum shift frequency from among the plurality of usable shift frequencies to the target scan section.

7. The apparatus according to claim 1, wherein the shift-frequency searching unit searches usable shift frequencies for multiple ones of the plurality of scan sections, respectively, in parallel.

8. A method of performing a scan test of an integrated-circuit (IC) chip including a scan input port, a scan path, and a scan output port, by inputting a scan pattern to the scan path via the scan input port, comparing an output pattern outputted via the scan output port with a predetermined expected pattern, and determining whether or not a result of the scan test is pass or fail based on a result of comparing the output pattern with the predetermined expected pattern, the method comprising:
executing the scan test of the IC chip with at least a portion of a scan pattern set including n scan patterns divided into in scan sections, where n is a positive integer equal to or larger than 1 and m is a positive integer equal to or larger than 2; and
searching a usable shift frequency for a target scan section from among the m scan sections, wherein
when searching the usable shift frequency for the target scan section, the searching includes controlling a shift frequency of the target scan section independently from a shift frequency of at least one scan section shifted to the scan input port right before or right after the target scan section by increasing or decreasing a shift frequency of the target scan section differently from the shift frequency of the at least one scan section shifted to the scan input port right before or right after the target scan section or setting the shift frequency of the target scan section differently from the shift frequency of the at least one scan section shifted to the scan input port right before or right after the target scan section, while executing the scan test, to search a shift frequency with which a result of the scan test indicates the pass or a shift frequency with which the result of the scan test indicates the fail.

9. The method according to claim 8, wherein when searching the usable shift frequency for the target scan section, the searching includes searching a shift frequency with which the result of the scan test changes from the pass to the fail or a shift frequency with which the result of the scan test changes from the fail to the pass, by increasing or decreasing the shift frequency of the target scan section while executing the scan test.

10. The method according to claim 8, when searching the usable shift frequency for the target scan section, the searching includes determining, when both a result of the scan test for a second scan pattern, a whole or a part of which constitutes the target scan section, and a result of the scan test for a first scan pattern shifted to the scan input port right before the second scan pattern indicate the pass, a shift frequency used at the scan test for the target scan section as the usable shift frequency for the target scan section.

11. The method according to claim 8, wherein when searching the usable shift frequency for the target scan section, the searching includes increasing or decreasing the shift frequency of the target scan section based on a binary search scheme.

12. The method according to claim 8, wherein the IC chip includes a chip on a wafer or a packaged chip.

13. The method according to claim 8, further comprising, after searching a plurality of usable shift frequencies for the target scan section, allocating an optimum shift frequency from among the plurality of usable shift frequencies to the target scan section.

14. The method according to claim 8, wherein the searching includes searching usable shift frequencies for multiple ones of the plurality of scan sections, respectively, in parallel.

15. A nontransitory computer-readable recording medium that stores therein a program including computer-executable instructions for causing, when executed by a computer, the computer to execute the method according to claim 8.

16. A system for testing an integrated-circuit (IC) chip the IC chip including a scan input port, a scan path, and a scan output port, the system comprising:
an apparatus for performing a scan test of the IC chip, where the apparatus inputs a scan pattern to the scan path via the scan input port, compares an output pattern outputted via the scan output port with a predetermined expected pattern, and determines whether or not a result of a scan test is pass or fail based on a result of comparing the output pattern with the predetermined expected pattern, the apparatus including:
a processor; and
a non-transitory storage medium containing program instructions, execution of which by the processor causes the processor to provide functions of a shift-frequency searching unit that executes the scan test of the IC chip with at least a portion of a scan pattern set including n scan patterns divided into m scan sections where n is a positive integer equal to or larger than 1 and m is a positive integer equal to or larger than 2, and searches a usable shift frequency for a target scan section from among the m scan sections, wherein
when searching the usable shift frequency for the target scan section the shift-frequency searching unit controls a shift frequency of the target scan section independently from a shift frequency of at least one scan section shifted to the scan input port right before or right after the target scan section by increasing or decreasing the shift frequency of the target scan section differently from the shift frequency of the at least one scan section shifted to the scan input port right before or right after the target scan section or setting the shift frequency of the target scan section differently from the shift frequency of the at least one scan section shifted to the scan input port right before or right after the target scan section, while executing the scan test, to search a shift frequency with which a result of the scan test indicates the pass or a shift frequency with which the result of the scan test indicates the fail;
the system further comprising:
a tester main unit; and
at least one of a tester head and an interface board, wherein
in a state in which the apparatus and the tester main unit are connected to each other via a wired or wireless communication,
the apparatus controls the scan test of the IC chip,
the tester main unit generates an electrical signal for performing the scan test of the IC chip, and
the at least one of a tester head and an interface board delivers the electrical signal between the tester main unit and the IC chip.

17. The system according to claim 16, wherein when searching the usable shift frequency for the target scan section, the shift-frequency searching unit searches a shift frequency with which the result of the scan test changes from the pass to the fail, or a shift frequency with which the result of the scan test changes from the fail to the pass, by increasing or decreasing the shift frequency of the target scan section, while executing the scan test.

18. The system according to claim 16, wherein When searching the usable shift frequency for the target scan section, the shift-frequency searching unit determines, when both a result of the scan test for a second scan pattern, a whole or a part of which constitutes the target scan section, and a result of the scan test for a first scan pattern shifted to the scan input port right before the second scan pattern indicate the pass, a shift frequency used at the scan test for the target scan section as the usable shift frequency for the target scan section.

19. The system according to claim 16, wherein when searching the usable shift frequency for the target scan section, the shift-frequency searching unit increases or decreases the shift: frequency of the target scan section based on a binary search scheme.

20. The system according to claim 16, wherein the IC chip includes a chip on a wafer or a packaged chip.

21. The system according to claim 16, wherein after searching a plurality of usable shift frequencies for the target scan section, the shift-frequency searching unit allocates an optimum shift frequency from among the plurality of usable shift frequencies to the target scan section.

22. The system according to claim 16, wherein the shift-frequency searching unit searches usable shift frequencies for multiple ones of the plurality of scan sections, respectively, in parallel.

* * * * *